(12) United States Patent
Yamanaka et al.

(10) Patent No.: US 7,098,085 B2
(45) Date of Patent: Aug. 29, 2006

(54) METHOD AND APPARATUS FOR FORMING A THIN SEMICONDUCTOR FILM, METHOD AND APPARATUS FOR PRODUCING A SEMICONDUCTOR DEVICE, AND ELECTRO-OPTICAL APPARATUS

(75) Inventors: Hideo Yamanaka, Kanagawa (JP); Hisayoshi Yamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 68 days.

(21) Appl. No.: 10/075,774

(22) Filed: Feb. 14, 2002

(65) Prior Publication Data

US 2002/0160553 A1 Oct. 31, 2002

(30) Foreign Application Priority Data

Feb. 14, 2001 (JP) .......................... P2001-036441

(51) Int. Cl.
  *H01L 21/00* (2006.01)
  *H01L 21/20* (2006.01)
  *H01L 21/461* (2006.01)

(52) U.S. Cl. ....................... 438/149; 438/488; 438/745

(58) Field of Classification Search ................ 438/745, 438/750, 751, 754, 197, 428
See application file for complete search history.

(56) References Cited

U.S. PATENT DOCUMENTS 6,693,044 B1* 2/2004 Yamazaki et al. .......... 438/745

* cited by examiner

*Primary Examiner*—Howard Weiss
*Assistant Examiner*—(Vikki) Hoa B. Trinh
(74) *Attorney, Agent, or Firm*—Sonnenschein Nath & Rosenthal LLP

(57) ABSTRACT

A method is disclosed for forming high-quality high-crystallinity polycrystalline or monocrystalline thin semiconductor film. The method is capable of forming such a semiconductor film over a large area at low cost. An apparatus for practicing the method is also disclosed. To form a high-crystallinity large-grain polycrystalline film or monocrystalline thin semiconductor film on a substrate, or to produce a semiconductor device including a high-crystallinity large-grain polycrystalline film or monocrystalline thin semiconductor film disposed on a substrate, a low-crystal-quality thin semiconductor film is first formed on the substrate, and then focused-light annealing is performed on the low-crystal-quality thin semiconductor film thereby melting or semi-melting the low-crystal-quality thin semiconductor film. The focused-light annealing allows enhancement of crystallization that occurs when the melted low-crystal-quality thin semiconductor film is cooled, and thus the low-crystal-quality thin semiconductor film is converted into a high-quality polycrystalline (or monocrystalline) thin semiconductor film.

14 Claims, 38 Drawing Sheets

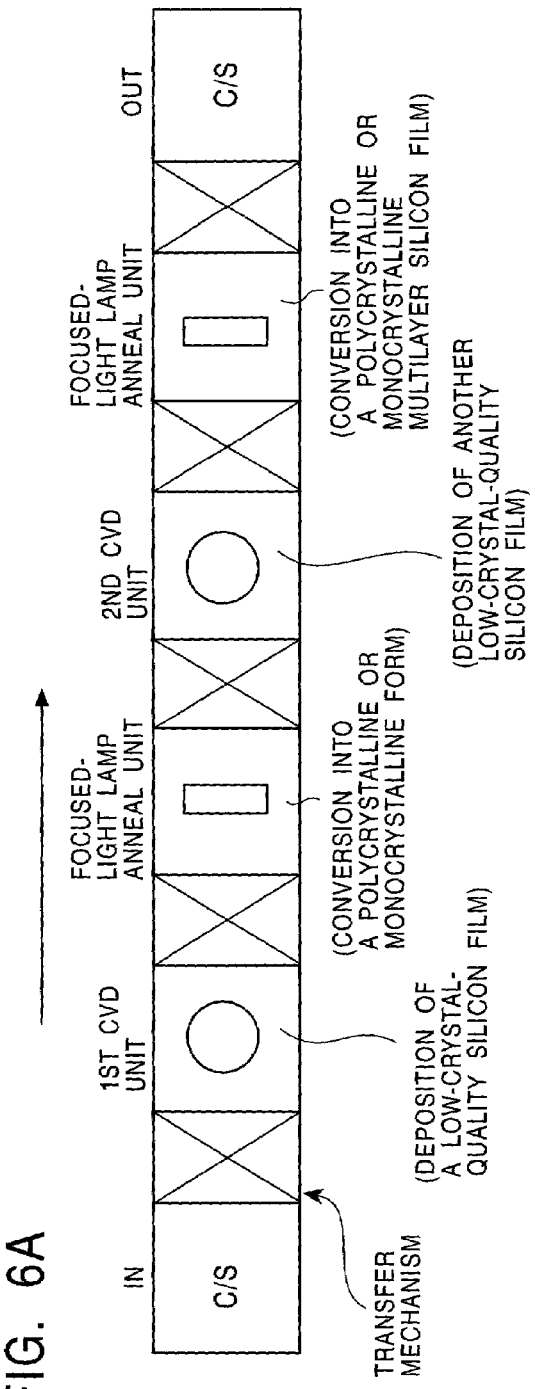
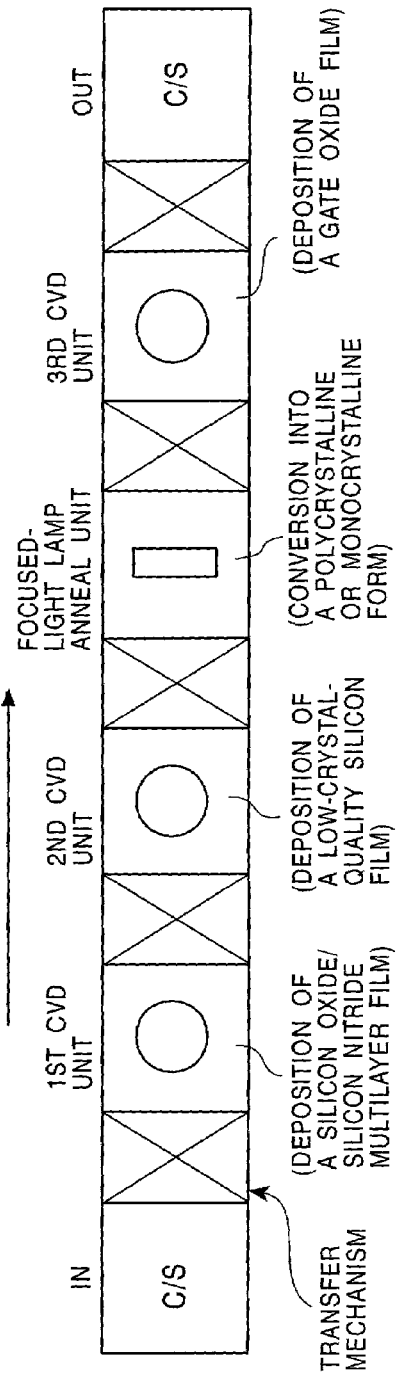

FIG. 7

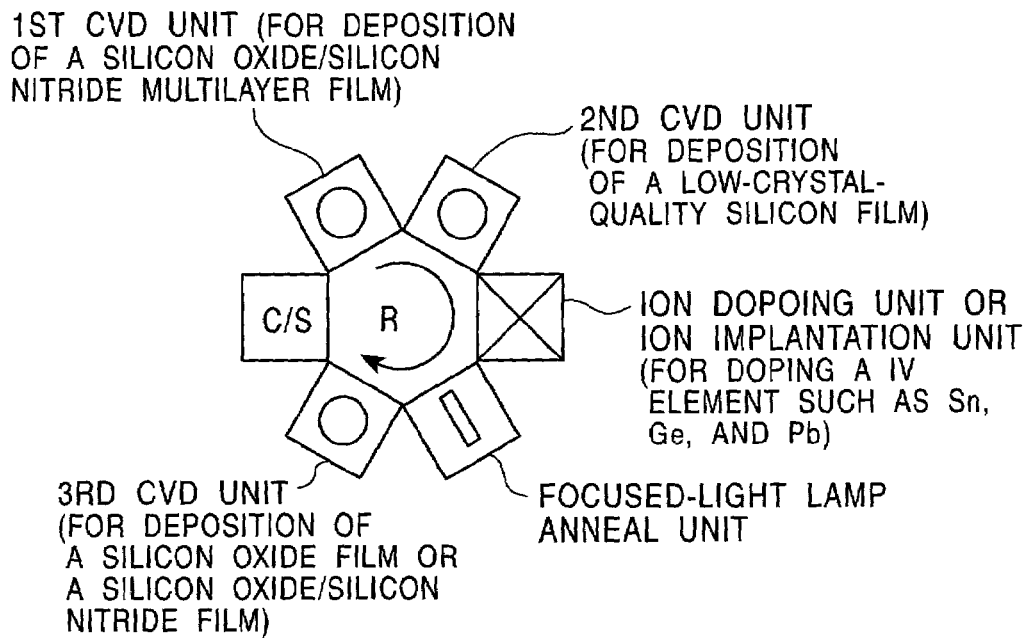

1ST CVD UNIT (FOR DEPOSITION OF A SILICON OXIDE/SILICON NITRIDE MULTILAYER FILM)

2ND CVD UNIT (FOR DEPOSITION OF A LOW-CRYSTAL-QUALITY SILICON FILM)

ION DOPOING UNIT OR ION IMPLANTATION UNIT (FOR DOPING A IV ELEMENT SUCH AS Sn, Ge, AND Pb)

3RD CVD UNIT (FOR DEPOSITION OF A SILICON OXIDE FILM OR A SILICON OXIDE/SILICON NITRIDE FILM)

FOCUSED-LIGHT LAMP ANNEAL UNIT

FIG. 8

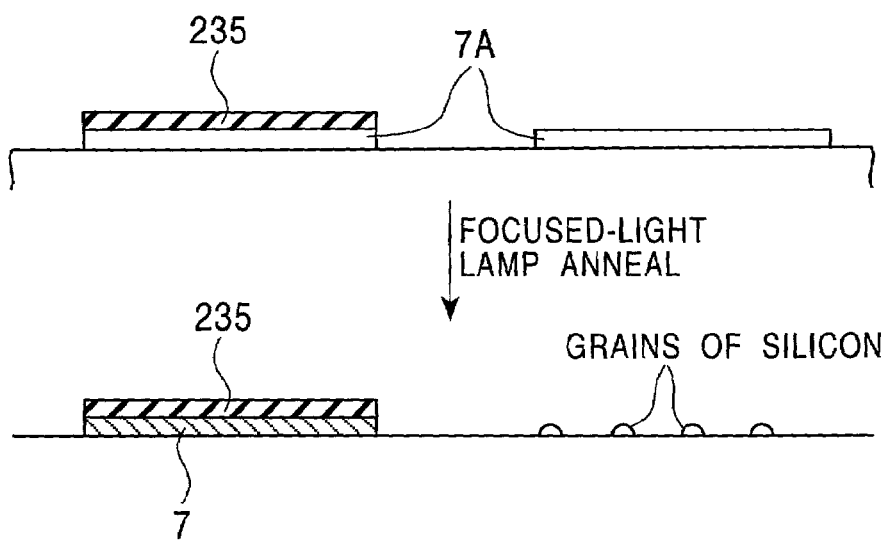

FOCUSED-LIGHT LAMP ANNEAL

GRAINS OF SILICON

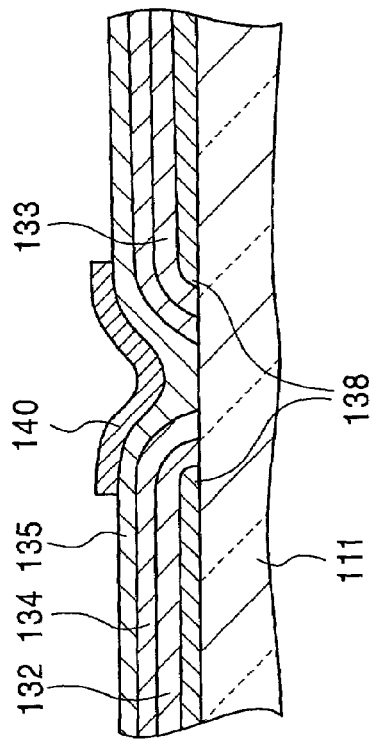
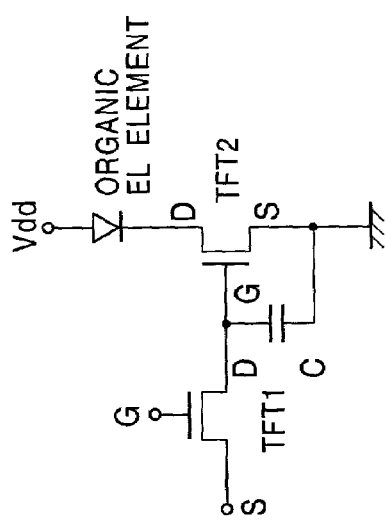
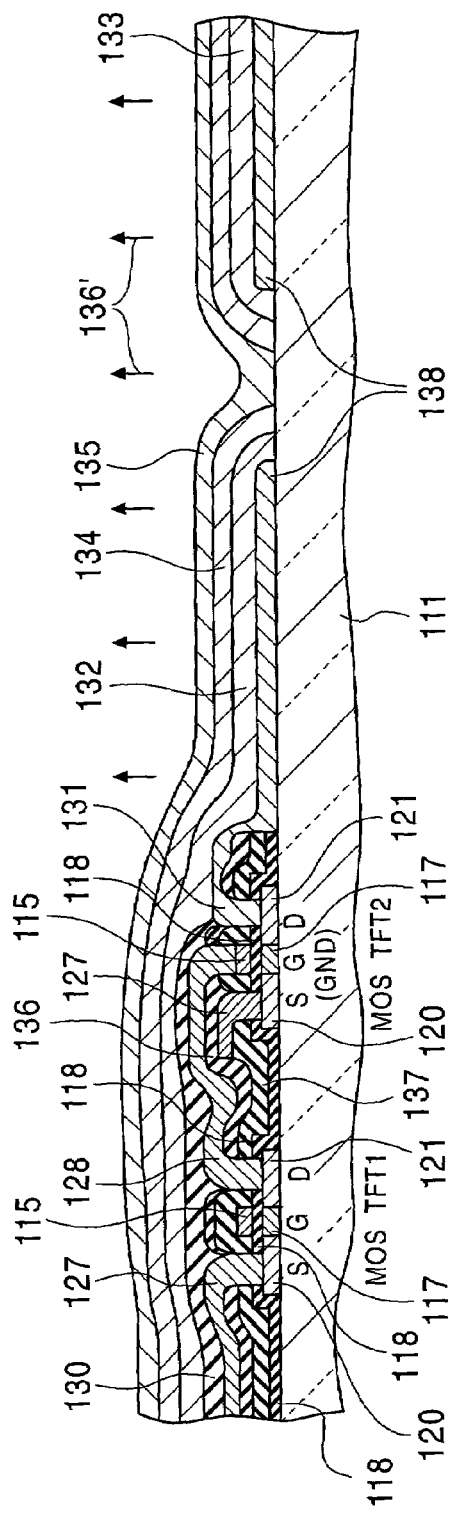

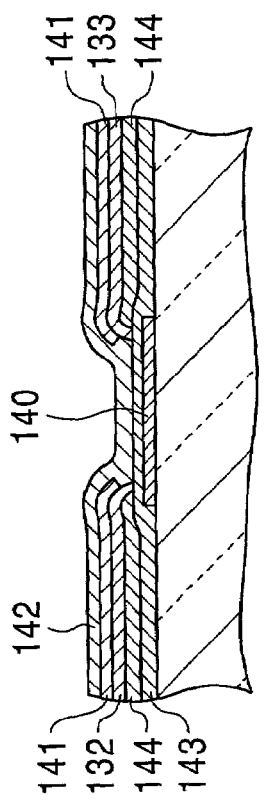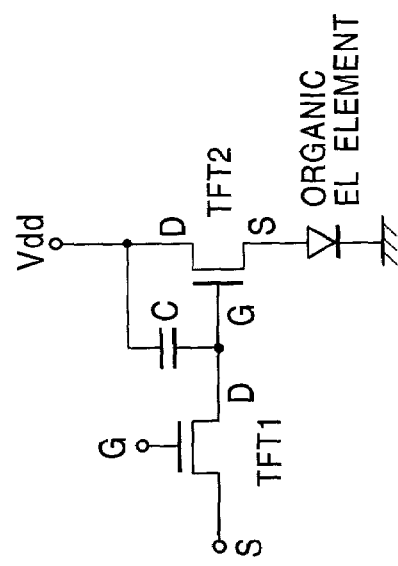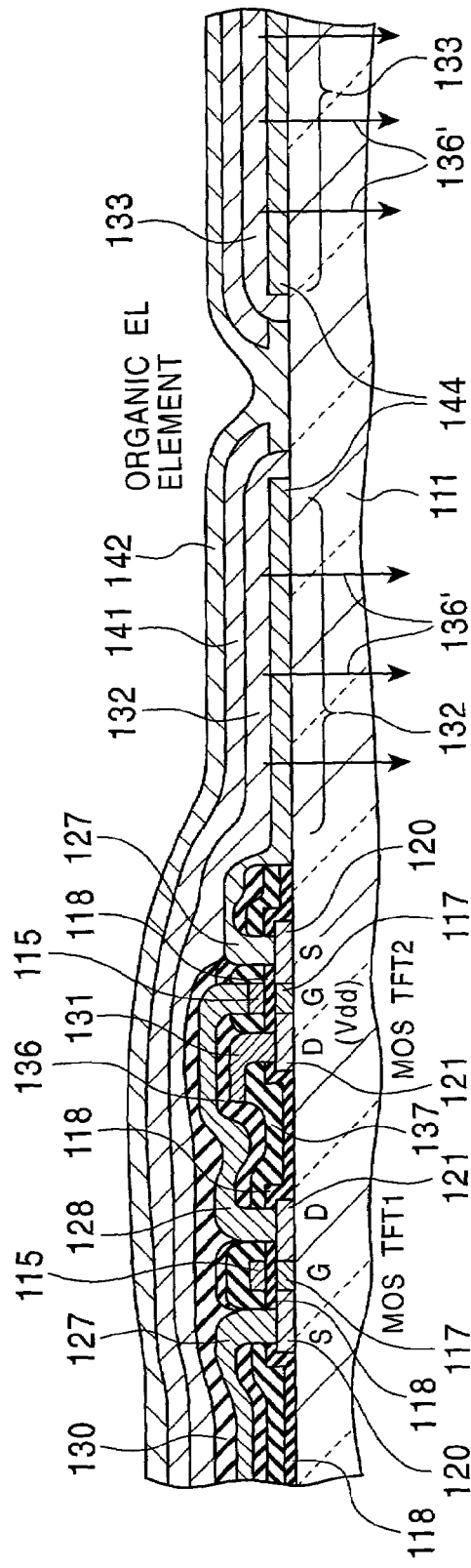
FIG. 21A
FIG. 21B
FIG. 21C

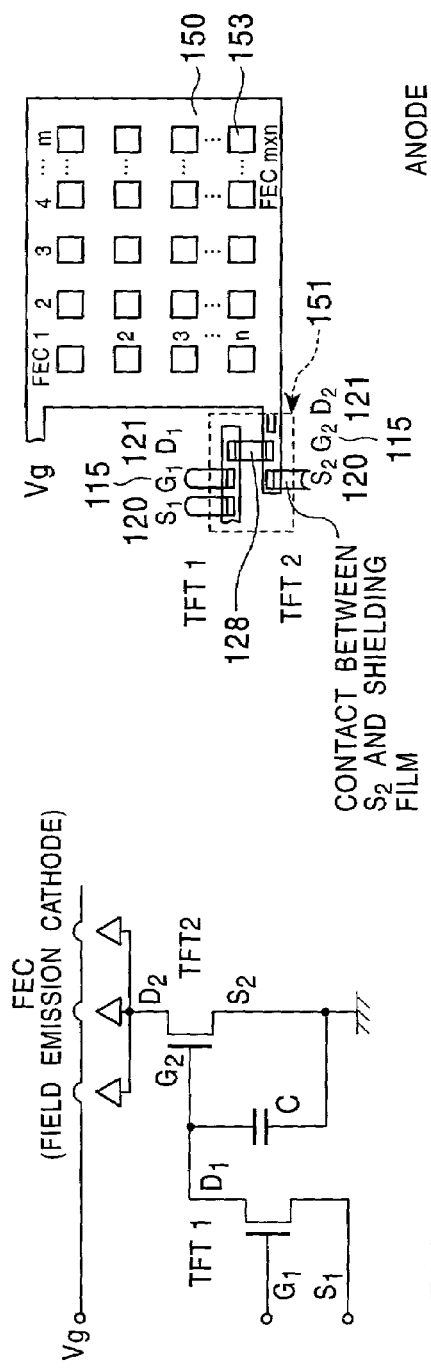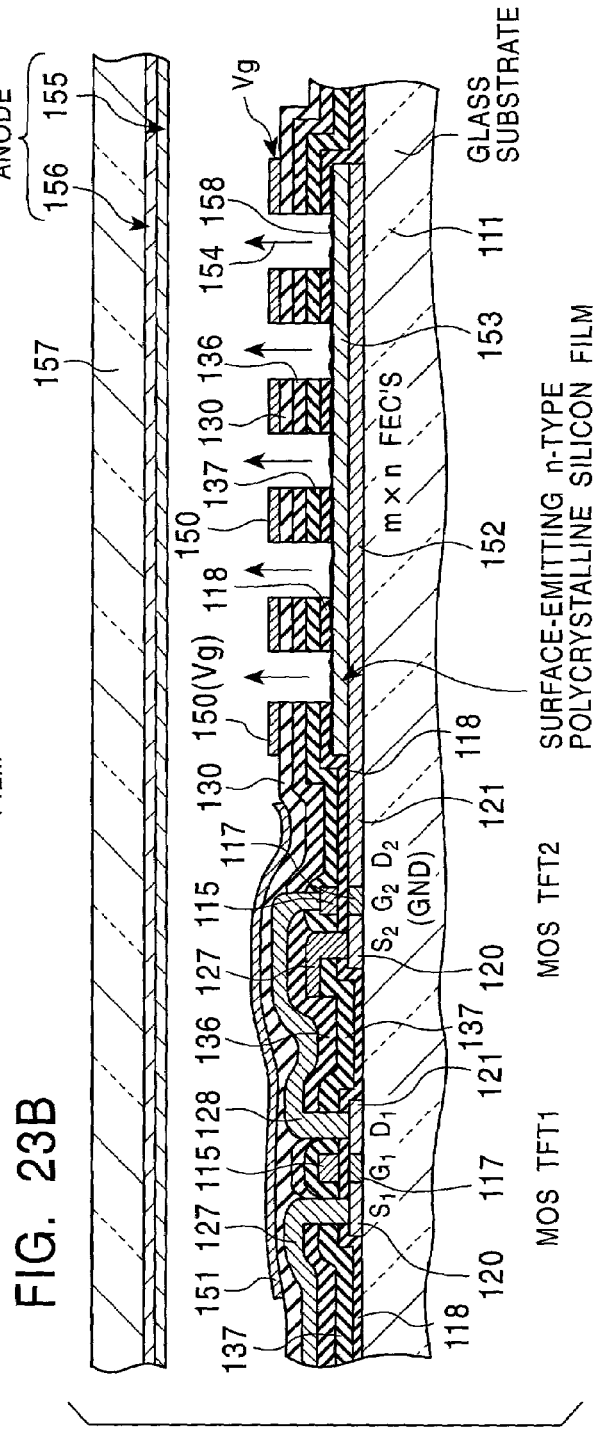

SURFACE-EMITTING FEC FORMED OF AN n-TYPE POLYCRYSTALLINE SILICON FILM

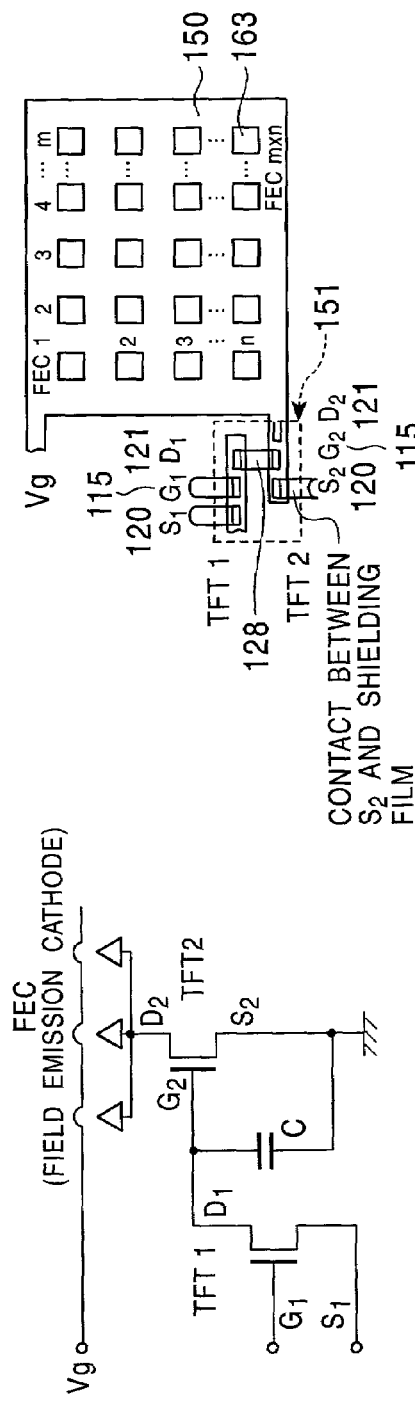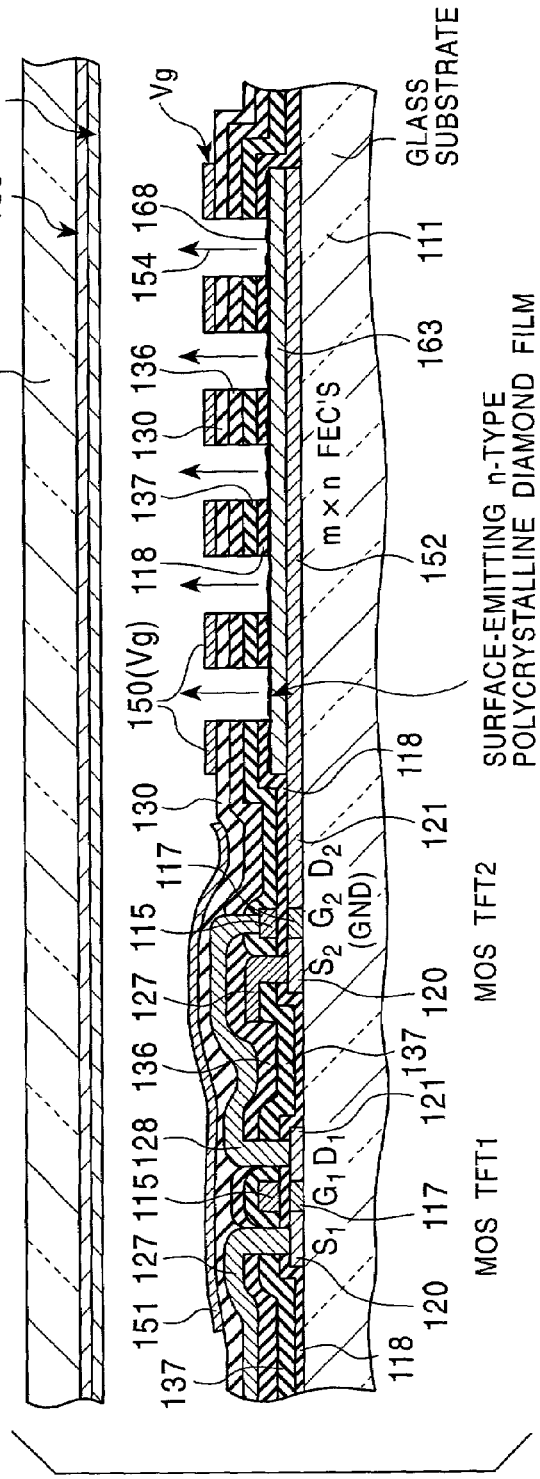

METHOD AND APPARATUS FOR FORMING A THIN SEMICONDUCTOR FILM, METHOD AND APPARATUS FOR PRODUCING A SEMICONDUCTOR DEVICE, AND ELECTRO-OPTICAL APPARATUS

RELATED APPLICATION DATA

The present application claims priority to Japanese Application(s) No(s). P2001-036441 filed Feb. 14, 2001, which application(s) is/are incorporated herein by reference to the extent permitted by law.

BACKGROUND OF THE INVENTION

1. Field of the Invention

The present invention relates to a method and apparatus for forming a thin semiconductor film such as a polycrystalline silicon film on a substrate, a method and apparatus for producing a semiconductor device having such a thin semiconductor film formed on a substrate, and an electro-optical device.

2. Description of the Related Art

Conventionally, vapor phase deposition such as plasma-enhanced chemical vapor deposition (CVD), reduced-pressure CVD, and catalytic CVD, solid phase growth, liquid phase growth, and excimer laser annealing are used to deposit a polycrystalline silicon film for forming drain and channel regions of a MOSFET (Metal Oxide Semiconductor Field Effect Transistor) such as a MOSTFT (Metal Oxide Semiconductor Thin Film Transistor).

As disclosed in, for example, Japanese Unexamined Patent Application Publication No. 7-131030, Japanese Unexamined Patent Application Publication No. 9-116156, and Japanese Examined Patent Application Publication No. 7-118441, the carrier mobility of an amorphous or microcrystalline silicon film formed by means of plasma-enhanced CVD or reduced-pressure CVD process can be improved by converting the film into a polycrystalline form by performing high-temperature annealing or excimer laser annealing (ELA). The highest carrier mobility achieved by this technique is about 80 to 120 $cm^2/V \cdot sec$.

Because the MOSTFT produced using the polycrystalline silicon film formed by performing ELA on an amorphous silicon film deposited by means of plasma CVD has a rather high electron mobility such as 100 $cm^2/V \cdot sec$, and the MOSTFT can be formed so as to be adapted to high-precision applications. An LCD (Liquid Crystal Display) using MOSTFTs formed of polycrystalline silicon and having a driver circuit integrated on the LCD has attracted considerable attention (Japanese Unexamined Patent Application Publication No. 6-242433). In the excimer laser annealing technique, a film in a precursor form is irradiated with a short-wavelength short-pulse laser beam such as XeCl excimer laser thereby melting and recrystallizing the film in a short time. In this technique, illumination of the amorphous silicon film with the laser beam allows conversion into a polycrystalline form without causing a glass substrate to be damaged. Another advantage of this technique is high throughput.

However, if a MOSTFT is produced using this ELA technique, recrystallization occurs as rapidly as on the order of nsec during the excimer laser annealing process, and thus the grain size of the polycrystalline silicon film formed by the excimer laser annealing process is at most about 100 nm. Even if the substrate is heated to about 400° C. during the irradiation with a short-wavelength short-pulse laser beam to remove hydrogen and oxygen that can inhibit crystal growth and if the solidification speed is controlled, it is difficult to obtain a grain size greater than 500 nm. One known technique to avoid the above problem is to perform laser irradiation repeatedly, for example, 5 times or 30 times, so as to apply large enough energy to obtain a polycrystalline silicon film having a large grain size. However, this technique has other various problems such as instability in the output power of the excimer laser, low productivity, and an increase in cost and reduction in yield/quality that occur when a large-sized apparatus is used. In particular, for a substrate with a large size such as 1 m×1 m, the problems described above become very serious, and it becomes very difficult to achieve high performance/quality at low cost.

In a technique of forming a crystalline silicon film, recently disclosed in for example Japanese Unexamined Patent Application Publication No. 11-97353, an amorphous silicon film is heated at 450° C. to 600° C. for 4 to 12 hours so as to diffuse an element serving as a catalytic element (such as Ni, Fe, or Co) thereby enhancing crystallization of the amorphous silicon film. However, the problem of this technique is that the catalytic element remains in the formed crystalline silicon film. To avoid the above problem, Japanese Unexamined Patent Application Publication No. 8-339960 discloses a technique of removing (gettering) the catalytic element by one of the following methods: performing a heating process in an ambient containing a halogen such as chlorine; performing a heating process after selectively incorporating phosphorus into a crystalline silicon film; and illuminating a crystalline silicon film containing a catalytic element with a laser beam or a high-intensity light ray so as to bring the catalytic element into a state in which the catalytic element can easily diffuse, and then gettering the catalytic element by a selectively added element. However, these methods are complicated, gettering effects are not sufficient, the characteristics of the silicon semiconductor film are degraded, and the stability and reliability of a produced device are degraded.

On the other hand, in the method of producing a polycrystalline silicon MOSTFT by means of solid phase growth, annealing at a temperature higher than 600° C. for 10 hours or longer and formation of a gate oxide $SiO_2$ by means of thermal oxidation at a high temperature of about 1000° C. are required. To perform these processing steps, it is needed to use a semiconductor production apparatus. This limits the substrate size to 8 to 12 inches in diameter. Besides, it is required to use expensive quartz glass to ensure that the substrate can resist high temperatures. This makes it difficult to reduce the cost, and thus applications are limited to EVF, data/AV projector, or the like.

In recent years, a catalytic CVD technique has been developed, which is one of thermal CVD techniques and is capable of depositing polycrystalline silicon film, silicon nitride, or the like on an insulating substrate such as a glass substrate at a low temperature (Japanese Examined Patent Application Publication No. 63-40314, Japanese Examined Patent Application Publication No. 8-250438). This technique is now being improved to put it to practical use. In the catalytic CVD technique, although a carrier mobility of about 30 $cm^2/V \cdot sec$ can be obtained without performing annealing for crystallization, the carrier mobility is still not high enough to produce a high-performance MOSTFT. In the case where a polycrystalline silicon film is formed on a glass substrate, an inversion layer (with a thickness of 5 to 10 nm) is formed in the amorphous silicon, depending on the deposition conditions. This makes it difficult to obtain a carrier mobility that is high enough to produce a bottom-gate type MOSTFT. In the LCD using the polycrystalline silicon MOSTFTs and including the integrated driver circuit, the bottom-gate type MOSTFT results in a better production yield and productivity. However, the problem described above results in a bottleneck.

SUMMARY OF THE INVENTION

It is an object of the present invention to provide a method of easily forming a high-quality high-crystallinity polycrystalline or monocrystalline thin semiconductor film over a large area at low cost. It is another object of the present invention to provide an apparatus for producing such a film according to the above method.

It is still another object of the present invention to provide a method of produce a semiconductor device such as a MOSTFT including such a polycrystalline or monocrystalline thin semiconductor film. It is still another object of the present invention to provide an apparatus for producing such a semiconductor device.

According to an aspect of the present invention, there is provided a method of producing a thin semiconductor film and a semiconductor device including a thin semiconductor film, in which a polycrystalline or monocrystalline thin semiconductor film is formed on a substrate or a semiconductor device including a polycrystalline or monocrystalline thin semiconductor film disposed on a substrate is produced by a process comprising a first step of forming a low-crystal-quality thin semiconductor film on the substrate; and a second step of performing focused-light annealing on the low-crystal-quality thin semiconductor film so as to melt or semi-melt the low-crystal-quality thin semiconductor film or heat the low-crystal-quality thin semiconductor film while maintaining it in a non-melted state and then cool the low-crystal-quality thin semiconductor film thereby enhancing crystallization of the low-crystal-quality thin semiconductor film.

According to another aspect of the present invention, there is provided an apparatus for producing a thin semiconductor film or a semiconductor device including a thin semiconductor film, wherein the apparatus comprises first means for forming a low-crystal-quality thin semiconductor film on the substrate; and second means for performing focused-light annealing on the low-crystal-quality thin semiconductor film so as to melt or semi-melt the low-crystal-quality thin semiconductor film or heat the low-crystal-quality thin semiconductor film while maintaining it in a non-melted state and then cool the low-crystal-quality thin semiconductor film thereby enhancing crystallization of the low-crystal-quality thin semiconductor film.

According to another aspect of the present invention, there is provided an electro-optical device including a cathode or an anode disposed under organic or inorganic electroluminescent layers of respective colors and connected to a drain or a source of a thin-film insulated-gate field effect transistor formed of the polycrystalline or monocrystalline thin semiconductor film, wherein active elements including the thin-film insulated-gate field effect transistor and a diode are covered with the cathode, or the surfaces of the organic or inorganic electroluminescence layers of respective colors and all areas between the organic or inorganic electroluminescence layers are covered with the cathode or the anode.

According to another aspect of the present invention, there is provided an electro-optical device wherein an emitter of a field emission display device is connected to a drain of a thin-film insulated-gate field effect transistor formed of the polycrystalline or monocrystalline thin semiconductor film via the polycrystalline or monocrystalline thin semiconductor film, and wherein the emitter of the field emission display device is formed of an n-type polycrystalline semiconductor film or an n-type polycrystalline diamond film formed on the polycrystalline or monocrystalline thin semiconductor film.

The present invention provides great advantages (1) to (10) described below, which result from the feature of the invention that a monocrystalline or polycrystalline thin semiconductor is produced from a low-crystal-quality thin semiconductor film formed on a substrate by performing a focused-light annealing process on the low-crystal-quality thin semiconductor film thereby melting or semi-melting the low-crystal-quality thin semiconductor film or heating the low-crystal-quality thin semiconductor film while maintaining it in a non-melted state and then cooling the low-crystal-quality thin semiconductor film thereby enhancing crystallization of the low-crystal-quality thin semiconductor film.

(1) In the focused-light annealing, light emitted from a lamp such as an ultra-high-pressure mercury lamp is focused into a desired form, and the low-crystal-quality thin semiconductor film such as an amorphous silicon film is illuminated with the focused light so as to heat the low-crystal-quality thin semiconductor film into a melted or semi-melted state or heat it while maintaining it in a non-melted state and then cool it thereby crystallizing it. That is, in this process, high illumination energy applied to the low-crystal-quality thin semiconductor film causes the low-crystal-quality thin semiconductor film to be heated into a melted or semi-melted state or heated while maintaining non-melted state, and then the low-crystal-quality thin semiconductor film is cooled thereby obtaining a monocrystalline semiconductor film or a large-grain polycrystalline semiconductor film such as a monocrystalline or polycrystalline silicon film, having a high carrier mobility and high quality. This technique allows a great improvement in productivity and a great reduction in cost.

(2) In the focused-light annealing according to the present invention, because the zone melting recrystallization is performed while continuously moving the melted zone, a catalytic element such as Ni preincorporated to enhance the crystallization and other impurities are segregated into the melted zone and thus such a catalytic element or impurities can be easily removed. Thus, no impurities remain in the resultant annealed film. This makes it possible to easily obtain a polycrystalline thin semiconductor film having large grains, a high carrier mobility, and high quality (high purity). In particular, if multiple zone melting recrystallization is performed by sequentially performing melting and cooling repeatedly using a plurality of focused light rays emitted from a plurality of lamps, it is possible to obtain a polycrystalline thin semiconductor film having further greater grains and higher quality (higher purity). The high purity obtained by this technique makes it possible to produce a device with high stability and high reliability without degrading characteristics of the semiconductor. Furthermore, in the focused-light annealing technique, the zone melting recrystallization or multiple zone melting recrystallization is performed via a simple process thereby allowing efficient removal of a catalytic element that has finished its role in enhancing crystallization and also allowing efficient removal of other impurities. This simplicity of the process allows a reduction in cost.

(3) The crystal grains in the polycrystalline silicon film are aligned in a direction in which the focused light is scanned. Therefore, if TFTs are formed in this direction, mismatching and stress at crystal grain boundaries are minimized, and thus the resultant polycrystalline thin silicon film has a high mobility.

(4) If another low-crystal-quality silicon film is formed on a polycrystalline silicon film crystallized by means of zone melting recrystallization or multiple zone melting recrystallization using the focused-light annealing technique, and if crystallization is performed again using the focused-light annealing process, then a polycrystalline silicon film having large grains, a high carrier mobility, and high crystal quality can be formed to a greater thickness. By performing this process repeatedly, a multilayer film with a large total thickness such as on the order of a few microns can be obtained. This makes it possible to produce not only a MOSLSI but also other types of devices such as a bipolar LSI, a CMOS sensor, a CCD area/linear sensors, and a solar cell, having high performance and high quality.

(5) Regardless of whether a UV lamp or an infrared lamp is used, light emitted from the lamp can be easily focused into the form of a line, a rectangle, or a square, and the focused light can be continuously applied. Furthermore, the beam size and the scanning pitch can be arbitrarily set. The high light intensity leads to increases in melting efficiency and throughput, and thus a reduction in cost can be achieved.

(6) The lamp used in the focused-light annealing apparatus can be easily controlled in terms of the wavelength, the light intensity, and the illumination time. Furthermore, the heating/melting rate and the cooling rate can be controlled by controlling the speed at which a substrate or the lamp is moved. By controlling those parameters, it is possible to form a polycrystalline silicon film having a desired grain size and desired purity.

(7) The lamp used in the focused-light annealing apparatus is much more inexpensive than an excimer laser generator used in an excimer laser annealing apparatus, and thus a great cost reduction can be achieved.

(8) In the focused-light annealing process, in particular in the annealing process using an ultra-high-pressure mercury lamp, light with the same wavelength as that of a XeCl excimer laser (with a wavelength of 308 nm) can be continuously applied with a small variation in illumination energy across the entire film surface, and thus a resultant crystallized semiconductor film has uniform characteristics and produced TFTs have small variations in characteristics from device to device. Thus, high throughput and high productivity are achieved, which result in a reduction in cost.

(9) The focused-light annealing process can be used at a low substrate temperature (200 to 400° C.). This makes it possible to employ glass having a low strain point or a heat-resistant resin as a substrate material, which allows production of a large-sized substrate at low cost. Thus, reductions in weight and cost can be achieved.

(10) Not only a top-gate type but also other types of TFTs such as a bottom-gate type and dual-gate type MOSTFTs can be produced using a monocrystalline or polycrystalline semiconductor film with a high carrier mobility formed by the focused-light annealing technique. Thus, it becomes possible to produce a high-speed high-current semiconductor device, an electro-optical device, and a high-efficiency solar cell, using the high-performance semiconductor film. Specific examples of devices that can be produced by this technique include a silicon semiconductor device, a silicon semiconductor integrated circuit, a silicon-germanium semiconductor device, a silicon-germanium semiconductor integrated circuit, a silicon carbide semiconductor device, a silicon carbide semiconductor integrated device, a compound semiconductor (such as GaAs) device, a compound semiconductor (such as GaAs) integrated circuit, a polycrystalline diamond semiconductor device, a polycrystalline diamond semiconductor integrated circuit, a liquid crystal display, an (inorganic/organic) electroluminescence display, a field emission display (FED), a light emitting polymer display, a light emitting diode display, a photosensor, a CCD area/liner sensor, a CMOS sensor, and a solar cell.

In the present invention, the term "low-crystal-quality thin semiconductor film" is used to describe a semiconductor film that has a substantially amorphous structure and that may include a microcrystal (with a grain size smaller than 10 nm), and the term "polycrystalline thin semiconductor film" is used to describe a semiconductor film that has a substantially polycrystalline structure including large-size grains (usually greater than 100 nm) that may be obtained by removing an amorphous component wherein the structure may include a microcrystal. The term "monocrystalline semiconductor film" is used to describe a wide variety of monocrystalline semiconductor films. Examples include a monocrystalline semiconductor of simple substance such as monocrystalline silicon, monocrystalline compound semiconductor (such as monocrystalline gallium arsenide), and monocrystalline silicon-germanium. Herein, a crystal including a subboundary or a dislocation is also regarded as a "monocrystal". The "polycrystalline diamond film" refers to a diamond film that contains substantially no amorphous component but contains a polycrystalline diamond component and a microcrystalline diamond component.

BRIEF DESCRIPTION OF THE DRAWINGS

FIGS. 6A and 6B are diagrams illustrating inline-type apparatuses for producing a MOSTFT;

FIG. 7 is a diagram illustrating another cluster-type apparatus for producing a MOSTFT;

FIG. 8 is a diagram illustrating a focused-light annealing process;

FIG. 19A is an equivalent circuit of a main part of an organic EL display according to a third embodiment of the present invention, FIG. 19B is a cross-sectional view illustrating the main part, and FIG. 19C is a cross-sectional view illustrating a peripheral portion of a pixel;

FIG. 21A is an equivalent circuit of a main part of another organic EL display,

FIG. 21B is a cross-sectional view illustrating the main part, and

FIG. 21C is a cross-sectional view illustrating a peripheral portion of a pixel;

FIG. 23A is an equivalent circuit of a main part of an FED according to a fourth embodiment of the present invention, and FIGS. 23B and 23C are a cross-sectional view and a plan view thereof;

FIG. 25A is an equivalent circuit of a main part of another FED, and

FIGS. 25B and 25C are a cross-sectional view and a plan view thereof;

DESCRIPTION OF THE PREFERRED EMBODIMENTS

Figure 1A:
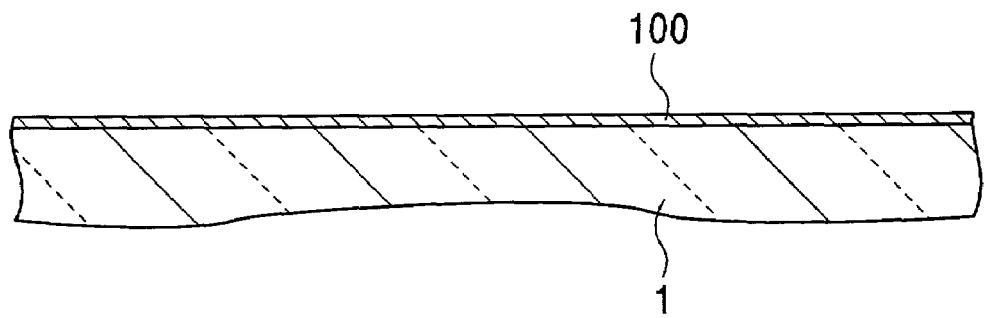
FIGS. 1A to 1L are diagrams illustrating processing steps of producing a MOSTFT according to a first embodiment of the present invention.

In the present invention, focused-light annealing is preferably performed by scanning a focused light ray emitted from a lamp across a substrate placed at a fixed location such that zone melting recrystallization occurs or by scanning a plurality of focused light rays emitted from a plurality of lamps across a substrate placed at a fixed location such that multiple zone melting recrystallization occurs. In this case, the scanning may be accomplished either by moving the focused light ray(s) while maintaining a substrate at a fixed location or by moving the substrate without moving the focused light ray(s).

In this focused-light annealing technique, a low-crystal-quality thin semiconductor film such as an amorphous silicon film is partially melted or semi-melted and then cooled region by region as the melted or semi-melted silicon region is moved (scanned), thereby forming, by means of zone melting recrystallization, a monocrystalline or polycrystalline thin semiconductor film with large grain sizes.

The catalytic element and other impurity elements are collected (segregated) into a high-temperature region during the above annealing process, and no such impurity elements remains in the monocrystalline or polycrystalline thin semiconductor film obtained after being cooled. In the case where heating and cooling are performed repeatedly using a plurality of focused light rays, multiple zone melting recrystallization occurs and thus the resultant monocrystalline or polycrystalline thin semiconductor film has a still greater grain size and higher purity.

A monocrystalline semiconductor film or a large-grain polycrystalline semiconductor film having a large thickness such as on the order of a few microns may be produced by repeatedly performing the zone melting recrystallization or multiple zone melting recrystallization process as many times as needed thereby forming a film in a layer-on-layer fashion. That is, after forming a monocrystalline semiconductor film or a large-grain polycrystalline semiconductor film by performing a first-time focused-light annealing process, another low-crystal-quality thin semiconductor film is formed on the monocrystalline or polycrystalline semiconductor film. Thereafter, the low-crystal-quality thin semiconductor film is converted into a monocrystalline form or large-grain polycrystalline form by performing a second-time focused-light annealing process. The above process is performed repeatedly as many times as needed to obtain a monocrystalline semiconductor film or large-grain polycrystalline semiconductor film with a desired thickness on the order of a few microns.

In the multilayer film forming process described above, an underlying monocrystalline semiconductor film or large-grain polycrystalline semiconductor film provides crystal growth nuclei on the basis of which grains in the underlying-layer film and an upper-layer film grows into greater-sized grains with higher crystallinity. Thus, in this multilayer film forming process, the grain size becomes greater and greater and the purity becomes higher and higher each time a film is deposited on a previously formed film and annealing is performed. Note that such a thick semiconductor film falls within the scope of the "thin semiconductor film" according to the present invention.

The lamp used in the focused-light annealing process described above may be of any type selected from the group consisting of an ultraviolet (UV) lamp, a near ultraviolet lamp, a deep ultraviolet (DUV) lamp, a visible light lamp, and an infrared lamp. A proper type of lamp may be selected depending on the degree of heat resistance of a substrate. A UV lamp and a DUV lamp are suitable for performing low-temperature annealing on a film on a glass substrate. An infrared lamp is suitable for performing high-temperature annealing on a film on a quartz substrate or a crystallized glass substrate. The irradiating light ray may be focused into a rectangular or square form so as to improve the melting efficiency and throughput. Specific examples of UV lamps include a high-pressure mercury lamp, an ultra-high-pressure mercury lamp, and a xenon short-arc lamp. Specific examples of DUV lamps include a low-pressure mercury lamp and a xenon-mercury lamp. Specific examples of infrared lamps include a halogen lamp, a xenon lamp, and an arc lamp.

Light emitted from a lamp may be separated into a UV component, a visible component, and an infrared component, and a substrate may be sequentially illuminated with the separated components in the order of the visible component, the infrared component, and the UV component. In this process, a low-crystal-quality thin semiconductor film or a substrate is preheated by the visible and infrared components before heated by the UV component. Another advantage of this technique is that the film is slowly cooled and thus crystallization is enhanced.

Irradiation with a light ray, focused into a desired form after being emitted from an ultra-high-pressure mercury lamp, may be performed, for example, as follows. (1) After focusing the light ray emitted from the ultra-high-pressure mercury lamp into the desired shape, the light ray is separated into a UV component, a visible component, and an infrared component via a cold half mirror. (2) A low-crystal-quality thin semiconductor film is irradiated with the UV component such that the UV component is incident on the film at a substantially right angle, thereby melting or semi-melting and then cooling the film region by region thereby crystallizing the film. (3) The visual and infrared components are applied to the substrate and the low-crystal-quality thin semiconductor film to heat them.

To melt the low-crystal-quality thin semiconductor film and to heat the substrate in an efficient manner in the above irradiation process, it is desirable to meet the following conditions:

1. The visible and infrared components are applied to a region that is greater than, and contains therein, a region irradiated with the UV component.

2. The visible and infrared components are applied before the UV components are applied when the film and the substrate are scanned by these components. It is further desirable that, in addition to the local heating described above, the whole substrate be heated using a resistance heater, an infrared lamp, or the like.

The heating of the substrate may also be accomplished by blowing a hot air/gas against the substrate during the focused-light annealing process. For example, hot air or inert gas (such as nitrogen gas) at a temperature from 100 to 400° C. is blown against the front or back side or against both the front and back sides of the substrate such that the substrate has a uniform temperature distribution thereby allowing uniform crystallization of the film, a reduction in stress in the crystallized film and in the substrate, and an achievement of cooling at a slower rate.

As described above, it is preferable to heat the substrate to a temperature depending on the material of the substrate lower than the strain point thereof using a resistance heater, an infrared lamp, or a laser beam during the annealing process using the focused light. More specifically, in the case of a glass substrate, the substrate is heated to 200 to 500° C. and more preferably 300 to 400° C. On the other hand, in the case of a quartz substrate, the substrate is heated to 200 to 800° C. and more preferably 300 to 600° C.

The focused-light annealing may be performed by any of the method (1) and (2) described below. (1) While maintaining the substrate at a fixed location, a UV ray focused into, for example, a 100×100 mm square shape is scanned across the substrate using a galvanometer scanner thereby annealing the substrate. (2) A UV ray focused into, for example, a 100×100 mm square shape is maintained in a fixed state, and the substrate is precisely moved in X and Y directions thereby annealing the substrate.

In the present invention, the low-crystal-quality thin semiconductor film may be formed by means of catalytic CVD, plasma-enhanced CVD, reduced-pressure CVD, or sputtering. In the case where the film is formed by means of vapor phase deposition, the source gas may be a silicon hydride or a derivative thereof, a mixture of a silicon hydride or a derivative thereof and a gas containing hydrogen, nitrogen, germanium, carbon, or tin, a mixture of a silicon hydride or a derivative thereof and a gas containing a group III or group V element, or a mixture of a silicon hydride or a derivative thereof, a gas containing hydrogen, nitrogen, germanium, carbon, or tin, and a gas containing a group III or group V element.

For example, a hydrogen-based carrier gas and a source gas or at least a part of them are brought into contact with the catalytic element heated to 800 to 2000° C. (lower than the melting point) such that depositing species such as radicals or ions are created by catalytic reaction or thermal decomposition and deposit on a substrate heated at 200 to 400° C. thereby forming a low-crystal-quality semiconductor film. Alternatively, a low-crystal-quality semiconductor film may be deposited on a substrate heated at 200 to 400° C. by means of plasma CVD, reduced-pressure CVD, sputtering, or the like, widely used in the art.

Specific examples of low-crystal-quality thin semiconductor films formed in this technique include a film of amorphous silicon, a film of amorphous silicon containing microcrystalline silicon, a film of microcrystalline silicon (containing amorphous silicon), a film of polycrystalline silicon containing amorphous silicon and microcrystalline silicon, a film of amorphous germanium a film of amorphous germanium containing microcrystalline germanium, a film of microcrystalline germanium (containing amorphous germanium, a film of polycrystalline germanium containing amorphous germanium and microcrystalline germanium, a film of amorphous silicon germanium having a composition of $Si_xGe_{1-x}$ (0<x<1), a film of amorphous carbon, a film of amorphous carbon containing microcrystalline carbon, a film of microcrystalline carbon (containing amorphous carbon), a film of polycrystalline carbon containing amorphous carbon and microcrystalline carbon, a film of amorphous silicon carbon having a composition of $Si_xC_{1-x}$ (0<x<1), and a film of amorphous gallium arsenide having a composition of $Ga_xAs_{1-x}$ (0<x<1). Preferably, the basic structure of the low-crystal-quality thin semiconductor film is amorphous. In the case where the low-crystal-quality thin semiconductor film includes microcrystals, it is desirable that the diameter of each microcrystal particle be less than 10 nm and microcrystal particles be interspersed.

If a proper amount (for example, $10^{17}$ to $10^{20}$ atoms/cc in total) of at least one catalytic element selected from the group consisting of Ni, Fe, Co, Ru, Rh, Pd, Os, Ir, Pt, Cu, Au, Ge, Pb, and Sn is incorporated into a low-crystal-quality thin semiconductor film during or after the process of growing it, and if the low-crystal-quality thin semiconductor film containing such a catalytic element is annealed by the focused-light annealing technique described above, crystallization of the low-crystal-quality thin semiconductor film into a polycrystalline form is enhanced, and the resultant polycrystalline semiconductor film has a higher carrier mobility and higher crystal quality. The catalytic element may be mixed in the source gas or incorporated into the low-crystal-quality semiconductor film by means of ion implantation or ion doping.

In the focused-light annealing according to the present invention, because the zone melting recrystallization is performed while continuously moving the melted zone, a catalytic element such as Ni preincorporated to enhance the crystallization and other impurities are segregated into the melted zone and thus such a catalytic element or impurities can be easily removed. Thus, no impurities remain in the resultant annealed film. This makes it possible to easily obtain a polycrystalline thin semiconductor film having large grains, a high carrier mobility, and high quality (high purity). In particular, if multiple zone melting recrystallization is performed by sequentially performing melting and cooling repeatedly using a plurality of focused light rays emitted from a plurality of lamps, it is possible to obtain a polycrystalline thin semiconductor film having further greater grains and higher quality (higher purity). The high purity obtained by this technique makes it possible to produce a device with high stability and high reliability without degrading characteristics of the semiconductor. Furthermore, in the focused-light annealing technique, the zone melting recrystallization or multiple zone melting recrystallization is performed via a simple process thereby allowing efficient removal of a catalytic element that has finished its role in enhancing crystallization and also allowing efficient removal of other impurities. This simplicity of the process allows a reduction in cost.

It is preferable that the concentrations of oxygen, nitrogen, and carbon included in the monocrystalline semiconductor film or the large-grain polycrystalline semiconductor film formed according to the present invention be smaller than $1 \times 10^{19}$ atoms/cc and more preferable smaller than $5 \times 10^{18}$ atoms/cc, and the concentration of hydrogen be greater than 0.01 atm %.

In the above-described example of the focused-light annealing process, a low-crystal-quality thin semiconductor film such as a low-crystal-quality silicon film is converted into a large-grain polycrystalline thin semiconductor film such as a polycrystalline silicon film. The focused-light annealing process according to the present invention may also be used to convert a low-crystal-quality thin silicon film into a monocrystalline form. This can be accomplished, for example, by forming a stepped recess with a predetermined shape and size in a particular area of a substrate where a device is to be formed, forming a low-crystal-quality thin silicon film, which may or may not include one or more kinds of catalytic elements, on the substrate having the stepped recess, and then performing a focused-light annealing process thereby allowing monocrystalline silicon to grow by means of graphoepitaxy in which lower edges of the stepped recess act as growth seeds.

Conversion of a low-crystal-quality thin silicon form into a monocrystalline form may also be accomplished as follows. First, a crystal layer of a material that can be lattice-matched with monocrystalline silicon, such as sapphire, is formed in an area where a device is to be formed on a substrate. A low-crystal-quality thin silicon film, which may or may not include one or more kinds of catalytic elements, is then formed on the crystal layer. Thereafter, focused-light annealing is performed thereby allowing monocrystalline silicon to heteroepitaxially grow on the crystal layer acting as a growth seed.

A monocrystalline semiconductor film or a large-grain polycrystalline semiconductor film having a large thickness such as on the order of a few microns may be produced by repeatedly performing a combination of formation of a low-crystal-quality thin silicon film and focused-light annealing as many times as needed. That is, after forming a monocrystalline semiconductor film or a large-grain polycrystalline semiconductor film by performing a first-time focused-light annealing process, another low-crystal-quality thin semiconductor film is formed on the monocrystalline or polycrystalline semiconductor film. Thereafter, the low-crystal-quality thin semiconductor film is converted into a monocrystalline form or large-grain polycrystalline form by performing a second-time focused-light annealing process. The above processes are performed repeatedly as many times as needed to obtain a large-grain polycrystalline semiconductor film or a monocrystalline semiconductor film having a total thickness on the order of a few microns. In the process of forming the film in a layer-on-layer fashion, an underlying semiconductor layer in the monocrystal or large-grain polycrystalline form acts as a growth seed for an upper layer, and thus an upper semiconductor layer becomes greater in grain size and better in purity than underlying layers. In the above process, it is important to prevent a low-quality-oxide film from growing on the surface of the film crystallized via the annealing process and to prevent the surface of the crystallized film from being contaminated with an impurity.

In order to avoid the formation of a low-quality oxide film and contamination and also in order to improve productivity, means (such as plasma-enhanced CVD, analytic CVD, or sputtering) for forming a low-crystal-quality thin semiconductor film and focused-light annealing means are integrated in a single apparatus so that the step of forming a low-crystal-quality thin semiconductor film and the focused-light annealing step can be performed in an integrated fashion. More specifically, the apparatus is constructed in an in-line fashion (including continuous chambers of linear or rotary type), in a multiple chamber fashion, or a cluster fashion such that the above two steps can be performed continuously or successively.

Of above-described various types of the apparatus, the cluster type (1) or (2) described below is particularly preferable.

(1) A first cluster-type integrated apparatus includes a CVD unit and an annealing unit. First, in a CVD unit, a low-crystal-quality thin semiconductor film is formed on a substrate. Thereafter, in the annealing unit, the film is crystallized by means of focused-light annealing. The substrate is then returned into the CVD unit, and another low-crystal-quality thin semiconductor film is formed. The substrate is then transferred again into the annealing unit and crystallization is performed by means of focused-light annealing. The above-described steps are performed repeatedly as many times as required.

(2) A second cluster-type integrated apparatus includes first, second and third CVD units, an ion doping/implantation unit, and an annealing unit. First, in the first CVD unit, an underlying protective film (such as a silicon oxide/silicon nitride film) is formed on a substrate, and then, in the second CVD unit, a low-crystal-quality thin semiconductor film is formed. Thereafter, in the ion doping/implantation unit, a catalytic element is incorporated. Crystallization is then performed in the annealing unit by means of focused-light annealing. Furthermore, in the third CVD unit, a gate insulating film (such as a silicon oxide film) is formed. The above-described steps are performed successively.

Preferably, before the focused-light annealing is again performed, the surface of the polycrystalline thin semiconductor film is cleaned or a low-quality oxide film is removed from the surface of the polycrystalline thin semiconductor film by applying, to the polycrystalline thin semiconductor film, a hydrogen-based active species created by means of plasma discharge of hydrogen or a gas containing hydrogen or by means of a catalytic reaction (that is, by means of plasma processing or atomic hydrogen annealing), and, after completion of the cleaning, a low-crystal-quality thin semiconductor film is formed and focused-light annealing is performed. In this case, it is preferable to perform the focused-light annealing in an ambient of reduced-pressure hydrogen or a gas containing reduced-pressure hydrogen or in a vacuum (such an ambient is generally desirable when the focused-light annealing is performed).

More specifically, condition (1) or (2) described below is preferable.

(1) Before depositing a film by means of plasma-enhanced CVD, only a hydrogen-based carrier gas is supplied into the CVD chamber without supplying a source gas, and a plasma treatment or an AHA treatment is performed such that the surface of a polycrystalline silicon film that has already been formed via the first-time focused-light annealing is exposed to created hydrogen-based active species (such as activated hydrogen ions) thereby removing contamination (low-quality oxide film, water, oxygen, nitrogen, carbon oxide, etc.) from the surface and thus cleaning the surface. Furthermore, in the plasma AHA treatment, residual amorphous silicon in the film is etched, and the film is converted into a higher-crystallinity polycrystalline silicon film. This underlying layer having the cleaned surface provides a seed for crystallization when next-time focused-light annealing is performed after depositing a low-crystal-quality silicon film on this underlying layer, and thus it becomes possible to obtain a higher-quality larger-grain polycrystalline or monocrystalline semiconductor film.

(2) To prevent oxidization and nitrization, it is desirable that the focused-light annealing be performed in an ambient of reduced-pressure hydrogen or a gas containing reduced-pressure hydrogen or in a vacuum. More specifically, the ambient used in the focused-light annealing may be hydrogen or a mixture of hydrogen and an inert gas (such as argon, helium, krypton, xenon, neon, or radon), and the preferable gas pressure is 1.33 Pa to atmospheric pressure and more preferable gas pressure is 133 Pa to $4\times10^4$ Pa. In the case of vacuum, the preferable pressure is 1.33 Pa to atmospheric pressure, and more preferable pressure is 13.3 Pa to $1.33\times 10^4$ Pa. In the case where the low-crystal-quality thin semiconductor film is covered with a protective insulating film (such as a silicon oxide film, a silicon nitride film, a silicon oxide nitride film, or a silicon oxide/silicon nitride film), or in the case where it is not needed to perform processing steps in a immediately successive fashion, the focused-light annealing may be performed in the air or atmospheric-pressure nitrogen.

If focused-light annealing is performed in an ambient of reduced-pressure hydrogen or a gas containing reduced-pressure hydrogen, gas molecules in the ambient gas, having large specific heat and thus having a high cooling effect, collide with the surface of the thin film, and heat is removed from the thin film when the gas molecules leaves the thin film. As a result, low-temperature spots are locally created, and crystal nuclei that can enhance crystal growth are created at the locally-low-temperature spots. In the case where hydrogen gas or a mixture of hydrogen gas and an inert gas (such as He, Ne, or Ar) is used as the ambient gas, the gas pressure is preferably set to 1.33 Pa to atmospheric pressure and more preferably 133 Pa to $4\times10^4$ Pa so as to ensure that the above-described effects are achieved by motion of hydrogen molecules having large specific heat.

In order to reduce reflection of the focused light thereby increasing the melting efficiency, it is preferable that focused-light annealing is performed after an insulating protective film such as a silicon oxide film, silicon nitride oxide film, or a multilayer film of silicon oxide/silicon nitride is formed to a proper thickness on the low-crystal-quality thin semiconductor film. Preferably, when the focused-light annealing is performed on the low-crystal-quality thin semiconductor film formed on the substrate or when the focused-light annealing is performed on the low-crystal-quality thin semiconductor film coated with a protective insulating film, the substrate is illuminated with the focused light ray emitted from the lamp from above or from below or from both above and below the substrate (wherein the substrate is adapted to be transparent to wavelengths smaller than 400 nm when the light is applied from below).

Preferably, the low-crystal-quality thin semiconductor film or the low-crystal-quality thin semiconductor film coated with the protective insulating film is formed into the shape of one or more islands. Preferably, the illumination with the focused light is performed in an ambient of atmospheric-pressure nitrogen, the air, reduced-pressure hydrogen, a gas containing reduced-pressure hydrogen, or a vacuum (such an ambient is generally desirable when the illumination with the focused light is performed).

In order to reduce increases in substrate temperature and film stress and to prevent cracking due to instantaneous expansion of a gas (such as hydrogen) contained in the film and also to prevent formation of grains to a too large size due to a slow cooling rate, it is desirable that the focused-light annealing is performed after patterning the low-crystal-quality thin semiconductor film covered with the insulating protective film into the form of islands.

Preferably, the focused-light annealing is performed while applying a magnetic or electric field.

In this annealing process, as a result of interaction between the electric field and electron spins of silicon atoms in a melted region of the low-crystal-quality thin silicon film, the silicon atoms are aligned in a particular direction, and thus, when the melted region is cooled and solidified, the region is crystallized into the particular direction. Thus, as in the case where the magnetic field is applied, the crystal grains are aligned in the particular direction, and thus an improvement in the carrier mobility is achieved. Besides, irregularities on the film surface are reduced. Furthermore, a high light irradiation efficiency can be achieved.

An electric field and a magnetic field may be applied at the same time during the focused-light annealing process. This can be accomplished by applying a high-frequency voltage (or a DC voltage or both a DC voltage and a high-frequency voltage) to an electrode so that an electric field is applied from the electrode while applying a magnetic field from a permanent magnet (or an electromagnet) disposed around the vacuum chamber in which a substrate is placed.

In this annealing process, as a result of interaction between the magnetic and electric fields and electron spins of silicon atoms in a melted region of the low-crystal-quality thin silicon film, the silicon atoms are aligned in a particular direction, and thus, when the melted region is cooled and solidified, the region is crystallized into the particular direction. This results in further enhancement in the alignment of the crystal grains into the particular direction, and thus a further improvement in the carrier mobility is achieved. Besides, irregularities on the film surface are further reduced. Furthermore, a high light irradiation efficiency can be achieved.

When focused-light annealing is performed, it is preferable to heat the substrate to a temperature lower than its strain point, and more preferably to 400° C. to 450° C. so that dehydrogenation of the low-crystal-quality thin semiconductor film occurs during the annealing process, and crystallization occurs more uniformly. This also results in a reduction in stress in the film and substrate, an increase in energy irradiation efficiency, and an increase in throughput.

It is possible to form a channel and a source/drain region of a MOSTFT or form a diode, an interconnection, a resistor, a capacitor, or an electron emission element, using the thin monocrystalline or polycrystalline semiconductor film obtained via the focused-light annealing. In this case, if the focused-light annealing is performed after patterning the low-crystal-quality thin semiconductor film into a form (of one or more islands) corresponding to the channel, the source region, the drain region, the diode, the resistor, the capacitor, the interconnection, or the electron emission element, recrystallization and activation of n-type or p-type impurities in the film are performed via the annealing. If the focused-light annealing is performed after patterning the above-described regions into the form of islands, it is possible to prevent the substrate from being damaged (cracked) due to a temperature increase and it is also possible to prevent the film from being cracked due to a rapid temperature increase.

The present invention can be advantageously used to form a thin film for use in a silicon semiconductor device, a silicon semiconductor integrated circuit, a silicon-germanium semiconductor device, a silicon-germanium semiconductor integrated circuit, a compound semiconductor device, a compound semiconductor integrated circuit, a silicon carbide semiconductor device, a silicon carbide semiconductor integrated device, a polycrystalline diamond semiconductor device, a polycrystalline diamond semiconductor integrated circuit, a liquid crystal display, an organic or inorganic electroluminescence (EL) display, a field emission display (FED), a light emitting polymer display, a light emitting diode display, a CCD area/liner sensor, a CMOS or MOS sensor, and a solar cell.

Using such a thin film, it is possible to produce a MOSTFT of the top-gate type, bottom-gate type, or dual-gate type. Using such a MOSTFT, it is possible to produce various kinds of circuits and devices such as a peripheral driver circuit, a video signal processing circuit, a liquid crystal display including a memory integrated therewith, an organic EL display, and an FED device.

When a semiconductor device, an electro-optical display, or a solid-state imaging device, which includes an internal circuit and a peripheral circuit, is produced, the channel region, the source region, and the drain region of a MOSTFT of at least one of the internal circuit or the peripheral circuit may be formed using the polycrystalline or monocrystalline thin semiconductor film described above. Various kinds of circuits such as a peripheral driver circuit, a video signal processing signal, and a memory may be integrated.

Preferably, the EL device has a structure in which a cathode or an anode is disposed under organic or inorganic electroluminescent (EL) layers of respective colors, and the cathode or the anode is connected to the drain or source of the MOSTFT.

In this EL device, if active elements such as a MOSTFT and a diode are also covered with the cathode, then the light emission area can be increased in the structure in which the anode is disposed on the upper side, and, furthermore, the cathode prevents emitted light from being incident on the active device thereby preventing generation of a leakage current. If the surfaces of the organic or inorganic EL layers of respective colors and all areas between the organic or inorganic EL layers are covered with the cathode or the anode, the entire surface of the structure is covered with the cathode or the anode, and thus the organic EL layers and other electrodes are protected from degradation or oxidation due to intrusion of moisture. This ensures a long life time, high quality, and high reliability. Furthermore, the presence of the cathode covering the entire surface enhances heat radiation. This suppresses a structural change (melting or recrystallization) of the organic EL films due to heat, and the life time, the quality, and the reliability are improved. Using this technique, high-precision high-quality full-color organic EL layers can be produced in a highly productive fashion at low cost.

Furthermore, a black mask layer may be formed using chromium or chromium dioxide in areas between the organic or inorganic EL layers of respective colors. The black mask layer prevents mixing of light between different colors and between different pixels, and thus contrast is improved.

When the present invention is applied to a field emission display (FED), it is preferable that an emitter (emission cathode) thereof be connected to a drain of the MOSTFT via the polycrystalline or monocrystalline thin semiconductor film, and the emitter be formed of an n-type polycrystalline semiconductor film or an n-type polycrystalline diamond film formed on the polycrystalline or monocrystalline thin semiconductor film.

In this case, it is preferable that a shield metal film connected to the ground be formed such that active elements such as MOSTFTs and diodes are covered with the shield metal film via an insulating film (the shield metal film may be simply formed using the same material in the same processing step as the gate lead electrode of the FED). If there is no such a shield metal film, when a gas present in a hermetic case is positively ionized by electrons emitted from the emitter, the insulating film can be charged by the ionized gas, and the positive charge can cause an undesirable inversion layer to be created in a MOSTFT located under the insulating film, and an excess current can flow through the current path created by the inversion layer, which can result in run-away of the emitter current. When electrons emitted from the emitter collide with the phosphor, light is emitted from the phosphor. This light emitted from the phosphor is blocked by the shield metal film. Therefore, no electrons and holes are generated by the light in the gate channel of the MOSTFT, and thus no leakage current occurs.

The present invention is described in further detail below with reference to preferred embodiments.

First Embodiment

A first embodiment of the present invention is described below with reference to FIGS. 1 to 9.

In this first embodiment, the invention is applied to a top-gate polycrystalline silicon CMOS (Complementary MOS) TFT.

Catalytic CVD and Apparatus Therefor

A catalytic CVD method used in the present embodiment is first described. In the analytic CVD process, a reaction gas including a hydrogen-based carrier gas and a source gas such as silane is brought into contact with a heated catalytic element such as tungsten to give high energy to a created radical depositing species or a precursor thereof and a hydrogen-based active species such as activated hydrogen ions thereby growing, by means of vapor phase deposition, a low-crystal-quality thin semiconductor film such as microcrystal silicon containing amorphous silicon on a substrate.

Figure 2:
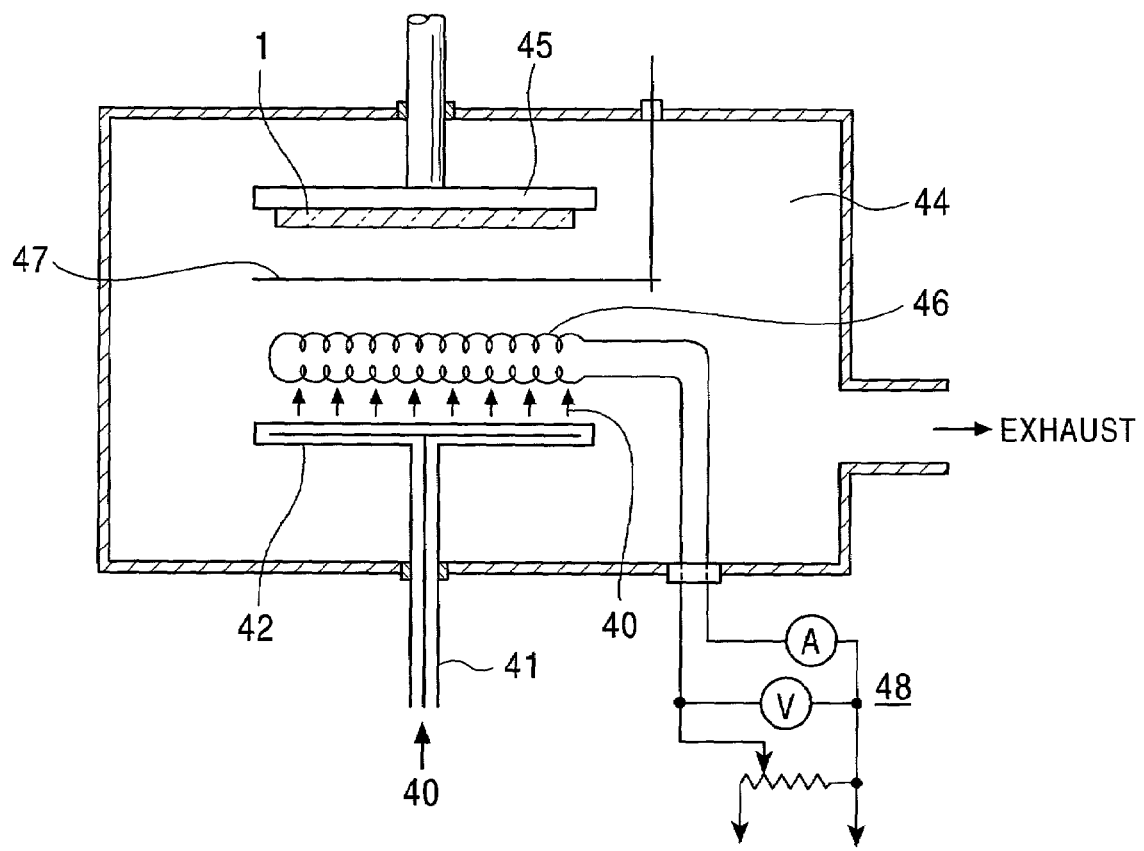
FIG. 2 is a cross-sectional view of a catalytic CVD apparatus used in the production, wherein the apparatus is in a certain state.
Figure 3:
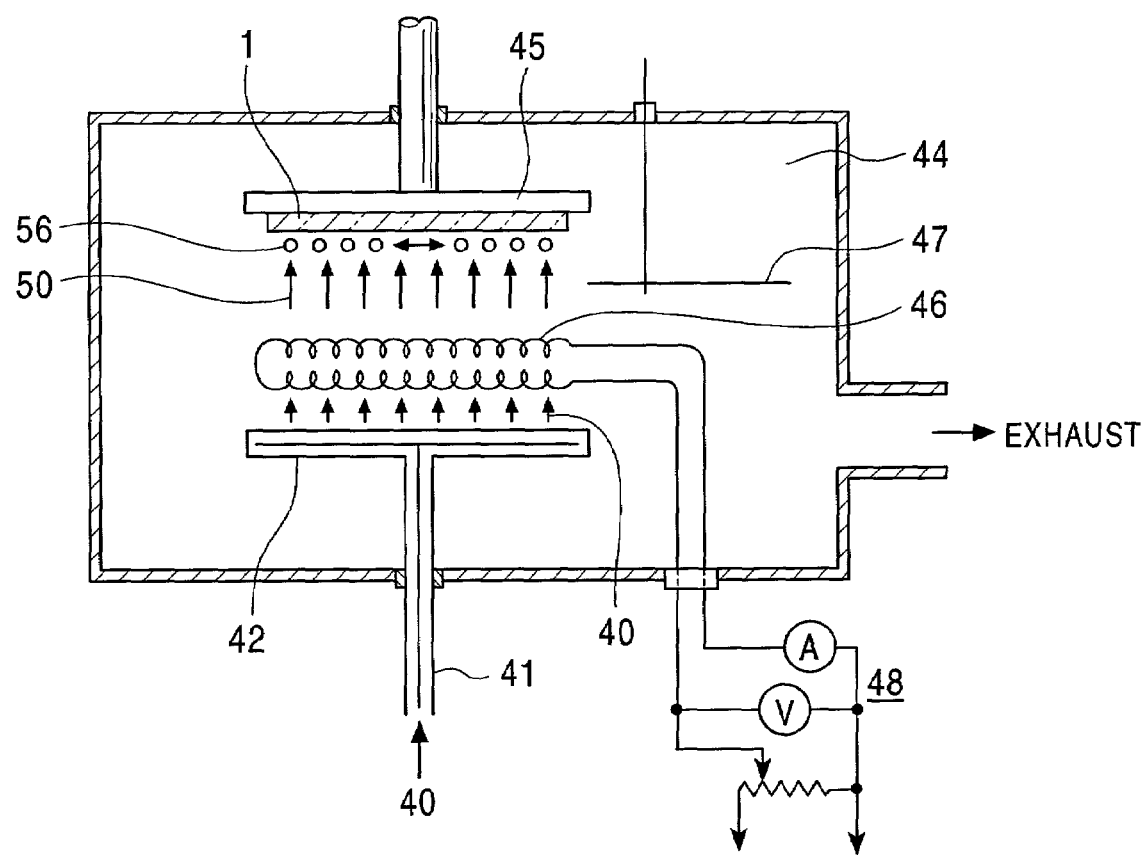
FIG. 3 is a cross-sectional view of the catalytic CVD apparatus used in the production, wherein the apparatus is in another state.

The catalytic CVD may be performed using an apparatus such as that shown in FIGS. 2 and 3.

In this apparatus, a hydrogen-based carrier gas and a source gas such as silicon hydride (for example, monosilane) 40 (and further a doping gas such as $B_2H_6$, $PH_3$, or SnH$_4$, if necessary) are supplied into a deposition chamber 44 from a gas supply pipe 41 via a gas supply opening (not shown) of a shower head 42. Inside the deposition chamber 44, there are disposed a susceptor 45 for supporting a substrate 1 made of glass or the like, the shower head 42 made of a heat resistant material (preferably having a melting point equal to or higher than that of a catalytic element 46), and a catalytic element 46 such as tungsten in the form of a coil. Furthermore, an open/close shutter 47 is disposed in the deposition chamber 44. Although not shown in the figures, a magnetic seal is provided between the susceptor 45 and the deposition chamber 44, and the deposition chamber 44 is connected to a front chamber for performing a pre-process. The deposition chamber 44 is evacuated by a turbo-molecular pump or the like via a valve.

The substrate 1 is heated by heating means such as a heater disposed in the susceptor 45. The catalytic element 46 is constructed in the form of a resistance wire so that it can be heated to a temperature lower than its melting point (800 to 2000° C. or 1600 to 1800° C. in the case of tungsten). Two terminals of the catalytic element 46 are connected to a DC or AC catalytic element power supply 48 such that the catalytic element 46 is heated to a predetermined temperature by a current supplied from the catalytic element power supply 48.

To perform a catalytic CVD process using the apparatus shown in FIG. 2, the inside of the deposition chamber 44 is first evacuated to a pressure of $1.33 \times 10^{-4}$ to $1.33 \times 10^{-6}$ Pa and then a hydrogen-based carrier gas is supplied at a flow rate of 100 to 200 SCCM. After heating the catalytic element to a predetermined temperature, a reaction gas 40 including silicon hydride (such as monosilane and further including, if necessary, a doping gas such as B$_2$H$_6$ or PH$_3$) is supplied at a flow rate of 1 to 20 SCCM into the deposition chamber 44 via the gas supply pipe 41 and further via the gas supply opening 43 of the shower head 42 such that the gas pressure is maintained at the range of 0.133 to 13.3 Pa (1.33 Pa, for example). The hydrogen-based carrier gas used herein may be a hydrogen gas or a mixture of a hydrogen gas and an inert gas, such as hydrogen+argon, hydrogen+helium, hydrogen+neon, hydrogen+xenon, and hydrogen+krypton. Such a hydrogen-based carrier gas may also be used in other embodiments that will be described later.

Thereafter, as shown in FIG. 3, the shutter 47 is opened. As a result, at least a part of the source gas 40 is brought into contact with the catalytic element 46 and is catalytically decomposed thereby creating reactive species such as high-energy silicon ions or radicals (that is, depositing species or precursor thereof and radical hydrogen ions). From the resultant species 50 in the form of ions or radicals having high energy, a desired film such as a microcrystalline silicon film containing amorphous silicon is formed by means of vapor phase deposition on the substrate 1 maintained at a temperature from 200 to 800° C. (more preferably 300 to 400° C.).

In this technique, as described above, because high energy is thermally given to the reactive species with the aid of catalysis provided by the catalytic element 46 without creating a plasma, the catalytic element 46 is efficiently converted to the reactive species and the film is uniformly deposited on the substrate 1 by thermal CVD.

Even when the substrate temperature is low, large energy of depositing species makes it possible to obtain a sufficiently good film quality. This allows a reduction in the substrate temperature, and thus it becomes possible to use a large-sized substrate made of an inexpensive insulating material (for example, glass such as borosilicate glass or aluminosilicate glass or a heat-resistant resin such as polyimide). This also allows a reduction in cost.

Furthermore, because no plasma is generated, no damage due to plasma occurs, and a low-stress film can be formed using an apparatus that is much simpler and much inexpensive than a plasma CVD apparatus.

In this technique, the process may be performed at either atmospheric pressure or a reduced pressure (for example, 0.133 to 1.33 Pa). An apparatus used to perform the process at atmospheric pressure can be constructed in a simpler form at lower cost than an apparatus for a reduced pressure. Besides, even when the process is performed at atmospheric pressure, it is possible to deposit a film that is superior in density, uniformity, and adherence to films formed using the conventional atmospheric-pressure CVD technique. Furthermore, the atmospheric-pressure process provides higher throughput and higher productivity than the reduced-pressure process, and thus a reduction in cost can be achieved.

In the catalytic CVD process described above, the substrate temperature increases due to the radiant heat from the catalytic element 46. If further heating is needed, a heater 51 for heating the substrate may be provided. Although only one catalytic element 46 in the form of a coil (the catalytic element 46 may also be in the form of a mesh, wire, or a perforated plate) is used, it is more desirable that plural (for example, two or three) stages of catalytic elements are disposed in the gas flow direction so that the gas can be brought into contact with the catalytic element over a greater area. In this CVD apparatus, because the substrate 1 is disposed on the lower surface of the susceptor 45 located above the shower head 42, it is possible to prevent undesirable particles created in the deposition chamber 44 from depositing on the substrate 1 or on a film formed on the substrate 1.

Focused-Light Annealing and Apparatus Therefor

FIGS. 4A to 4D illustrate, in simplified fashions, examples of apparatuses (annealers) for focused-light anneal. In the examples shown in FIGS. 4A and 4B, focused light is generated by a focused-light supply system including an ultra-high-pressure mercury lamp 203 or the like capable of emitting 10 kW of light with a main wavelength of 308 nm and the substrate 1 is continuously scanned by the focused light (in FIGS. 4A and 4D, reference numeral 204 denotes a focusing reflector, and reference numeral 201 denotes a focusing lens). An amorphous silicon or microcrystalline silicon film 7A on the substrate 1 is irradiated with the focused light with an energy density of 200 to 500 mJ/cm$^2$ in an inert gas ambient thereby melting or semi-melting the irradiated portion. The irradiating light 210 is moved at a proper speed across the substrate 1 fixed on a holder 202. Conversely, in the examples shown in FIGS. 4C and 4D, the substrate 1 is moved at a proper speed with respect to the fixed irradiating light 210 thereby moving the melted region of silicon. Thus, in this technique, the melted silicon region 7B is moved at a proper speed from a source region to a gate region and further to a drain region and the melted silicon region 7B is then self-cooled in the same order, thereby ensuring that so-called zone melting recrystallization (FIGS. 4A and 4D) occurs and a large-grain polycrystalline silicon film 7 is obtained.

In the above process, the catalytic element, which was incorporated in advance for enhancement of crystallization and which has finished its role, and other impurities are collected (segregated) into the melted (semi-melted) region of silicon, and they are expelled to the end portion of the substrate as the region illuminated with the focused light is moved. Thus, the catalytic element and the other impurities are removed (gettered) from the resultant polycrystalline silicon film. Thus, it is possible to obtain a large-grain polycrystalline silicon film 7 whose concentrations of the catalytic element and impurities have been reduced to a level equal to or lower than $1\times10^{15}$ atoms/cc. Furthermore, in the above process, the crystal grains of the polycrystalline silicon film are aligned in a direction in which the focused light is scanned. As a result, mismatching at crystal grain boundaries is minimized, and the resultant polycrystalline thin silicon film has a high mobility.

In the above process, melting or semi-melting and cooling of silicon may be successively repeated using a plurality of focused-light rays emitted from a plurality of lamps such that multiple zone melting recrystallization (FIGS. 4B and 4D) occurs. This allows achievement of still better crystal quality and enhancement of gettering of the catalytic element and other impurities and thus higher purity. In this multiple zone melting recrystallization, the crystal quality and the purity of the melted region (a) are improved by the melted region (b) and further by the melted region (c).

The light 210 emitted from the lamp 203 may be ultraviolet light, visible light, or infrared light, which may be selected depending on the substrate temperature in the MOSTFT production process and the grain size (carrier mobility) desired to be attained.

(1) For a glass substrate, it is desirable to use an ultraviolet lamp or a deep ultraviolet lamp that provides rather low heating. Specific examples of ultraviolet lamps include a high-pressure mercury lamp, an ultra-high-pressure mercury lamp, a high-pressure xenon-mercury lamp, and a xenon short-arc lamp. Specific examples of deep ultraviolet lamps include a low-pressure mercury lamp and a xenon-mercury lamp.

(2) For a heat resistant substrate such as a quartz glass substrate or a crystallized glass substrate, any type of lamp can be used. Specific examples of infrared lamps for this purpose include a halogen lamp, a xenon lamp, and an arc lamp. Specific examples of ultraviolet lamps for this purpose include a high-pressure mercury lamp, an ultrahigh-pressure mercury lamp, and a xenon short-arc lamp. Specific examples of deep ultraviolet lamps for this purpose include a low-pressure mercury lamp and a xenon-mercury lamp.

Whatever type of lamp is used in the annealing, light emitted from the lamp can be focused into the form of a line (with a size of, for example, (500 to 600 mm)×(1 to 100 µm)), a rectangle (with a size of, for example, (1 to 10 mm)×(200 to 300 mm), or a square (with a size of, for example, 100×100 mm). Focusing of light allows an increase in illumination intensity, and thus an increase in melting efficiency. Thus, high throughput can be obtained.

The heating/melting rate and the cooling rate may be controlled by controlling the speed at which the substrate or the focused light ray is moved in the range of, for example, 1 to 100 mm/min, so that the resultant polycrystalline silicon film has a desired grain side and desired purity.

The focused-light annealing conditions (such as the wavelength, the illumination intensity, and the illumination time) can be optimized depending on the thickness, the film quality, the glass heat resistance temperature, and the grain size (carrier mobility) of the low-crystal-quality silicon film in the form of, for example, amorphous.

During the focused-light annealing, it is desirable that hot air or inert gas (such as nitrogen gas) 205 at room temperature to 400° C. and more preferably at a temperature from 200 to 300° C. be blown against the front or back side or against both the front and back sides of the substrate via a nozzle 206, and, in addition to blowing the air or the inert gas, the substrate be heated by an infrared lamp (such as a halogen lamp) 207, such that the substrate has a uniform temperature distribution thereby allowing uniform crystallization of the film, a reduction in stress in the crystallized film and in the substrate, a reduction in illumination power needed for the focused-light annealing, and an achievement of cooling at a slower rate. Preferably, the illumination light 210 from the lamp and the hot air/gas 205 are synchronously applied from upper and lower symmetric positions.

Successive Processing of Catalytic CVD (or Plasma CVD) and Focused-Light Annealing In order to avoid contamination and also in order to improve productivity, means (such as plasma-enhanced CVD, analytic CVD, or sputtering) for forming a low-crystal-quality thin semiconductor film and focused-light annealing means are integrated in a single apparatus so that the step of forming a low-crystal-quality thin semiconductor film and the focused-light annealing step can be performed in an integrated fashion. More specifically, the apparatus is constructed in an in-line fashion (including continuous chambers of linear or rotary type), in a multiple chamber fashion, or a cluster fashion such that the above two steps can be performed continuously or successively.

Of above-described various types of the apparatus, the cluster type (1) or (2) described below is particularly preferable.

Figure 5:
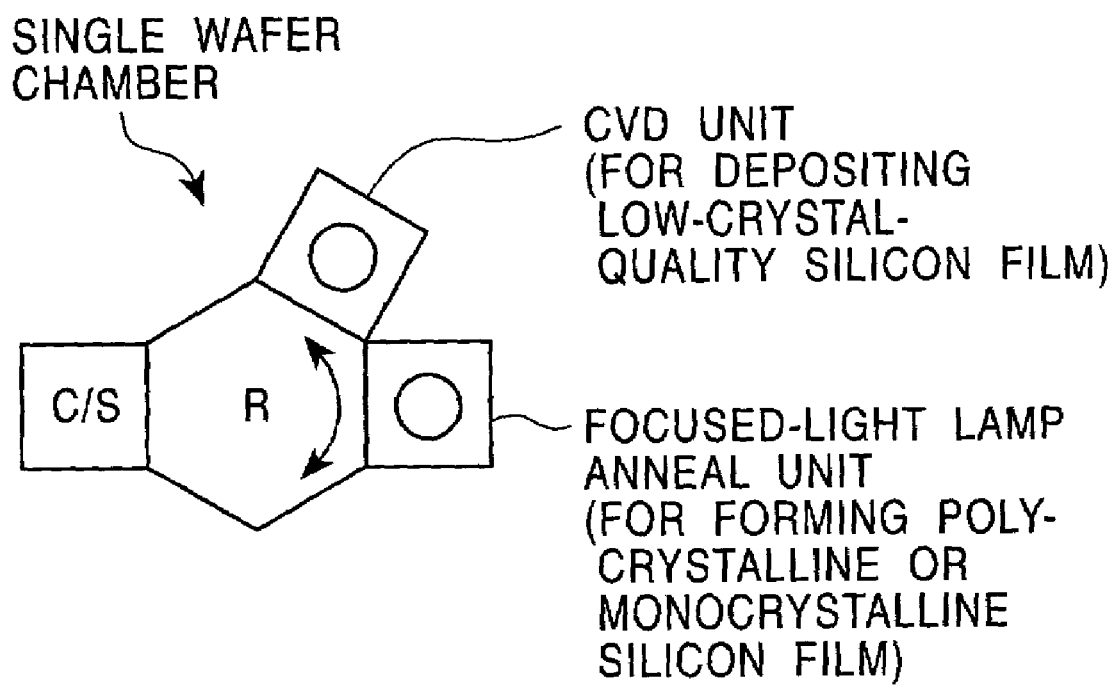
FIG. 5 is a diagram illustrating a cluster-type apparatus for producing a MOSTFT.

(1) A first cluster-type integrated apparatus includes, as shown in FIG. 5, a CVD unit and an annealing unit. First, in a CVD unit, a low-crystal-quality thin semiconductor film is formed on a substrate. Thereafter, in the annealing unit, the film is crystallized by means of focused-light annealing. The substrate is then returned into the CVD unit, and another low-crystal-quality thin semiconductor film is formed. The substrate is then transferred again into the annealing unit and crystallization is performed by means of focused-light annealing. The above-described steps are performed repeatedly as many times as required. The apparatus may also be constructed in an in-line fashion as shown in FIG. 6A.

(2) A second cluster-type integrated apparatus includes, as shown in FIG. 7, first, second and third CVD units, an ion doping/implantation unit, and an annealing unit. First, in the first CVD unit, an underlying protective film (such as a silicon oxide/silicon nitride film) is formed on a substrate, and then, in the second CVD unit, a low-crystal-quality thin semiconductor film is formed. Thereafter, in the ion doping/implantation unit, a proper amount of group IV element is incorporated. Crystallization is then performed in the annealing unit by means of focused-light annealing. Furthermore, in the third CVD unit, a gate insulating film (such as a silicon oxide film) is formed. The above-described steps are performed successively. The apparatus may also be constructed in an in-line fashion as shown in FIG. 6B.

The silicon oxide/silicon nitride film or the like formed in the first CVD unit may be an underlying protective film of a top-gate MOSTFT or a bottom-gate insulating film, which also servers as a protective film, of a bottom-gate MOSTFT. The silicon oxide/silicon nitride film or the like formed in the third CVD unit may be a gate insulating film of a top-gate MOSTFT or a protective film of a bottom-gate MOSTFT.

The CVD units may be a catalytic CVD unit, a plasma-enhanced CVD unit, or the like. Instead, a sputtering unit may be employed. In the case where a film is deposited by means of CVD, it is preferable to perform a plasma treatment or a catalytic AHA treatment before the deposition. For example, before depositing a film by means of plasma-enhanced CVD, only a hydrogen-based carrier gas is supplied into the CVD chamber without supplying a source gas, and the plasma AHA treatment is performed such that the surface of a polycrystalline silicon film that has already been formed is exposed to created hydrogen-based active species (such as activated hydrogen ions) thereby removing contamination (low-quality oxide film, water, oxygen, nitrogen, carbon oxide, etc.) from the surface and thus cleaning the surface. Furthermore, in the plasma AHA treatment, residual amorphous silicon in the film is etched, and the film is converted into a higher-crystallinity polycrystalline silicon film. This underlying layer having the cleaned surface provides a seed for crystallization when next-time focused-light annealing is performed after depositing a low-crystal-quality silicon film on this underlying layer, and thus it becomes possible to obtain a higher-quality larger-grain polycrystalline or monocrystalline semiconductor film.

To prevent oxidization and nitrization, it is desirable that the focused-light annealing be performed in an ambient of reduced-pressure hydrogen or a gas containing reduced-pressure hydrogen or in a vacuum. More specifically, the ambient used in the focused-light annealing may be hydrogen or a mixture of hydrogen and an inert gas (such as argon, helium, krypton, xenon, neon, or radon), and the preferable gas pressure is 1.33 Pa to atmospheric pressure and more preferable gas pressure is 133 Pa to $4 \times 10^4$ Pa. In the case of vacuum, the preferable pressure is 1.33 Pa to atmospheric pressure, and more preferable pressure is 13.3 Pa to $1.33 \times 10^4$ Pa. In the case where the low-crystal-quality thin semiconductor film is covered with a protective insulating film (such as a silicon oxide film, a silicon nitride film, a silicon oxide nitride film, or a silicon oxide/silicon nitride film), or in the case where it is not needed to perform processing steps immediately successively, the focused-light annealing may be performed in the air or atmospheric-pressure nitrogen.

Because the catalytic CVD and the focused-light annealing can be performed without causing generation of a plasma, no damage due to plasma occurs, and a low-stress film can be formed. Besides, the apparatus used is simpler and more inexpensive than a plasma CVD apparatus.

As shown in FIG. 8, if the focused-light annealing is performed after covering the surface of the low-crystal-quality thin semiconductor film 7A with a protective insulating film 235 such as a silicon oxide film, a silicon nitride film, a silicon oxide nitride film, or a silicon oxide/silicon nitride film, the thin polycrystalline silicon film 7 is formed in a highly-reliable fashion. However, if no protective insulating film is used, melted silicon can spill, or surface tension can cause silicon grains to remain, or in some cases, no polycrystalline silicon film is formed.

During the crystallization of the low-crystal-quality thin semiconductor film by means of the focused-light annealing, a magnetic or electric field or both a magnetic field and an electric field may be applied so that crystal grains are aligned in a desired crystal orientation.

Figure 9A:
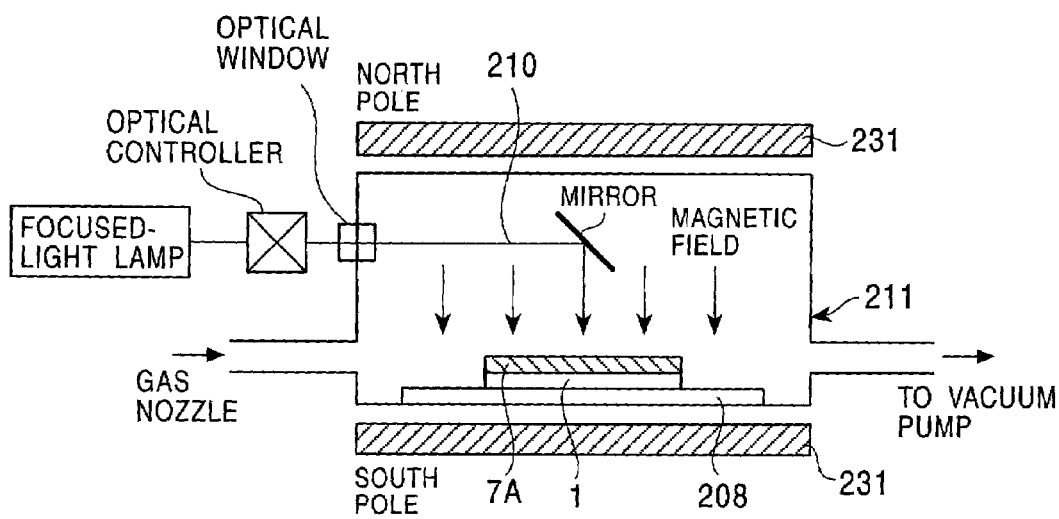
FIGS. 9A to 9D are diagrams illustrating examples of focused-light annealing apparatuses.
Figure 9B:
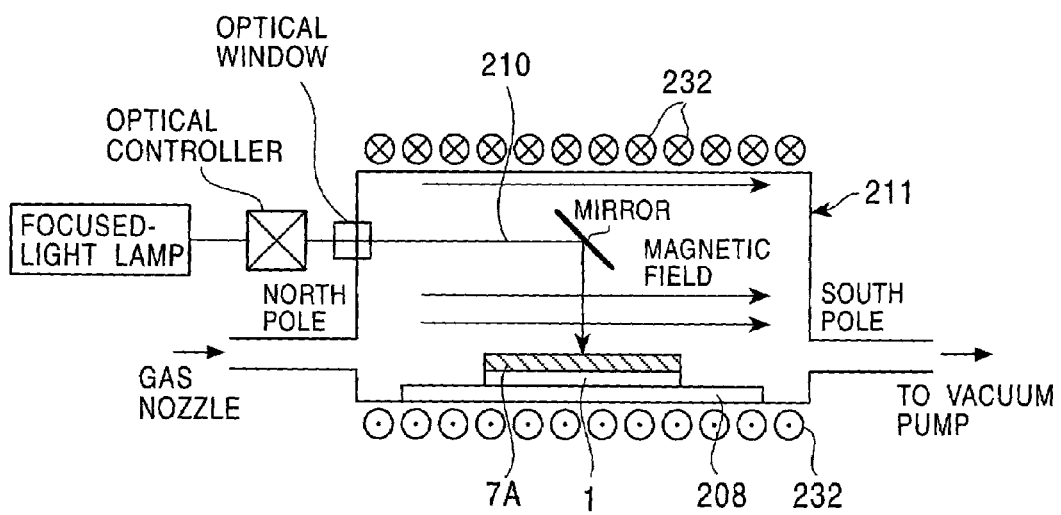

The magnetic field may be applied, for example, as shown in FIG. 9A or 9B. That is, light emitted from a focused-light source including a lamp 203, a reflector 204, and a lens 201 is directed via an optical controller and an optical window into a vacuum chamber 211 in which a substrate 1 is placed (light may be directed in a similar manner in other types of apparatuses that will be described later), and focused-light annealing is performed under application of a magnetic field from a permanent magnet 231 or an electromagnet 232 disposed around the vacuum chamber 211.

In this annealing process under application of the magnetic field, interaction occurs between the magnetic field and electron spins of silicon atoms in a melted region of the low-crystal-quality thin silicon film 7A, and the silicon atoms are aligned in a particular direction. When the melted region is cooled and solidified, the region is crystallized into the particular direction. In a film crystallized such that the crystal orientations of grains are substantially aligned into a particular direction, the electron potential barrier at the grain boundaries becomes low, and thus a high carrier mobility can be obtained. In the above process, what is of essential importance is that the crystal orientation is aligned in a particular direction, and it is not important which direction the crystal orientation is aligned. The crystal orientation is aligned in a direction normal to the resultant polycrystalline thin silicon film 7 or in a direction parallel with the film, depending on the outer shell structure of silicon atoms. The alignment of crystal grains results in elimination of irregularities of the surface of the polycrystalline thin silicon film. The resultant flat surface of the thin film results in a good interfacial state between the thin film and a gate insulating film or the like formed thereon, and thus the carrier mobility is improved.

Figure 9C:
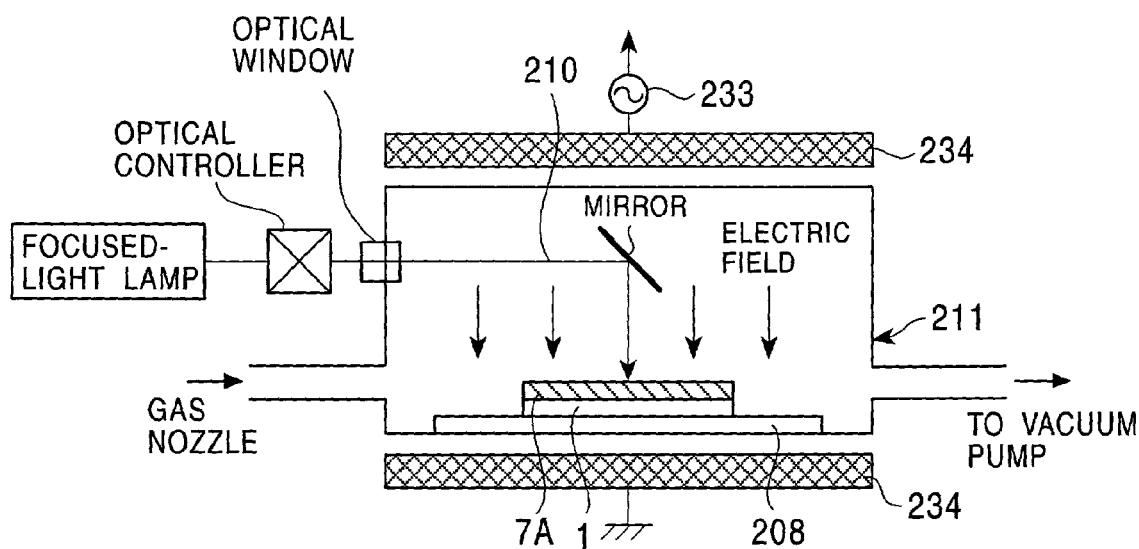

In the example shown in FIG. 9C, instead of the magnetic field, an electric field is applied by a power supply 233. An electrode 234 is disposed around a vacuum chamber 211 in which a substrate 1 is placed, and a high-frequency voltage (or a DC voltage or both a high-frequency voltage and a DC voltage) is applied to the electrode so that focused-light annealing is performed under application of the electric field.

In this annealing process, as a result of interaction between the electric field and electron spins of silicon atoms in a melted region of the low-crystal-quality thin silicon film 7A, the silicon atoms are aligned in a particular direction. When the melted region is cooled and solidified, the region is crystallized while maintaining the orientation in the particular direction. Thus, as in the case where the magnetic field is applied, the crystal grains are aligned in the particular direction, and thus an improvement in the carrier mobility is achieved. Besides, irregularities on the film surface are reduced. Another advantage of this technique is that a high illumination efficiency is obtained when the substrate 1 is illuminated with the light 210 emitted from the lamp.

Figure 9D:
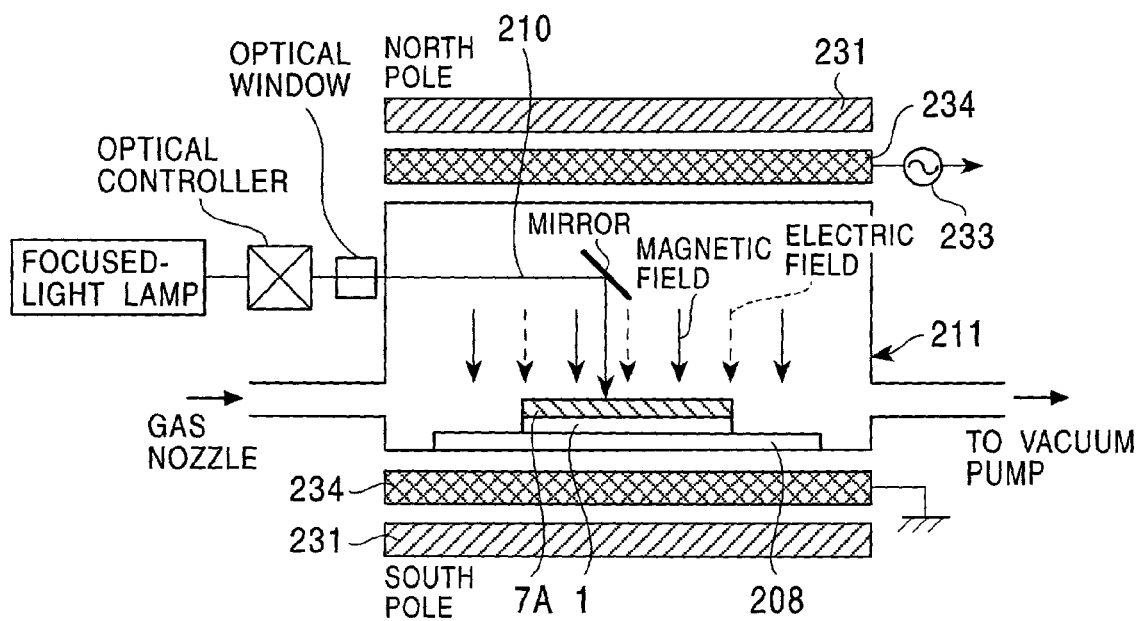

In the example shown in FIG. 9D, a magnetic field and an electric field are simultaneously applied. A permanent magnet (or electromagnet) 231 for generating a magnetic field and an electrode 234 for generating a high-frequency voltage (or a DC voltage or both a high-frequency voltage and a DC voltage) are disposed around a vacuum chamber 211 in which a substrate 1 is placed, whereby focused-light annealing is performed under application of the magnetic field and the electric field.

In this annealing process, interaction occurs between the magnetic and electric fields and electron spins of silicon atoms in a melted region of the low-crystal-quality thin silicon film 7A, and the silicon atoms are aligned in a particular direction. When the melted region is cooled and solidified, the region is crystallized into the particular direction. This results further enhancement in the alignment of the crystal grains into the particular direction, and thus a further improvement in the carrier mobility is achieved. Besides, irregularities on the film surface are further reduced. Another advantage of this technique is that a high illumination efficiency is obtained when the substrate 1 is illuminated with the light 210 emitted from the lamp.

Production of Top-Gate CMOSTFT

An example of a sequence of processing steps of producing a top-gate CMOSTFT using focused-light annealing according to the present embodiment of the invention is described below.

First, as shown in FIG. 1A, an underlying protective film 100 having a multilayer structure of a silicon nitride layer and a silicon oxide layer is formed, by means of vapor phase deposition such as plasma-enhanced CVD, catalytic CVD, or reduced-pressure CVD, on an insulating substrate 1 made of borosilicate glass, aluminosilicate glass, quartz, or crystallized glass, wherein the underlying protective film 100 is formed at least in an area where a TFT is to be formed. The formation of the underlying protective film 100 may be performed as follows.

The insulating substrate 1 used herein is made of a glass material properly selected depending on the temperate at which processing for producing the TFT is performed.

In the case where the processing temperature is in the range from 200 to 500° C., a glass substrate made of borosilicate glass or aluminosilicate glass or a heat-resistant resin substrate (with a size of 500×600×0.5 to 1.1 µm (in thickness)) may be employed as the insulating substrate 1.

In the case where the processing temperatures is in the range from 600 to 1000° C., a heat-resistance glass substrate made of quartz or crystallized glass (with a size of 6 to 12 inches in diameter and 700 to 800 µm in thickness) may be employed. The protective nitride film serves as a Na blocking layer for preventing the film to be formed from being contaminated with Na ions from the glass substrate. In the case where a synthetic quartz substrate is used, the protective nitride film is not necessary.

In the case where the catalytic CVD process is used, an apparatus similar to that shown in FIGS. 2 and 3 may be employed. To prevent the catalytic element from being oxidized, it is required that a hydrogen-based carrier gas be supplied into the apparatus before heating the catalytic element to a predetermined temperature (in the range of 1600° C. to 1800° C. and more specifically at 1700° C.), and, after completion of depositing the film, the supply of the hydrogen-based carrier gas be stopped after cooling the catalytic element to a sufficiently low temperature.

When the film is deposited, the hydrogen-based carrier gas (such as hydrogen, argon+hydrogen, helium+hydrogen, or neon+hydrogen) is supplied into the chamber over the whole processing period, and the gas pressure, the gas flow rate, and the susceptor temperature are controlled as follows:

Gas pressure inside the chamber: 0.1 to 10 Pa (1 Pa, for example)

Susceptor temperature: 350° C.

Flow rate of the hydrogen-based carrier gas: 100 to 200 SCCM (in the case where a mixed gas is used, the concentration of hydrogen is set to, for example, 80 to 90 mol %)

The silicon nitride film is formed so as to have a thickness of 50 to 200 nm under the following conditions:

$H_2$ is used as the carrier gas, and a mixture of monosilane ($SiH_4$) and ammonium ($NH_3$) in a proper ratio is used as the source gas.

Flow rate of $H_2$: 100 to 200 SCCM
Flow rate of $SiH_4$: 1 to 2 SCCM
Flow rate of $NH_3$: 3 to 5 SCCM The silicon oxide film is formed so as to have a thickness of 50 to 200 nm under the following conditions:

$H_2$ is used as the carrier gas, and a mixture of monosilane ($SiH_4$) and $O_2$ diluted with He in a proper ratio is used as the source gas.

Flow rate of $H_2$: 100 to 200 SCCM
Flow rate of $SiH_4$: 1 to 2 SCCM
Flow rate of $O_2$ diluted with He: 0.1 to 1 SCCM In the case where the film is formed by means of RF plasma CVD, the following conditions may be employed:

Conditions for formation of the silicon oxide film are:
Flow rate of $SiH_4$: 5 to 10 SCCM
Flow rate of $N_2O$: 1000 SCCM
Gas pressure: 50 to 70 Pa
RF power: 1000 W
Substrate temperature: 350° C.

Conditions for formation of a silicon nitride film are:

Flow rate of $SiH_4$: 50 to 100 SCCM
Flow rate of $NH_3$: 200 to 250 SCCM
Flow rate of $N_2$: 700 to 1000 SCCM
Gas pressure: 50 to 70 Pa
RF power: 1300W
Substrate temperature: 250° C.

Figure 1B:
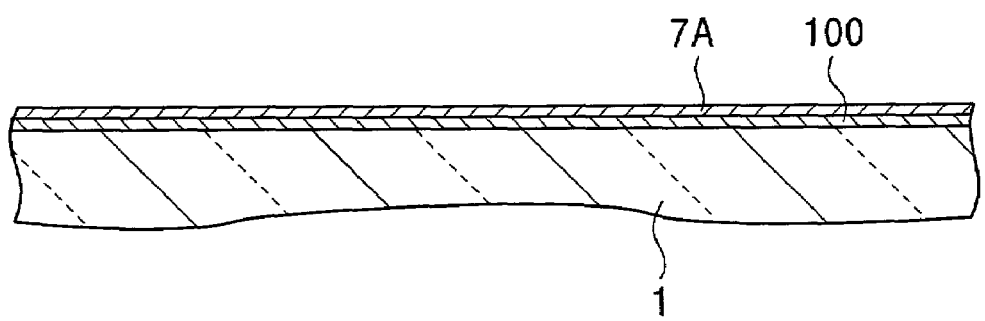

Thereafter, as shown in FIG. 1B, a low crystal quality silicon film 7A having a thickness of 50 nm and doped with, for example, a group IV element such as tin to a concentration of $10^{18}$ to $10^{20}$ atoms/cc is formed by means of catalytic CVD or plasma-enhanced CVD (wherein the doping may be performed during the CVD process or may be performed by means ion implantation after forming the film.) Note that the doping of tin is not necessarily needed (this is also true in other examples described later). Immediately thereafter, a silicon oxide film serving as a protective film and a reflection reduction film is formed to a thickness of 10 to 30 nm.

The silicon oxide film may be formed using the apparatus shown in FIG. 2 or 3 such that a low-crystal-quality thin silicon film doped with, for example, tin or nickel is deposited by means of catalytic CVD. In the case where nickel is doped, doping may be performed by means of ion implantation or ion doping after depositing the thin film. On the other hand, doping of tin may be performed by supplying a gas described below during the deposition of the thin film.

Deposition of microcrystalline silicon containing amorphous silicon by means of analytic CVD may be performed using $H_2$ as a carrier gas and using a mixture, in a proper ratio, of mono silane ($SiH_4$) and tin hydride ($SnH_4$) under the following conditions:

Flow rate of $H_2$: 150 SCCM
Flow rate of $SiH_4$: 15 SCCM
Flow rate of $SnH_4$: 15 SCCM In the above process, if a proper amount of n-type impurity such as phosphorus, arsenic, or antimony or a p-type impurity such as boron is mixed in a silane-based gas (such as silane, disilane, or trisilane) of the source gas, a tin-doped silicon film having a desired n-type or p-type carrier concentration can be obtained.

More specifically, the n-type impurity may be provided by using $PH_3$ (phosphine), $ASH_3$ (arsine), or $SbH_3$ (stibine), and the p-type impurity may be provided by using $B_2H_6$ (diborane).

In the case where the above films are formed in the same single chamber, the hydrogen-based carrier gas is always supplied into the chamber, and, after heating the catalytic element to a predetermined proper temperature, the deposition process may be performed as follows.

First, a silicon nitride film with a desired thickness is formed using monosilane and ammonia mixed in a proper ratio. After completion of the process of forming the silicon nitride film, the source gas used in this process is exhausted, and a silicon oxide film with a desired thickness is formed using monosilane and He-diluted $O_2$ mixed in a proper ratio. After completion of the process of forming the silicon oxide film, the source gas used in this process is exhausted, and a tin-doped microcrystalline silicon film containing amorphous silicon with a desired thickness is formed using monosilane and $SnH_4$ mixed in a proper ratio. After completion of the process of forming the tin-doped microcrystalline silicon film, the source gas used in this process is exhausted, and a silicon oxide film with a desired thickness is formed using monosilane and He-diluted $O_2$ mixed in a proper ratio. After completion of forming the films, the catalytic element is cooled to a sufficiently low temperature. Thereafter, supply of the hydrogen-based carrier gas is stopped. In the above process, the flow rate of the source gas for forming an insulating film may be gradually reduced or increased so that the composition of the resultant film gradually changes.

In the case where the respective films are formed in different chambers, the hydrogen-based carrier gas is always supplied into the respective chambers, and, after heating the catalytic element to a predetermined proper temperature, the deposition process may be performed as follows. The substrate is placed in a first chamber, and a silicon nitride film with a desired thickness is formed using monosilane and ammonia mixed in a proper ratio. Thereafter, the substrate is transferred into a second chamber, and a silicon oxide film is formed using monosilane and He-diluted $O_2$ mixed in a proper ratio. The substrate is then transferred into a third chamber, and a tin-doped microcrystalline silicon film containing amorphous silicon is formed using monosilane and $SnH_4$ mixed in a proper ratio. Thereafter, the substrate is again transferred into the second chamber, and a silicon oxide film is formed using monosilane and He-diluted $O_2$ mixed in a proper ratio. After completion of forming the films, the catalytic element is cooled to a sufficiently low temperature. Thereafter, supply of the hydrogen-based carrier gas is stopped. Instead, the hydrogen-based carrier gas and the respective source gases may be continuously supplied without being turned off such that the standby state is maintained.

In the case where a low-crystal-quality silicon film is formed by means of RF plasma CVD, the formation of the film may be performed under the following conditions:
Flow rate of $SiH_4$: 100 SCCM
Flow rate of $H_2$: 100 SCCM
Gas pressure: $1.33 \times 10^4$ Pa
RF power: 100 W
Substrate temperature: 350° C.

Figure 1C:
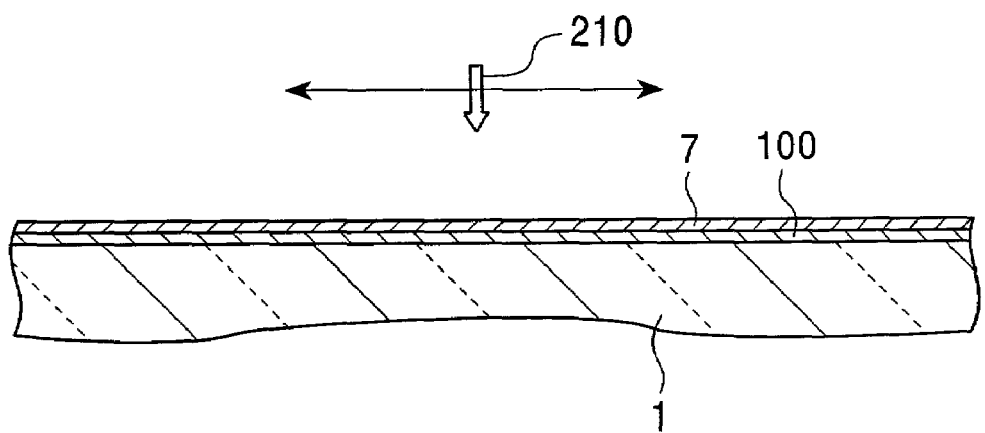
Figure 4A:
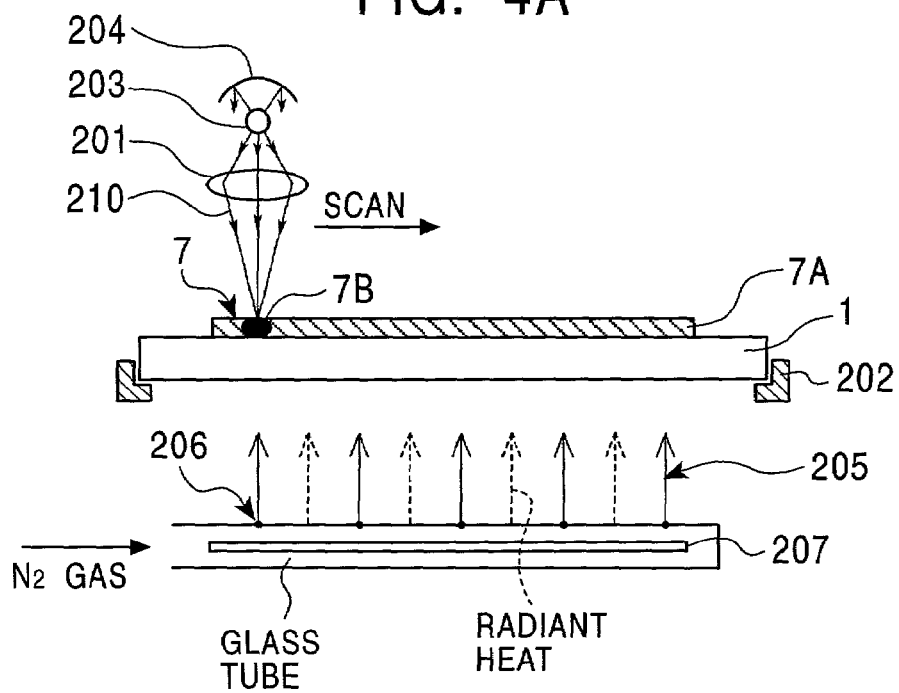
FIG. 4A is a diagram illustrating a focused-light annealing apparatus.
Figure 4B:
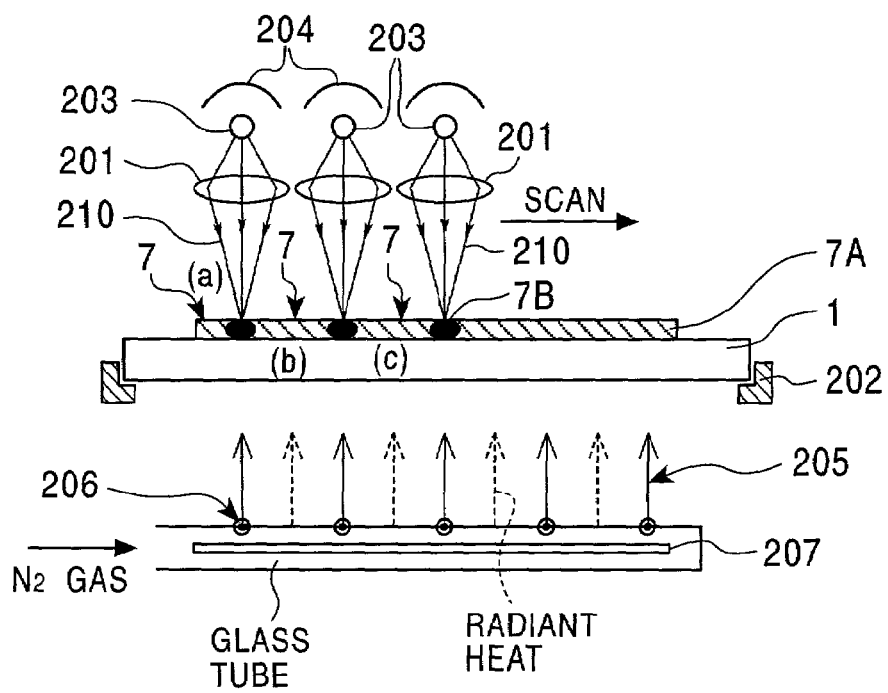
FIG. 4B is a diagram illustrating another type of focused-light annealing apparatus.
Figure 4C:
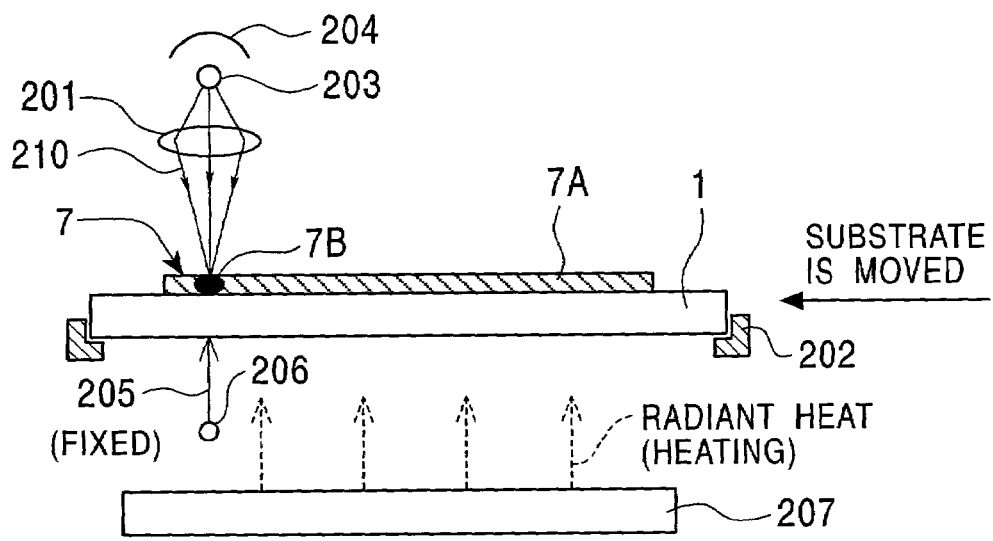
FIG. 4C is a diagram illustrating still another type of focused-light annealing apparatus.
Figure 4D:
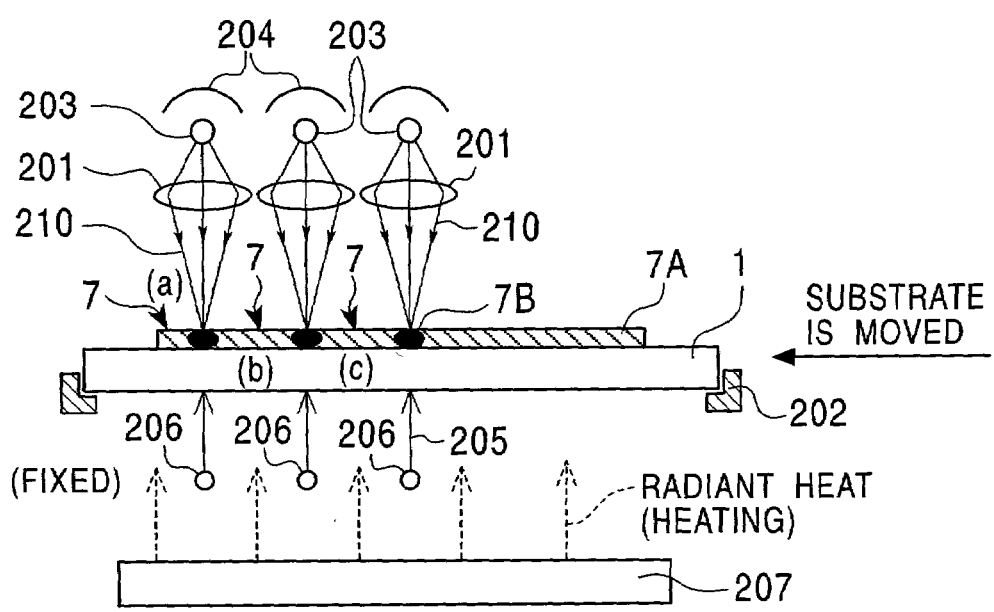
FIG. 4D is a diagram illustrating still another type of focused-light annealing apparatus.

Thereafter, as shown in FIG. 1C, the microcrystalline or amorphous silicon film 7A is converted into a large-grain polycrystalline silicon film 7 by performing focused-light annealing such that, as shown in FIG. 4A or 4B, in an ambient of an inert gas (such as nitrogen), the microcrystalline/amorphous silicon film 7A is illuminated with focused light 210 with energy density of 200 to 500 mJ/cm$^2$ continuously emitted from a focused-light source including an ultra-high-pressure mercury lamp 203 capable of outputting 10 kW light with a main wavelength of 308 nm so as to melt or semi-melt an illuminated region of the microcrystalline/amorphous silicon film 7A while moving the melted or semi-melted by moving the focused light at a proper speed with respect to the substrate 1 maintained at a fixed location (or by moving the substrate 1 with respect to the focused light 210 maintained at a fixed location), thereby successively melting or semi-melting a source region, a gate region and a drain region and then successively self-cooling the source region, the gate region and the drain region. Via this annealing process, zone melting recrystallization occurs, and the microcrystalline/amorphous silicon film 7A is converted into a large-grain polycrystalline film 7. In the above process, the catalytic element, which was incorporated for enhancement of crystallization and which has finished its role, and other impurities are collected (segregated) into the melted (semi-melted) region of silicon, and thus a large-grain polycrystalline silicon film 7 is formed whose concentrations of the catalytic element and impurities have been reduced to a level equal to or lower than $1 \times 1 \times 10^{15}$ atoms/cc.

In the above process, melting or semi-melting and cooling of silicon may be successively repeated using a plurality of focused-light rays emitted from a plurality of lamps such that multiple zone melting recrystallization occurs. This allows achievement of still better crystal quality and enhancement of gettering of the catalytic element and other impurities and thus higher purity.

The light emitted from the lamp 203 may be ultraviolet light, visible light, or infrared light, which may be selected depending on the substrate temperature in the MOSTFT production process and the grain size (carrier mobility) desired to be attained.

(1) For a glass substrate, it is desirable to use an ultraviolet lamp or a deep ultraviolet lamp that provides rather low heating. Specific examples of ultraviolet lamps include a high-pressure mercury lamp, an ultra-high-pressure mercury lamp, a high-pressure xenon-mercury lamp, and a xenon short-arc lamp. Specific examples of deep ultraviolet lamps include a low-pressure mercury lamp and a xenon-mercury lamp.

(2) For a heat resistant substrate such as a quartz glass substrate or a crystallized glass substrate, any type of lamp can be used. Specific examples of infrared lamps for this purpose include a halogen lamp, a xenon lamp, and an arc lamp. Specific examples of ultraviolet lamps for this purpose include a high-pressure mercury lamp, an ultrahigh-pressure mercury lamp, and a xenon short-arc lamp. Specific examples of deep ultraviolet lamps for this purpose include a low-pressure mercury lamp and a xenon-mercury lamp.

Whatever type of lamp is used in the annealing, light emitted from the lamp can be focused into the form of a line (with a size of, for example, (500 to 600 mm)×(1 to 100 µm)), a rectangle (with a size of, for example, (1 to 10 mm)×(200 to 300 mm), or a square (with a size of, for example, 100×100 mm). Focusing of light allows an increase in illumination intensity, and thus an increase in melting efficiency. Thus, high throughput can be obtained. The heating/melting rate and the cooling rate may be controlled by controlling the speed at which the substrate or the focused light ray is moved in the range of, for example, 1 to 100 mm/min, so that the resultant polycrystalline silicon film has a desired grain side and desired purity.

The focused-light annealing conditions (such as the wavelength, the illumination intensity, and the illumination time) can be optimized depending on the thickness, the film quality, the glass heat resistance temperature, and the grain size (carrier mobility) of the low-crystal-quality silicon film. During the focused-light annealing, it is desirable that hot air or inert gas (such as nitrogen gas) at room temperature to 400° C. and more preferably at a temperature from 200 to 300° C. be blown against the front or back side or against both the front and back sides of the substrate, and, in addition to blowing the air or the inert gas, the substrate be heated by an infrared lamp (such as a halogen lamp), such that the substrate has a uniform temperature distribution thereby allowing uniform crystallization of the film, a reduction in stress in the crystallized film and in the substrate, a reduction in illumination power needed for the focused-light annealing, and an achievement of cooling at a slower rate.

It is preferable that, before performing the focused-light annealing process, the film 7A be doped with catalytic metal (such as nickel) by means of ion implantation, ion doping, or the like to a concentration equal to smaller than $10^{20}$ atoms/cc and more specifically in the range of $1 \times 10^{18}$ to $1 \times 10^{20}$ atoms/cc. It is also preferable that the focused-light annealing be performed after covering the surface of the low-crystal-quality silicon film with a protective film such as a silicon oxide film, silicon nitride film, silicon oxide nitride film, or a multilayer film of silicon oxide/silicon nitride, thereby preventing melted silicon from being splashed during the annealing process and preventing a silicon grain from being created by surface tension that would otherwise present, and thus obtaining a high-quality monocrystalline silicon film.

In order to suppress an increase in the substrate temperature and to enhance crystallization, it is preferable to perform focused-light annealing after patterning, into islands, the low-crystal-quality silicon film that may or may not be covered with the protective silicon oxide film thereby obtaining a high-quality polycrystalline silicon film.

If focused-light annealing is performed under adequate conditions after forming a gate channel region, a source region, and a drain region, which will be described later, not only crystallization but also activation of an n-type or p-type impurity (such as phosphorus, arsenic, or boron) occurs at the same time, and thus high productivity is achieved.

Thereafter, a MOSTFT including a source region, a channel region, and a drain region formed of the polycrystalline silicon film 7 is produced.

Figure 1D:
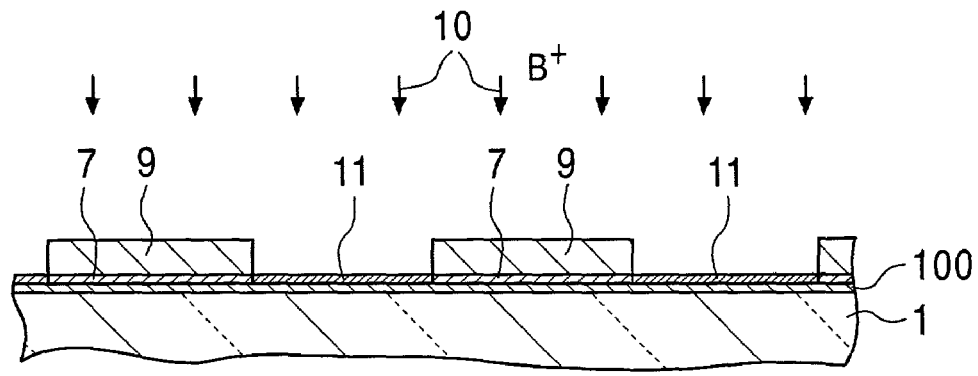

That is, as shown in FIG. 1D, the silicon oxide film serving as the protective film and as the reflection reducing film is removed by means of a photolithographic process and an etching process that are well known in the art, and, thereafter, the polycrystalline silicon film 7 is patterned into islands. Thereafter, in order to adjust the impurity concentration of the channel region of the nMOSTFT so as to adjust its threshold value ($V_{th}$) to an optimum value, the pMOSTFT area is covered with a photoresist 9, and a p-type impurity (such as boron ions) 10 is doped at a dose of, for example, $5 \times 10^{11}$ atoms/cm$^2$ by means of ion implantation or ion doping such that the acceptor concentration of the channel region of the nMOSTFT becomes $1 \times 10^{17}$ atoms/cc. Thus, the conduction type of the doped region of the polycrystalline silicon film 7 is converted, and a p-type polycrystalline film 11 is obtained.

Figure 1E:
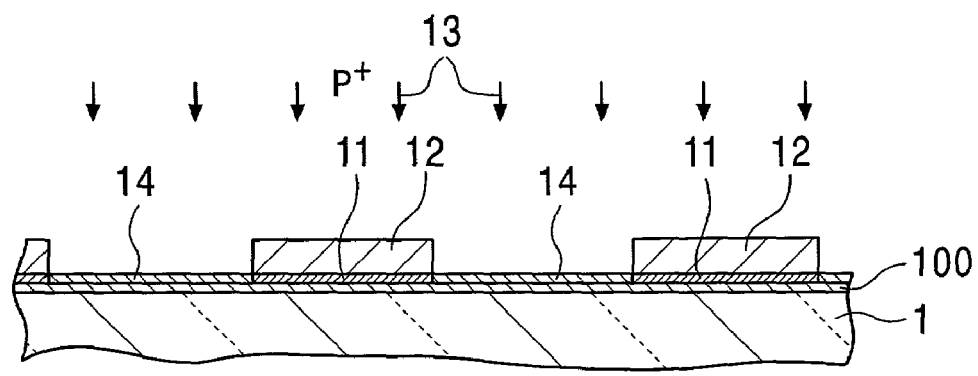

Thereafter, as shown in FIG. 1E, in order to adjust the impurity concentration of the channel region of the pMOSTFT so as to adjust its threshold value ($V_{th}$) to an optimum value, the nMOSTFT area is covered with a photoresist 12, and an n-type impurity (such as phosphorus ions) 13 is doped at a dose of, for example, $1 \times 10^{12}$ atoms/cm$^2$ by means of ion implantation or ion doping such that the donor concentration of the channel region of the pMOSTFT becomes $2 \times 10^{17}$ atoms/cc. Thus, the conduction type of the doped region of the polycrystalline silicon film 7 is converted, and an n-type polycrystalline film 14 is obtained.

Figure 1F:
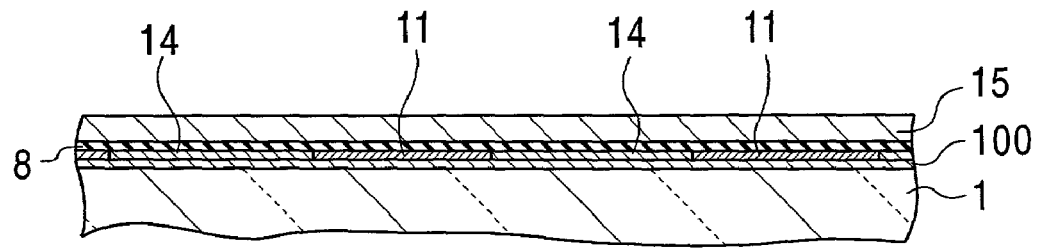

Thereafter, as shown in FIG. 1F, a silicon oxide film 8 with a thickness of 50 nm serving as a gate insulating film is formed by means of catalytic CVD or the like. Thereafter, a phosphorus-doped polycrystalline film 15 serving as a gate electrode material with a thickness of, for example, 400 nm is deposited by means of catalytic CVD using PH$_3$ supplied at a flow rate of 2 to 20 SCCM and SiH$_4$ supplied at a flow rate of 20 SCCM and 20.

Figure 1G:
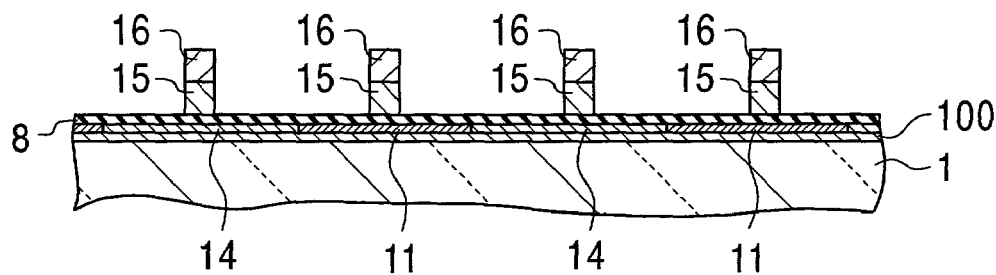
Figure 1H:
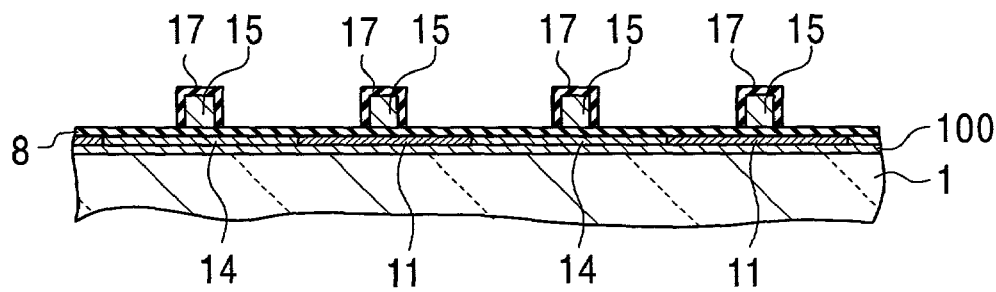

Thereafter, as shown in FIG. 1G, a photoresist 16 having a predetermined pattern is formed, and the phosphorus-doped polycrystalline silicon film 15 is patterned, using the photoresist 16 as a patterning mask, into a gate electrode pattern. After removing the photoresist 16, a silicon oxide film 17 with a thickness of 20 nm is formed by means of catalytic CVD or the like as shown in FIG. 1H.

Figure 1I:
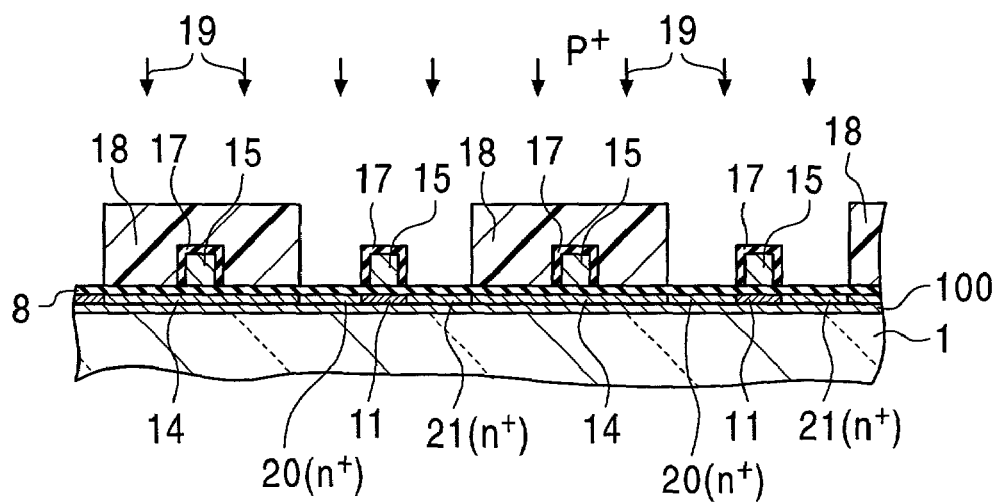

Thereafter, as shown in FIG. 1I, the pMOSTFT area is covered with a photoresist 18, and an n-type impurity 19 such as phosphorus ions is doped by means of ion implantation or ion doping at a dose of, for example, $1 \times 10^{15}$ atoms/cm$^2$, thereby forming an n$^+$-type source region 20 and drain region 21 of an nMOSTFT such that the resultant source and drain regions have a donor concentration of $2 \times 10^{20}$ atoms/cc.

Figure 1J:
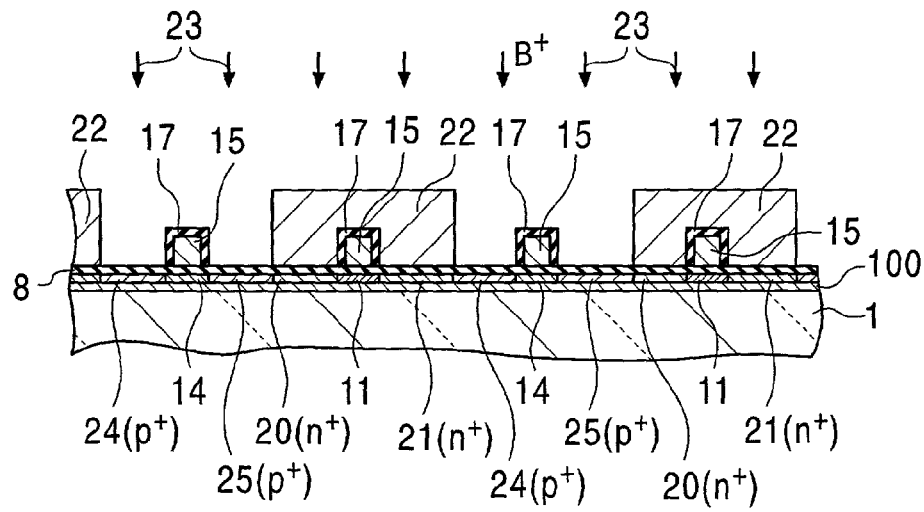

Thereafter, as shown in FIG. 1J, the nMOSTFT area is covered with a photoresist 22, and a p-type impurity 23 such as boron ions is doped by means of ion implantation or ion doping at a dose of, for example, $1 \times 10^{15}$ atoms/cm$^2$, thereby forming a p$^+$-type source region 24 and drain region 25 of a pMOSTFT such that the resultant source and drain regions have an acceptor concentration of $2 \times 10^{20}$ atoms/cc. Annealing is then performed for 5 min at about 900° C. in a nitrogen ambient thereby activating the impurity ions doped in the respective regions so that the respective regions have desired impurity (carrier) concentrations.

Thus, the gate, the source, and the drain are formed via the above-described process. Note that they may be formed using another process.

That is, for example, after completion of the step shown in FIG. 1B, the polycrystalline silicon film 7 is patterned into islands where a pMOSTFT and an nMOSTFT are to be formed. This can be accomplished using a photolithographic process and an etching process that are well known in the art such that the silicon oxide film serving as the protective film and also as the reflection reducing film is removed using a hydrofluoric acid-based etchant, the microcrystalline silicon film containing amorphous silicon is selectively removed by means of plasma etching using CF$_4$, SF$_6$, or the like, and finally a photoresist is removed and cleaned using an organic solvent or the like. In the focused-light annealing performed thereafter, a rapid increase in temperature occurs as a result of illumination of the focused light that is applied in order to melt silicon, and a stress is induced when silicon is cooled. Thus, there is a possibility that a crack is generated in the polycrystalline silicon film when being heated and cooled. The patterning into islands makes an important contribution to suppression of the increase in the substrate temperature. That is, the patterning into islands performed before the focused-light annealing results in a reduction in heat dissipation that causes the melted silicon region to be cooled at a lower rate that results in enhancement of crystal growth, and, the reduction in heat dissipation also allows a reduction in unnecessary increase in the substrate temperate in the melted silicon region.

After annealing the low-crystal-quality silicon film 7A using the focused-light annealing technique in a similar manner as described above, the silicon oxide film serving as the protective film and also as the reflection reducing film is removed. Thereafter, as in the previous example, the impurity concentrations of the respective channel regions are adjusted so as to obtain optimum $V_{th}$ by doping an n-type impurity such as phosphorus at a dose of $1 \times 10^{12}$ atoms/cm$^2$ into the pMOSTFT region by means of ion implantation or ion doping using a photoresist mask as a doping mask such that the pMOSTFT region has a donor concentration of $2 \times 10^{17}$ atoms/cc and doping a p-type impurity such as boron at a dose of $5\times10^{11}$ atoms/cm$^2$ into the nMOSTFT region such that the nMOSTFT region has an acceptor concentration of $1\times10^{17}$ atoms/cc.

Thereafter, source/drain regions are formed using a photolithographic process well known in the art. More specifically, for the nMOSTFT, an n-type impurity such as arsenic or phosphorus ions is doped at a dose of $1\times10^{15}$ atoms/cm$^2$ by means of ion implantation or ion doping so as to obtain a donor concentration of $2\times10^{20}$ atoms/cc, and, for the pMOSTFT, a p-type impurity such as boron ions is doped at a dose of $1\times10^{15}$ atoms/cm$^2$ by means of ion implantation or ion doping so as to obtain an acceptor concentration of $2\times10^{20}$ atoms/cc.

Thereafter, the n-type and p-type impurities in the polycrystalline silicon film are activated. More specifically, a heat treatment is performed at about 1000° C. for about 30 sec by means of focused-light annealing with energy lower than is used for crystallization or by means of RTA (Rapid Thermal Anneal) using an infrared lamp such as a halogen lamp thereby activating the impurities in the gate channel region and source/drain regions. Thereafter (or before the activation of impurities), a silicon oxide film serving as a gate insulating film is formed. If desired, a silicon nitride film and a silicon oxide film are successively deposited to form a gate insulating film having a multilayer structure. More specifically, a silicon oxide film 8 with a thickness of 40 to 50 nm is formed by means of catalytic CVD using a hydrogen-based carrier gas and monosilane and He-diluted $O_2$ mixed in a proper ratio, and then, if desired, a silicon nitride film with a thickness of 10 to 20 nm is formed using a hydrogen-based carrier gas and monosilane and $NH_3$ mixed in a proper ratio, and furthermore, a silicon oxide film with a thickness of 40 to 50 nm is formed under the same condition as described above.

Figure 1K:
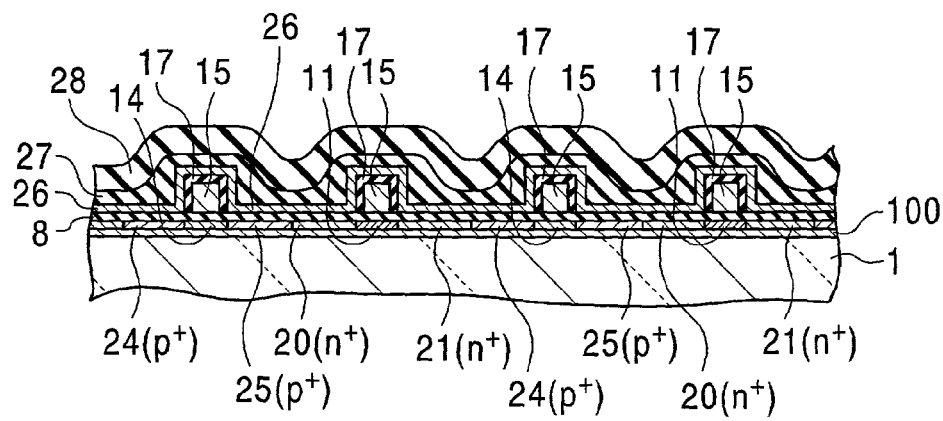

Thereafter, as shown in FIG. 1K, a silicon oxide film 26 with a thickness of, for example, 50 nm, a phosphosilicate glass (PSG) film 28 with a thickness of, for example, 400 nm, and a silicon nitride film 27 with a thickness of, for example, 200 nm are formed in a multilayer fashion over the entire surface by means of catalytic CVD. More specifically, the silicon oxide film 26 may be formed using He-diluted $O_2$ supplied at a flow rate of 1 to 2 SCCM and monosilane supplied at a flow rate of 15 to 20 SCCM, the phosphosilicate glass film 28 with a thickness of, for example, 40 nm may be formed using $PH_3$ at a flow rate of 1 to 20 SCCM, He-diluted $O_2$ at a flow rate of 1 to 2 SCCM, and $SiH_4$ at a flow rate of 15 to 20 SCCM, and the silicon nitride film 27 with a thickness of, for example, 200 nm may be formed using $NH_3$ at a flow rate of 50 to 60 SCCM and monosilane at a flow rate of 15 to 20 SCCM, wherein a hydrogen-based carrier gas is supplied at a flow rate of 150 SCCM when any film is formed.

Figure 1L:
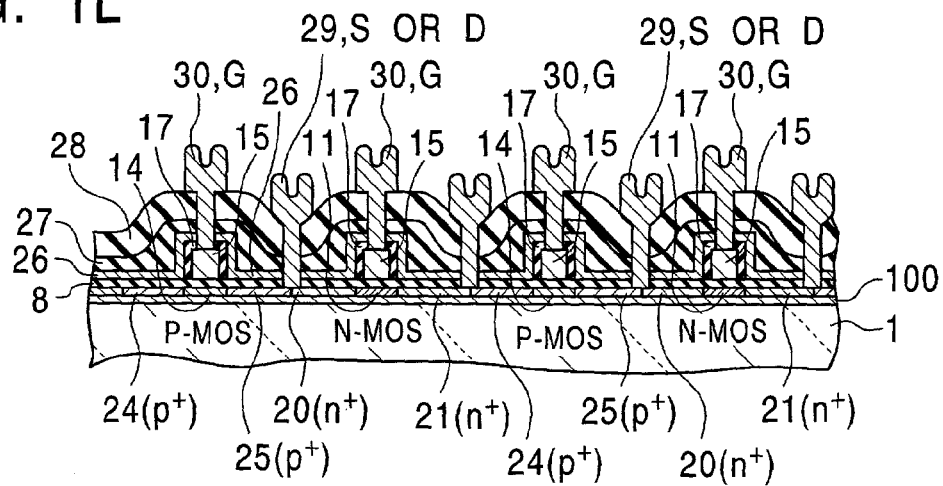

Thereafter, as shown in FIG. 1L, contact holes are formed at predetermined locations in the insulating films formed via the above-described process. More specifically, using a photolithographic process and an etching process well known in the art, a photoresist having a pattern corresponding to gates, sources, and drains of the nMOSTFT and the pMOSTFT is formed; the silicon nitride passivation film is plasma-etched using $CF_4$, $SF_6$, or the like; and the silicon oxide film and the PSG film are etched using a hydrofluoric acid-based etchant. The photoresist is then removed using an organic solvent or the like. As a result, the gate regions, source regions, and drain regions of the nMOSTFT and the pMOSTFT are exposed.

Thereafter, an electrode material such as aluminum containing 1% of silicon is deposited at 150° C. by means of sputtering or the like to a thickness of 1 μm over the entire surface including the areas exposed through the contact holes. The deposited electrode material is then patterned so as to form source/drain electrodes 29 (S or D) and gate electrodes and interconnections 30 (G) of the pMOSTFT and the nMOSTFT thereby forming a top-gate CMOSTFT. Thereafter, hydrogenation and sintering are performed in an ambient of a forming gas at 400° C. for 1 hour. In the above process, the aluminum film may be deposited by means of catalytic CVD using an aluminum compound gas (such as $AlCl_3$).

Instead of forming the gate electrodes in the above-described manner, the gate electrodes of the nMOSTFT and the pMOSTFT may be formed by depositing a refractory metal such as a Mo—Ta alloy to a thickness of 400 to 500 nm over the entire surface by means of sputtering and then patterning it using a photolithographic process and an etching process well known in the art.

A top-gate polycrystalline silicon CMOSTFT may also be produced by means of liquid phase growth using a melt of a silicon alloy and focused-light annealing. An example of a sequence of processing steps is described below. After forming an underlying protective film, an amorphous/microcrystalline silicon layer that may or may not contain tin is grown (precipitated) using one of methods (1) to (5) described below, and a low-melting metal film remaining on the grown layer is removed.

(1) After coating a melt of a low-melting metal such as tin containing silicon, the melt is cooled.

(2) The substrate with the underlying protective film formed thereon is dipped in a melt of a low-melting metal such as tin containing silicon. After immersion for a proper period of time, the substrate is drawn up and cooled.

(3) After forming a film of a low-melting metal such as tin containing silicon on the underlying layer, the film is melted by heating it. Thereafter, the film is cooled.

(4) A silicon film is formed on the underlying layer and a film of a low-melting metal such as tin is formed on the silicon film. The films are then melted by heating them. Thereafter, the films are cooled.

(5) A film of a low-melting metal such as tin is formed on the underlying layer and a silicon film is formed thereon. The films are then melted by heating them. Thereafter, the films are cooled.

Thereafter, the microcrystalline/amorphous silicon layer that may or may not contain tin is patterned into the form of islands where a pMOSTFT and an nMOSTFT are to be formed. The impurity concentrations of the channel regions are adjusted by means of ion implantation or ion doping so as to adjust $V_{th}$ to optimum values (in a similar manner as described earlier). Thereafter, sour/drain regions of the pMOSTFT and the nMOSTFT are formed by means of ion implantation or ion doping (in a similar manner as described earlier).

Thereafter, focused-light annealing is performed for crystallization and activation of ions (in a similar manner as described earlier). Thereafter, a silicon oxide film serving as a gate insulating film is formed by means of catalytic CVD. If desired, a silicon nitride film and a silicon oxide film are successively deposited to form a gate insulating film having a multilayer structure (in a similar manner as described earlier). The following processing steps are performed in a similar manner as described earlier. The above-described method using liquid phase growth may also be employed to produce a bottom-gate CMOSTFT and a dual-gate CMOSTFT that will be described later.

In the above process, the crystallization and the activation of ions may be performed separately. For example, the activation of ions may be performed by means of RTA separately from the crystallization by means of focused-light annealing.

A low-crystal-quality silicon film formed by means of sputtering may also be employed to produce a top-gate polycrystalline silicon CMOSTFT. In this case, the production process including the steps of forming the low-crystal-quality silicon film and performing focused-light annealing may be performed as follows. First, an underlying protective film is formed by means of sputtering. More specifically, silicon nitride is deposited over the entire surface of an insulating substrate by sputtering a silicon nitride target in an ambient of argon gas at a pressure of 0.133 to 1.33 Pa thereby forming a silicon nitride film with a thickness of 50 to 200 nm. A silicon oxide film with a thickness of 100 to 200 nm is then formed over the entire surface of the silicon nitride film by sputtering a silicon oxide target in an ambient of argon gas at a pressure of 0.133 to 1.33 Pa.

Thereafter, a silicon target that may or may not contain 0.1 to 1 at % of tin or nickel is sputtered in an ambient of argon gas at a pressure of 0.133 to 1.33 Pa thereby forming an amorphous silicon film that may or may not contain tin or nickel to a thickness of 50 nm on the insulating substrate, at least in areas where TFTs are to be formed.

Thereafter, a silicon oxide film with a thickness of 10 to 30 nm serving as a protective film and also as a reflection reducing film is formed over the entire surface of the amorphous silicon film by sputtering a silicon oxide target in an ambient of argon gas at a pressure of 0.133 to 1.33 Pa.

Alternatively, the above films may be formed by sputtering the same silicon target while changing the sputtering gas. That is, the silicon nitride film may be formed using a mixture of argon gas and nitrogen gas (5 to 10 mol %), the silicon oxide film may be formed using a mixture of argon gas and oxygen gas (5 to 10 mol %), the amorphous silicon film may be formed using argon gas, and the silicon oxide film may be formed using a mixture of argon gas and oxygen gas (5 to 10 mol %).

Thereafter, the amorphous silicon film that may or may not contain tin or nickel is patterned into the form of islands where a pMOSTFT and an nMOSTFT are to be formed (in a similar manner as in the previous method in which the film are formed by means of CVD). Gate channel regions, source regions, and drain regions are then formed by means of ion implantation or ion doping (in a similar manner as in the previous method in which the film are formed by means of CVD).

Thereafter, the amorphous silicon film that may or may not contain tin or nickel is subjected to focused-light annealing. The focused-light annealing causes the amorphous silicon film to be converted into a polycrystalline form and also causes the n-type and/or p-type impurities doped by means of ion implantation or ion doping to be activated such that the gate channel regions, the source regions, and the drain regions have optimum carrier impurity concentrations (wherein the focused-light annealing may be performed in a similar manner as described earlier). As in the previous methods, the crystallization and the activation of ions may be performed separately. For example, the activation of ions may be performed by means of RTA separately from the crystallization by means of focused-light annealing.

Thereafter, a silicon oxide film serving as a gate insulating film is formed. If desired, a silicon nitride film and a silicon oxide film are successively deposited to form a gate insulating film having a multilayer structure. More specifically, a silicon oxide film with a thickness of 40 to 50 nm, a silicon nitride film with a thickness of 10 to 20 nm, and a silicon oxide film with a thickness of 40 to 50 nm are successively deposited by means of catalytic CVD or the like (deposition conditions are similar to those employed in the previous methods).

The following processing steps are performed in a similar manner as in the previous methods. The above-described method using films formed by means of sputtering may also be employed to produce a bottom-gate CMOSTFT and a dual-gate CMOSTFT that will be described later.

By performing formation of a low-crystal-quality silicon film and focused-light annealing repeatedly as many times as needed, it is possible to form a high-purity large-grain polycrystalline film having high crystal quality near to that of monocrystalline silicon to a large thickness. Such a film is suitable for producing a CCD area/linear sensor, a bipolar LSI, or a solar cell that need a thick film. More specifically, such a thick film may be produced as follows. First, a large-grain polycrystalline silicon film with a thickness of, for example, 200 to 300 nm is formed via a first-time focused-light annealing process. Thereafter, a low-crystal-quality silicon film with a thickness of 200 to 300 nm is formed thereon. Second-time focused-light annealing is then performed. Crystallization occurs during the second-time focused-light annealing in which the polycrystalline silicon film underlying the low-crystal-quality silicon film provides a seed for crystallization, and thus a large-grain polycrystalline silicon film having a total thickness of 400 to 600 nm is formed. The above processing steps are performed repeatedly as many times as needed to form a large-grain polycrystalline silicon film as thick as on the order of a few microns. Note that such a thick film also falls within the scope of the polycrystalline thin silicon film according to the present invention.

In the case of such a thick film formed by means of repetition of deposition and annealing, an underlying large-grain polycrystalline silicon layer provides crystal nuclei (seeds) in the following focused-light annealing, and thus a polycrystalline silicon layer thereon can have a greater grain size. As a result, in the resultant large-grain polycrystalline thick silicon film, the crystal quality and the purity become better and better from a lower layer to an upper layer to levels near to those of monocrystalline silicon. Such thick film is suitable for producing, not only a MOSLSI, but also a wide variety of devices that need a thick film on which active and passive elements are formed, such as a CCD area/linear sensor, a bipolar LSI, or a solar cell.

[1] In the case where focused-light annealing is performed after patterning into islands, processing may be performed using any of the methods (1) to (4) described below.

(1) In a low-temperature process (A), an amorphous silicon film covered with a multilayer of silicon oxide ($SiO_2$)/silicon nitride ($SiN_x$) is patterned into islands. After converting the amorphous silicon film into a polycrystalline form by performing focused-light annealing, only the $SiN_x$ film is removed. Thereafter, a $SiO_2$ film or a multilayer film of $SiO_2/SiN_x$ serving as a gate insulating film is deposited. Herein, the term "low-temperature process" is used to describe a process performed on a structure including a substrate made of low-melting glass such as borosilicate glass or aluminosilicate glass. Note that the silicon nitride film formed at a low temperature by means of plasma-enhanced CVD or the like has a deviation from the ideal composition of $Si_3N_4$, and thus such a silicon nitride film is denoted by $SiN_x$.

(2) In a low-temperature process (B), an amorphous silicon film covered with $SiO_2$ (or $SiN_x$) film is patterned into the form of islands, and then the amorphous silicon film is converted into a polycrystalline form by performing focused-light annealing. Thereafter, the $SiO_2$ (or $SiN_x$) film is removed, and a $SiO_2$ film or a multilayer film of $SiO_2$/$SiN_x$/$SiO_2$ serving as a gate insulating film is deposited.

(3) In a low-temperature process (C), an amorphous silicon film is patterned into the form of islands, and then focused-light annealing is performed. Thereafter, a $SiO_2$ film or a multilayer film of $SiO_2$/$SiN_x$/$SiO_2$ serving as a gate insulating film is deposited.

(4) In a high-temperature process (A), an amorphous silicon film is patterned into the form of islands, and then focused-light annealing is performed. Thereafter, the surface of the polycrystalline silicon film is oxidized by means of high-temperature oxidation (at 1000° C. fir 30 min) thereby forming a gate insulating film. Herein, the term "high-temperature process" is used to describe a process performed on a structure including a substrate made of quartz glass.

[II] In the case where focused-light annealing is performed before patterning into islands, one of processes (1) to (4) described below may be employed.

(1) In a low-temperature process (D), patterning into islands is performed after completion of focused-light annealing on an amorphous silicon film covered with a multilayer film of $SiO_2$/$SiN_x$. Thereafter, only the $SiN_x$ film is removed, and a $SiO_2$ film or a multilayer film of $SiO_2$/$SiN_x$ serving as the gate insulating film is formed.

(2) In a low-temperature process (E), after performing focused-light annealing on an amorphous silicon film covered with a $SiO_2$ (or $SiN_x$) film, patterning into islands is performed. Thereafter, the $SiO_2$ (or $SiN_x$) film is removed, and a $SiO_2$ film or a multilayer film of $SiO_2$/$SiN_x$/$SiO_2$ serving as a gate insulating film is deposited.

(3) In a low-temperature process (F), after performing focused-light annealing on an amorphous silicon film, patterning into islands is performed. Thereafter, a $SiO_2$ film or a multilayer film of $SiO_2$/$SiN_x$/$SiO_2$ serving as a gate insulating film is deposited.

(4) In a high-temperature process (B), after performing focused-light annealing on an amorphous silicon film, patterning into islands is performed. The polycrystalline silicon film is then thermally oxidized at a high temperature (at 1000° C. for 30 min) thereby forming a gate insulating film (in this case, it is needed to use a substrate made of quartz glass).

In both processes [I] and [III], when a low-temperature process is used, $SiO_2$ may be formed by catalytic CVD, plasma-enhanced CVD, or TEOS-based plasma CVD, and $SiN_x$ may be formed by catalytic CVD or plasma-enhanced CVD. When a high-temperature process is used, a high-quality $SiO_2$ film can be formed by thermally oxidizing polycrystalline silicon at a high temperature as described above. In this case, the polycrystalline silicon film should be formed so as to have a sufficiently large thickness.

As can be seen from the above discussion, the present embodiment provides great advantages (a) to (k) described below.

(a) In the focused-light annealing, light emitted from a lamp such as an ultra-high-pressure mercury lamp is focused into a desired form, and the low-crystal-quality thin semiconductor film such as an amorphous silicon film is illuminated with the focused light so as to heat the low-crystal-quality thin semiconductor film into a melted or semi-melted state or heat it while maintaining it in a non-melted state and then cool it thereby crystallizing it. That is, in this process, high illumination energy applied to the low-crystal-quality thin semiconductor film causes the low-crystal-quality thin semiconductor film to be heated into a melted or semi-melted state or heated while maintaining non-melted state, and then the low-crystal-quality thin semiconductor film is cooled thereby obtaining a monocrystalline semiconductor film or a large-grain polycrystalline semiconductor film such as a monocrystalline or polycrystalline silicon film, having a high carrier mobility and high quality. This technique allows a great improvement in productivity and a great reduction in cost.

(b) In the focused-light annealing according to the present invention, because the zone melting recrystallization is performed while continuously moving the melted zone, a catalytic element such as Ni preincorporated to enhance the crystallization and other impurities are segregated into the melted zone and thus such a catalytic element or impurities can be easily removed. Thus, no impurities remain in the resultant annealed film. This makes it possible to easily obtain a polycrystalline thin semiconductor film having large grains, a high carrier mobility, and high quality. In particular, if multiple zone melting recrystallization is performed by sequentially performing melting and cooling repeatedly using a plurality of focused light rays emitted from a plurality of lamps, it is possible to obtain a polycrystalline thin semiconductor film having further greater grains and higher quality. The high purity obtained by this technique makes it possible to produce a device with high stability and high reliability without degrading characteristics of the semiconductor. Furthermore, in the focused-light annealing technique, the zone melting recrystallization or multiple zone melting recrystallization is performed via a simple process thereby allowing efficient removal of a catalytic element that has finished its role in enhancing crystallization and also allowing efficient removal of other impurities. This simplicity of the process allows a reduction in cost.

(c) The crystal grains in the polycrystalline silicon film are aligned in a direction in which the focused light is scanned. Therefore, if TFTs are formed in this direction, mismatching and stress at crystal grain boundaries are minimized, and thus the resultant polycrystalline thin silicon film has a high mobility.

(d) If another low-crystal-quality silicon film is formed on a polycrystalline silicon film crystallized by means of zone melting recrystallization or multiple zone melting recrystallization using the focused-light annealing technique, and if crystallization is performed again using the focused-light annealing process, a polycrystalline silicon film having large grains, a high carrier mobility, and high crystal quality can be formed to a greater thickness. By performing this process repeatedly, a multilayer film with a large total thickness such as on the order of a few microns can be obtained. This makes it possible to produce not only a MOSLSI but also other types of devices such as a bipolar LSI, a CMOS sensor, a CCD area/linear sensors, and a solar cell, having high performance and high quality.

(e) Regardless of whether a UV lamp or an infrared lamp is used, light emitted from the lamp can be easily focused into the form of a line, a rectangle, or a square, and the focused light can be continuously applied. Furthermore, the beam size and the scanning pitch can be arbitrarily set. The high light intensity leads to increases in melting efficiency and throughput, and thus a reduction in cost can be achieved.

(f) The lamp used in the focused-light annealing apparatus can be easily controlled in terms of the wavelength, the light intensity, and the illumination time. Furthermore, the heating/melting rate and the cooling rate can be controlled by controlling the speed at which a substrate or the lamp is moved. By controlling those parameters, it is possible to form a polycrystalline silicon film having a desired grain size and desired purity.

(g) The lamp used in the focused-light annealing apparatus is much more inexpensive than an excimer laser generator used in an excimer laser annealing apparatus, and thus a great cost reduction can be achieved.

(h) In the conventional annealing process using a XeCl or KrF excimer laser, a laser beam is outputted in the form of pulses on the order of few nsec and the output is not stable. The instability in the laser beam output results in a variation in the energy distribution across a surface irradiated to the laser beam. This results in a variation in quality of the resultant crystallized semiconductor film and a variation in characteristic from TFT to TFT. One known technique to avoid the above problems is to applying an excimer laser pulse repeatedly as many times as, for example, 5 to 30 times while heating the film at a temperature of, for example, 400° C. However, even in this case, the variety in crystal quality of the semiconductor film and the variety in device characteristic from TFT to TFT cannot be completely eliminated. Besides, a reduction in throughput occurs, which causes an increase in cost. In contrast, in the focused-light annealing process, in particular in the annealing process using an ultra-high-pressure mercury lamp, light with the same wavelength as that of a XeCl excimer laser (with a wavelength of 308 nm) can be continuously applied with a small variation in illumination energy across the entire film surface, and thus a resultant crystallized semiconductor film has uniform characteristics and produced TFTs have small variations in characteristics from device to device. Thus, high throughput and high productivity are achieved, which result in a reduction in cost.

(i) The focused-light annealing process can be used at a low substrate temperature (200 to 400° C.). This makes it possible to employ glass having a low strain point or a heat-resistant resin as a substrate material, which allows production of a large-sized substrate at low cost. Thus, reductions in weight and cost can be achieved.

(j) In the case where a high-temperature-resistant substrate made of quartz glass, crystallized glass, or the like is used, a gate insulating film having high quality can be easily formed using a simple process, and thus it is possible to produce a high-performance semiconductor device at low cost.

(k) Not only a top-gate type but also other types of TFTs such as a bottom-gate type and dual-gate type MOSTFTs can be produced using a monocrystalline or polycrystalline semiconductor film with a high carrier mobility formed by the focused-light annealing technique. Thus, it becomes possible to produce a high-speed high-current semiconductor device, an electro-optical device, and a high-efficiency solar cell, using the high-performance semiconductor film. Specific examples of devices that can be produced according to the present embodiment include a silicon semiconductor device, a silicon semiconductor integrated circuit, a silicon-germanium semiconductor device, a silicon-germanium semiconductor integrated circuit, a silicon carbide semiconductor device, a silicon carbide semiconductor integrated device, a polycrystalline diamond semiconductor device, a polycrystalline diamond semiconductor integrated circuit, a compound semiconductor (such as GaAs) device, a compound semiconductor (such as GaAs) integrated circuit, a liquid crystal display, a field emission display (FED), an (inorganic/organic) electroluminescence display, a light emitting polymer display, a light emitting diode display, a photosensor, a CCD area/liner sensor, a CMOS sensor, and a solar cell.

Second Embodiment

First Example of a Process of Producing an LCD

In this second embodiment, the present invention is applied to an LCD (liquid crystal display) using a polycrystalline silicon MOSTFT formed via a high-temperature process. An example of a sequence of processing steps of producing an LCD is described below.

Figure 10A:
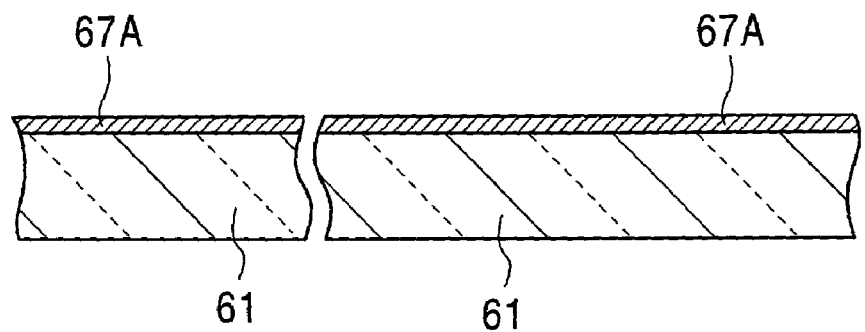
FIGS. 10A to 10L are cross-sectional views illustrating processing steps of producing an LCD according to a second embodiment of the present invention.

First, as shown in FIG. 10A, after forming an underlying protective film 100 (not shown in the figures) by means of catalytic CVD or the like on one principal surface of a high-temperature-resistant insulating substrate 61 made of quartz glass, crystallized glass, or the like (having a strain point of 800 to 1100° C. and a thickness of 50 μm to a few mm) in a pixel area (shown on the left of FIG. 10A) and a peripheral circuit area (shown on the right of FIG. 10A), a low-crystal-quality silicon film 67A is formed by means of catalytic CVD or the like on the underlying protective film 100. If needed, a silicon oxide film serving as a protective film and also as a reflection reducing film is formed thereon to a thickness of 10 to 30 nm.

Figure 10B:
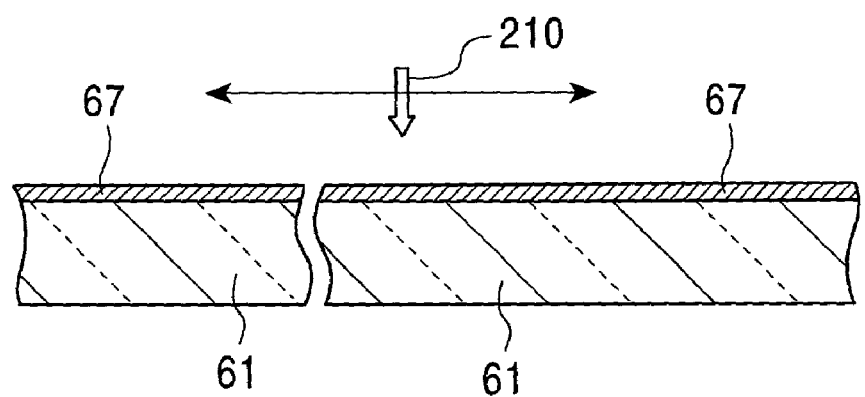

Thereafter, as shown in FIG. 10B, the low-crystal-quality silicon film 67A is subjected to focused-light annealing thereby forming a polycrystalline silicon film 67 with a thickness of 50 nm.

Figure 10C:
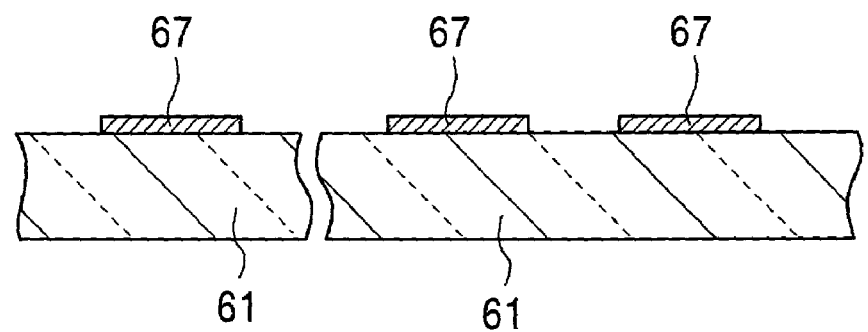

Thereafter, as shown in FIG. 10C., the silicon oxide film for protection and reflection reduction is removed, and the polycrystalline silicon film 67 is patterned into the form of islands by means of a photolithographic process and an etching process well known in the art so as to form active layers of active devices such as a transistor and a diode and active layers of passive devices such as a resistor, a capacitor, and an inductor. Although the process described hereinafter is concerned with a production of a TFT, the process may also be applied to production of other types of devices.

Figure 10D:
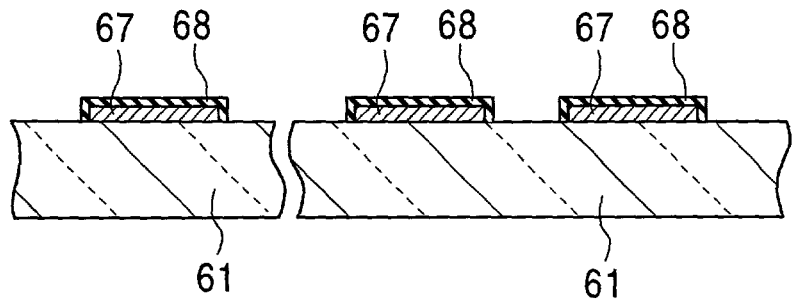

Thereafter, respective channel regions of the polycrystalline silicon film 67 are doped with impurities such as boron or phosphorus by means of ion implantation or ion doping in a similar manner as described earlier so as to control the impurity concentrations thereof to values corresponding to optimum $V_{th}$. Thereafter, as shown in FIG. 10D, a silicon oxide film 68 serving as a gate insulating film with a thickness of, for example, 50 nm is formed on the surface of the polycrystalline silicon film 67 by means of catalytic CVD or the like in a similar manner as described above. In the case where catalytic CVD is employed to form the oxide silicon film 68 serving as the gate insulating film, the catalytic CVD process may be performed at a substrate temperature and a catalytic element temperature similar to those described earlier using oxygen gas supplied at a flow rate of 1 to 2 SCCM, monosilane at a flow rate of 15 to 20 SCCM, and a hydrogen-based carrier gas at a flow rate of 150 SCCM.

Figure 10E:
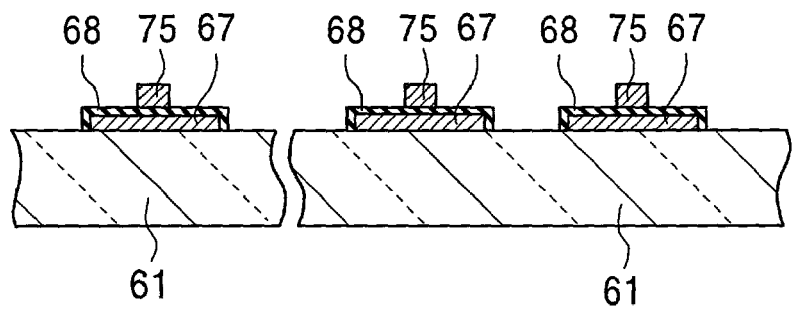

Thereafter, as shown in FIG. 10E, a material such as a Mo—Ta alloy for gate electrodes and gate lines is deposited by means of sputtering to a thickness of, for example, 400 nm. Alternatively, a phosphorus-doped polycrystalline silicon film may be deposited to a thickness of, for example, 400 nm by means of catalytic CVD or the like in a similar manner as described earlier using a hydrogen-based carrier gas supplied at a flow rate of 150 SCCM, $PH_3$ at a flow rate of 2 to 20 SCCM, and monosilane at a flow rate of 20 SCCM. Thereafter, a gate electrode 75 and a gate line are formed by patterning the gate electrode layer by means of a photolithographic process and an etching process that are well known in the art. In the case where a phosphorus-doped polycrystalline silicon film is employed, after removing the photoresist mask, a silicon oxide film is formed on the surface of the phosphorus-doped silicon film 75 by means of catalytic CVD or the like.

Figure 10F:
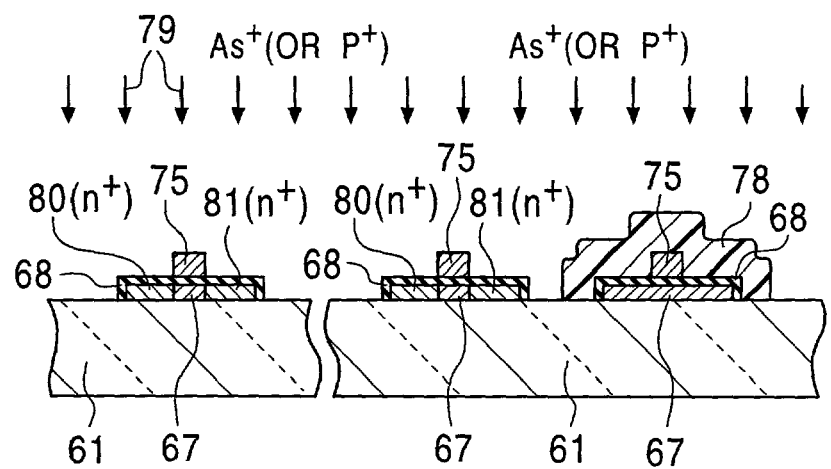

Thereafter, as shown in FIG. 10F, the pMOSTFT area is covered with a photoresist 78, and an n-type impurity 79 such as arsenic (or phosphorus) ions is doped by means of ion implantation or ion doping at a dose of, for example, $1 \times 10^{15}$ atoms/cm$^2$, thereby forming an n$^+$-type source region 80 and drain region 81 of an nMOSTFT such that the resultant source and drain regions have a donor concentration of $2 \times 10^{20}$ atoms/cc.

Figure 10G:
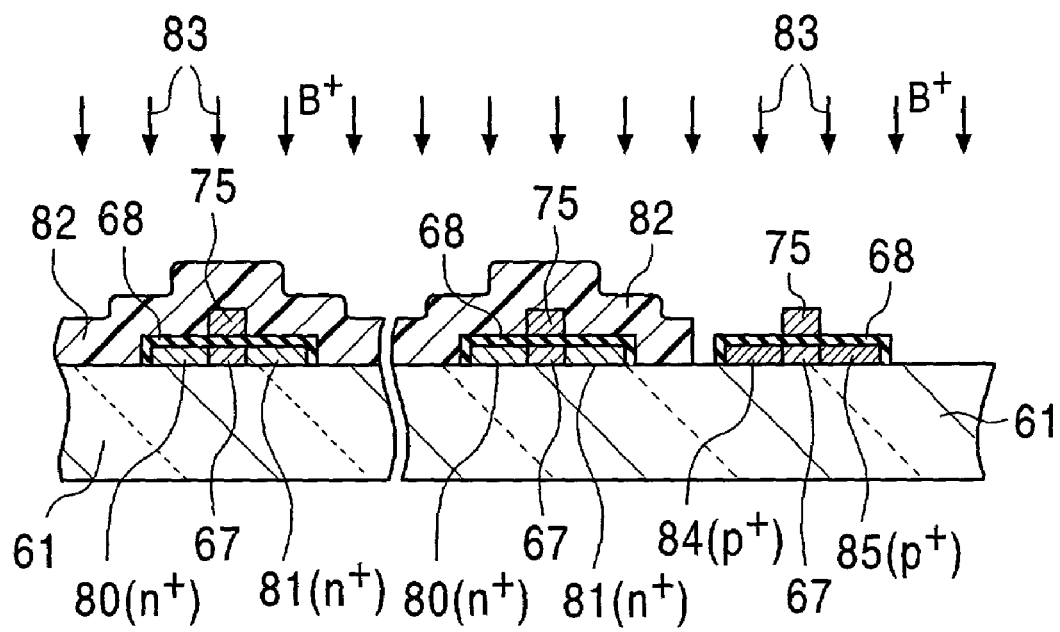

Thereafter, as shown in FIG. 10G, the nMOSTFT area is covered with a photoresist 82, and a p-type impurity 83 such as boron ions is doped by means of ion implantation or ion doping at a dose of, for example, $1 \times 10^{15}$ atoms/cm$^2$, thereby forming a p$^+$-type source region 84 and drain region 85 of a pMOSTFT such that the resultant source and drain regions have an acceptor concentration of $2 \times 10^{20}$ atoms/cc. Annealing is then performed for 5 min at about 900° C. in a nitrogen ambient thereby activating the impurity ions doped in the respective regions so that the respective regions have desired impurity (carrier) concentrations.

Figure 10H:
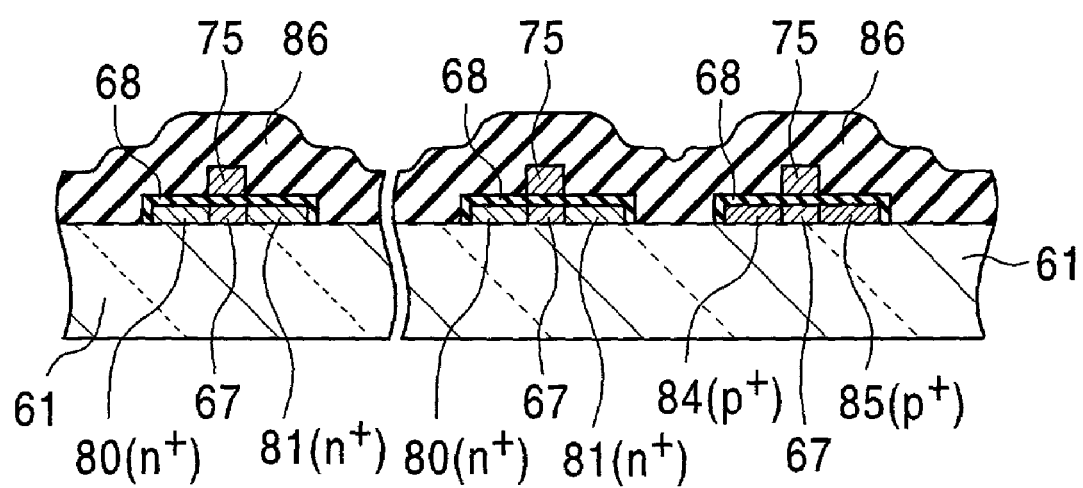

Thereafter, as shown in FIG. 10H, an interlayer insulating film 86 having a multilayer form consisting of a silicon oxide film with a thickness of, for example, 100 nm, a phosphosilicate glass (PSG) film with a thickness of, for example, 400 nm, and a silicon nitride film with a thickness of, for example, 200 nm, by means of catalytic CVD or the like in a similar manner as described earlier, wherein the silicon oxide film may be formed using He-diluted $O_2$ supplied at a flow rate of 1 to 2 SCCM, silane at a flow rate of 15 to 20 SCCM, and a hydrogen-based carrier gas supplied at a flow rate of 150 SCCM that is also supplied when the other layers are formed, the PSG film may be formed using phosphine at a flow rate of 1 to 20 SCCM, He-diluted $O_2$ at a flow rate of 1 to 2 SCCM, and silane at a flow rate of 15 to 20 SCCM, and the silicon nitride film may be formed using ammonia at a flow rate of 50 to 60 SCCM and silane at a flow rate of 15 to 20 SCCM. Note that the interlayer insulating film may be formed using a different process.

Figure 10I:
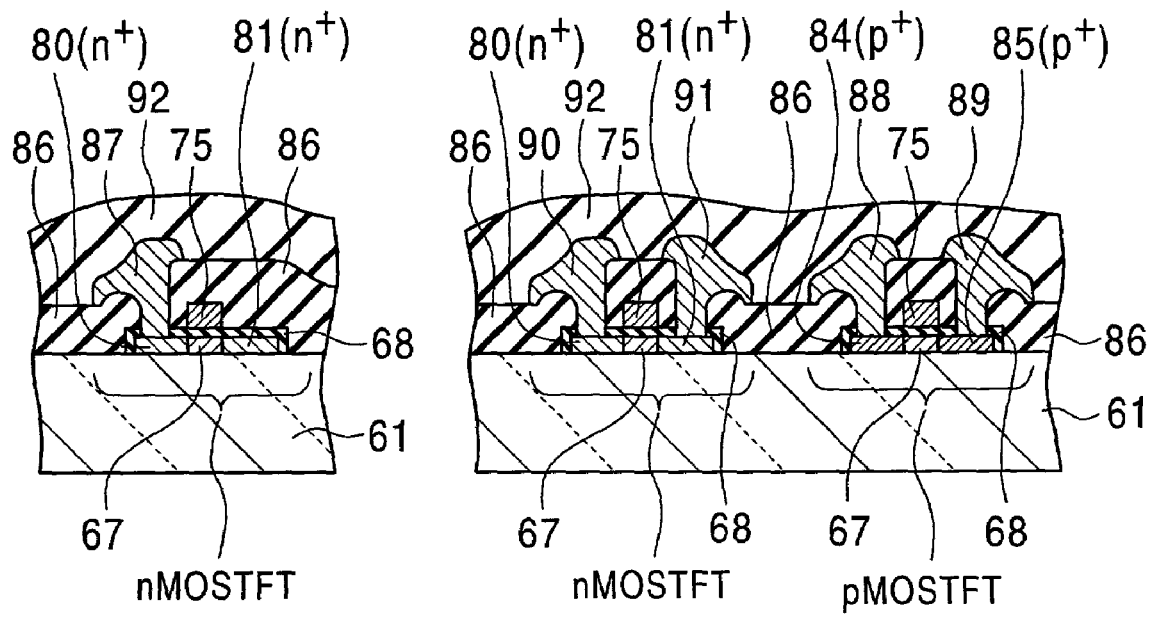

Thereafter, as shown in FIG. 10I, contact holes are formed in the insulating film 86, at predetermined locations, and an electrode material such as aluminum with a thickness of 1 μm is deposited by means of sputtering or the like at 150° C. so that the entire surface including the contact holes are covered with the deposited electrode material. The deposited electrode material is then patterned so as to form a source electrode 87 of an nMOSTFT and a data line in the pixel area, source electrodes 88 and 90, drain electrodes 89 and 91 of a pMOSTFT and an nMOSTFT, and interconnections in the peripheral circuit area. In the above process, the deposition of aluminum may be performed using a catalytic CVD process.

Figure 10J:
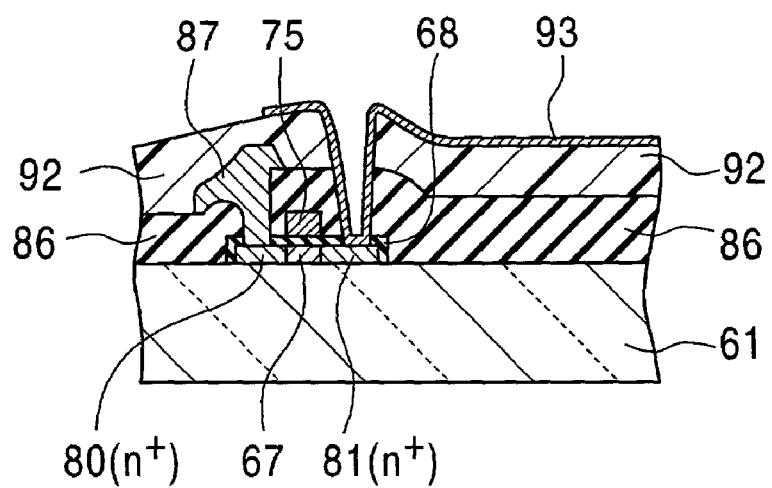

An interlayer insulating film of silicon oxide or the like 92 is then formed on the surface by means of, for example, a CVD process. Thereafter, hydrogenation and sintering are performed at 400° C. in an ambient of a forming gas for 30 min. Thereafter, as shown in FIG. 10J, a contact hole is formed in the interlayer insulating films 92 and 86 at a location corresponding to the drain region of the nMOSTFT in the pixel area, and a transparent electrode material such as ITO (Indium Tin Oxide, which is an indium oxide doped with tin) is deposited over the entire surface by means of vacuum evaporation or the like. The transparent electrode material is then patterned so as to form a transparent pixel electrode 93 connected to the drain region 81 of the nMOSTFT in the pixel area. Thereafter, a heat treatment is performed (in an ambient of a forming gas, at a temperature of 200 to 250° C., for 1 hour) to reduce the contact resistance and improve the transparency of the ITO film.

Figure 10K:
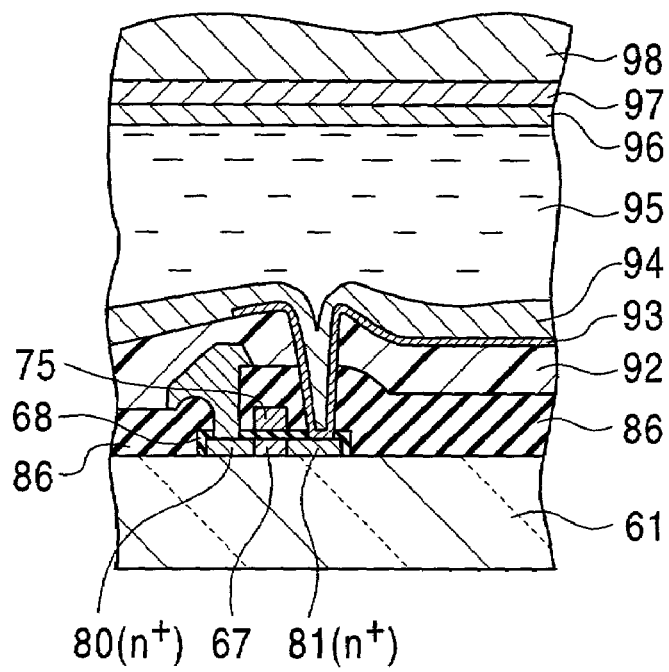

Thus, an active matrix substrate (hereafter, also referred to as a TFT substrate) is obtained, and a transmissive LCD can be produced using the obtained TFT substrate. As shown in FIG. 10K, the transmissive LCD may be produced by forming, on the pixel electrode 93, a multilayer structure including an alignment film 94, a liquid crystal 95, an alignment film 96, a transparent electrode 97, and an opposite substrate 98.

Figure 14A:
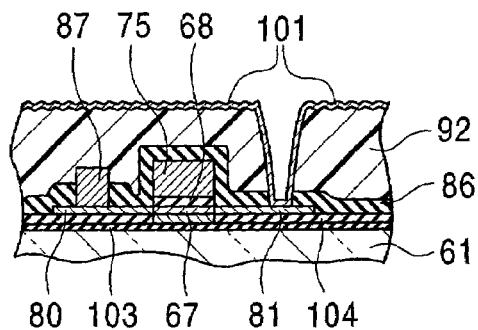
FIGS. 14A to 14C are cross-sectional views illustrating various types of MOSTFTs used in an LCD.

The process described above may also be used to produce a reflective LCD. FIG. 14A shows an example of a structure of a reflective LCD. In this example shown in FIG. 14A, a reflective film 101 is deposited on an insulating film 92 having a roughened surface and is connected to a drain of a MOSTFT.

A liquid crystal cell of this LCD may be constructed in a plane-to-plane fashion (that is suitable for a liquid crystal panel with a middle/large size equal to or greater than 2 inches). In this case, polyimide alignment films 94 and 96 are formed on a TFT substrate 61 and an opposite substrate 98 the surface of which is entirely covered with an ITO (Indium Tin Oxide) electrode 97 such that the polyimide alignment films are in contact with the surfaces on which elements are formed. The polyimide films may be formed by means of roll coating, spin coating, or the like to a thickness of 50 to 100 nm and performing curing at 180° C. for 2 hours.

The TFT substrate 61 and the opposite substrate 98 are then subjected to a rubbing process or an optical alignment process. Cotton, rayon, or the like may be used as a rubbing buff material. Cotton is more preferable in that it creates less buff dust and provides better retardation. In the optical alignment process, liquid crystal molecules are aligned in a non-contact fashion by irradiating them with a linearly polarized ultraviolet ray. Instead of rubbing, an alignment film may also be obtained by applying a polarized or non-polarized light ray at a slant angle thereby forming a macromolecular alignment film (a specific example of a macromolecular compound employable for this purpose is polymethylmethacrylate).

Then, after cleaning, a common agent is coated on the TFT substrate 61, and a sealing agent is coated on the opposite substrate 98. The cleaning is performed using water or isopropyl alcohol to remove rubbing dust. The common agent may be acrylic, epoxy acrylate, or epoxy adhesive, containing a conductive filler. The sealing agent may be acrylic, epoxy acrylate, or epoxy adhesive. Curing may be performed by means of heating, ultraviolet ray irradiation, or ultraviolet ray irradiation plus heating. From the view point of registration accuracy and productivity, ultraviolet ray irradiation plus heating is desirable.

Then, after dispersing spacers for obtaining a gap on the opposite substrate 98, the TFT substrate 61 and the opposite substrate 98 are combined together. Relative positioning between the opposite substrate 98 and the TFT substrate 61 is performed by precisely aligning an alignment mark formed on the opposite substrate 98 with respect to an alignment mark formed on the TFT substrate 61. After that, the sealing agent is temporarily semi-cured by means of ultraviolet ray irradiation and then fully cured by means of heating.

Thereafter, scribing and separation are performed to obtain a liquid crystal panel including the TFT substrate 61 and the opposite substrate 98.

A liquid crystal 95 is then injected into a gap between the two substrates 61 and 98. Thereafter, an injection hole is sealed with an ultraviolet adhesive, and cleaning is performed using isopropyl alcohol. Although the liquid crystal 95 used herein may be of any type, a nematic liquid crystal is most widely used. When a nematic liquid crystal is used in a TN (twist nematic) mode, high-speed response can be achieved.

Thereafter, in order to align the liquid crystal 95, the liquid crystal 95 is heated and rapidly cooled.

Flexible wires are connected with panel terminals of the TFT substrate 61 via an anisotropic conducting film by means of thermo-compression bonding. Furthermore, a polarizer is bonded to the opposite substrate 98.

In the case where a liquid crystal panel is constructed into a single-plane structure (that is preferable for a liquid crystal panel with a size smaller than 2 inches), after forming polyimide alignment films 94 and 96 on the device-surfaces of the TFT substrate 61 and the opposite substrate 98, both substrates are subjected to rubbing or a non-contact alignment process using a linearly polarized ultraviolet ray.

Thereafter, the TFT substrate 61 and the opposite substrate 98 are diced or scribed into individual units of LCD panels, and cleaning is performed using water or IPA. Then, after coating a common agent on the TFT substrate 16 and coating sealing agent containing spacers on the opposite substrate 98, the TFT substrate 61 and the opposite substrate 98 are combined together. The following processing steps are performed in a similar manner as described above.

In the LCD described above, a CF (color filter) substrate including a color filter layer (not shown) disposed under the ITO electrode 97 is used as the opposite substrate 98. In this case, light incident on the side of the opposite substrate 98 is reflected by the reflective film 93 with a high reflectance and outputted to the outside from the side of the opposite substrate 98.

In the case where an on-chip color filter (OCCF) structure is employed, a color filter is disposed on the TFT substrate 61, and only the ITO electrode (or an ITO electrode with a black mask) is disposed on the opposite substrate 98 over its entire surface.

In the case of a transmissive LCD, the LCD may be produced into an on-chip color filter (OCCF) structure or an on-chip black (OCB) structure as described below.

Figure 10L:
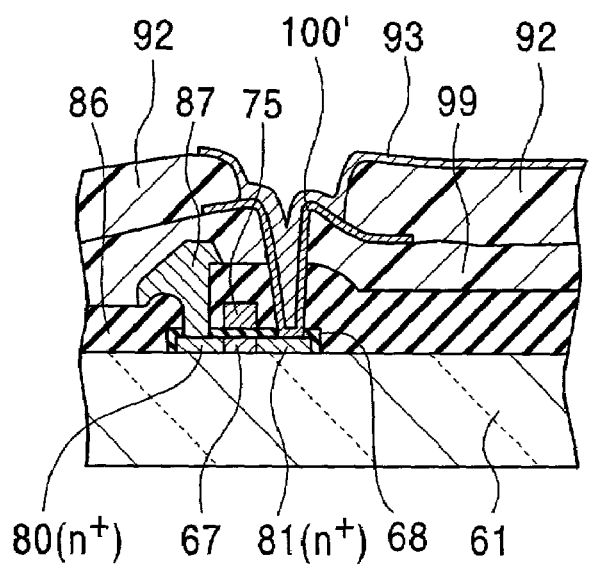

As shown in FIG. 10L, an additional window is formed in the multilayer insulating film 86 consisting of phosphosilicate glass/silicon oxide, at a location corresponding to the drain, and the window is filled with an embedded aluminum drain electrode. After a photoresist 99 in which R, G, and B pigments are dispersed in corresponding segments is coated to a predetermined thickness (1 to 1.5 μm), the photoresist is patterned so that only desired portions (corresponding to the pixels) remain thereby forming color filter layers 99(R), 99(G), and 99(B) of respective colors (in the form of on-chip color filter). In the above processing step, a drain window is also formed. In this type of LCD, an opaque substrate such as a ceramic substrate, a low-transmission glass substrate, or a heat-resistant resin substrate cannot be employed.

Thereafter, a light shield layer 100' serving as a black mask layer is formed by means of patterning a metal such that an area including the contact hole communicating with the drain of the MOSTFT in the display area and the color filter layer in the peripheral area of the contact hole is covered with the light shield layer 100'. More specifically, the light shield layer 100' may be formed by depositing molybdenum to a thickness of 200 to 250 nm by means of sputtering and then patterning it such that only the areas to be shielded from light are covered with the light shield layer 100'.

Thereafter, a transparent resin film 92 for planarization is formed, and a transparent ITO electrode 93 is formed on the planarization film 92 such that the transparent ITO electrode 93 is connected to the light shield layer 100' via a through-hole formed in this planarization film 92.

By forming the color filter 99 and the black mask 100' in the display array area, it becomes possible to improve the aperture ratio of the liquid crystal panel and reduce the total power consumption of the display module including a backlight unit.

Figure 11:
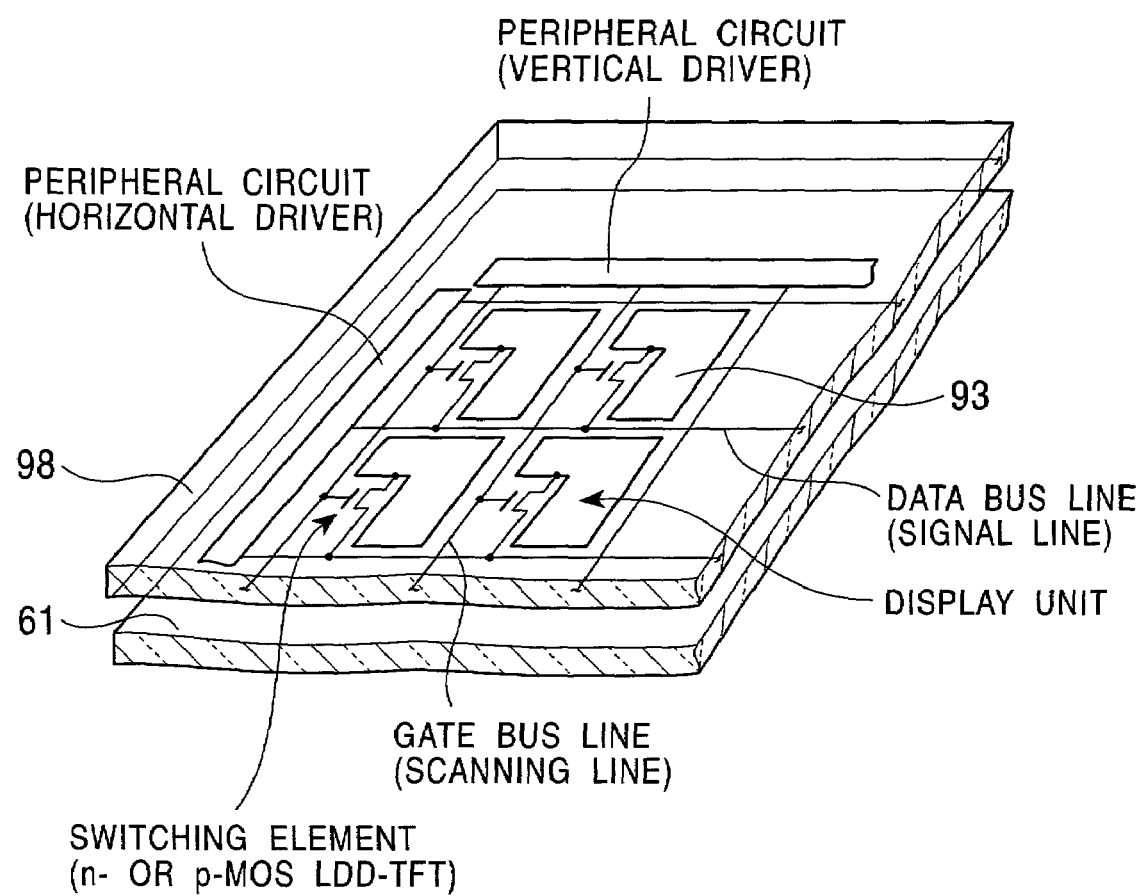
FIG. 11 is a perspective view illustrating a general structure of an LCD.

FIG. 11 schematically illustrates the overall structure of an active matrix liquid crystal display (LCD) including top-gate MOSTFTs described above and a driver circuit integrated therewith. This active matrix LCD is constructed into a flat panel structure composed of a principal substrate 61 (serving as an active matrix substrate) and an opposite substrate 98 that are bonded to each other via a spacer (not shown), wherein a liquid crystal (not shown) is placed and sealed between the two substrates 61 and 98. On the surface of the principal substrate 61, there are disposed an array of pixel electrodes 93, display units each including a switching element for driving a corresponding pixel electrode, and a peripheral driver circuit connected to the display units.

The switching element of each display unit is constructed by a top-gate type nMOSTFT, pMOSTFT or CMOSTFT with the LDD structure. The peripheral circuit may also be constructed using top-gate type CMOSTFTs, nMOSTFTs, or pMOSTFTS, or a mixture of any of those. The peripheral driver circuit includes a horizontal driver circuit and a vertical driver circuit, which are generally disposed separately on different sides, wherein the horizontal driver circuit serves to supply a data signal and drive the MOSTFTs of respective pixels from one horizontal line to the next, and the vertical driver circuit serves to drive the gates of the MOSTFTs of the respective pixels from one scanning line to the next. The driver circuit may be constructed so as to adapt to either a pixel-to-pixel/analog scanning scheme or a line-to-line/digital scanning scheme.

Figure 12:
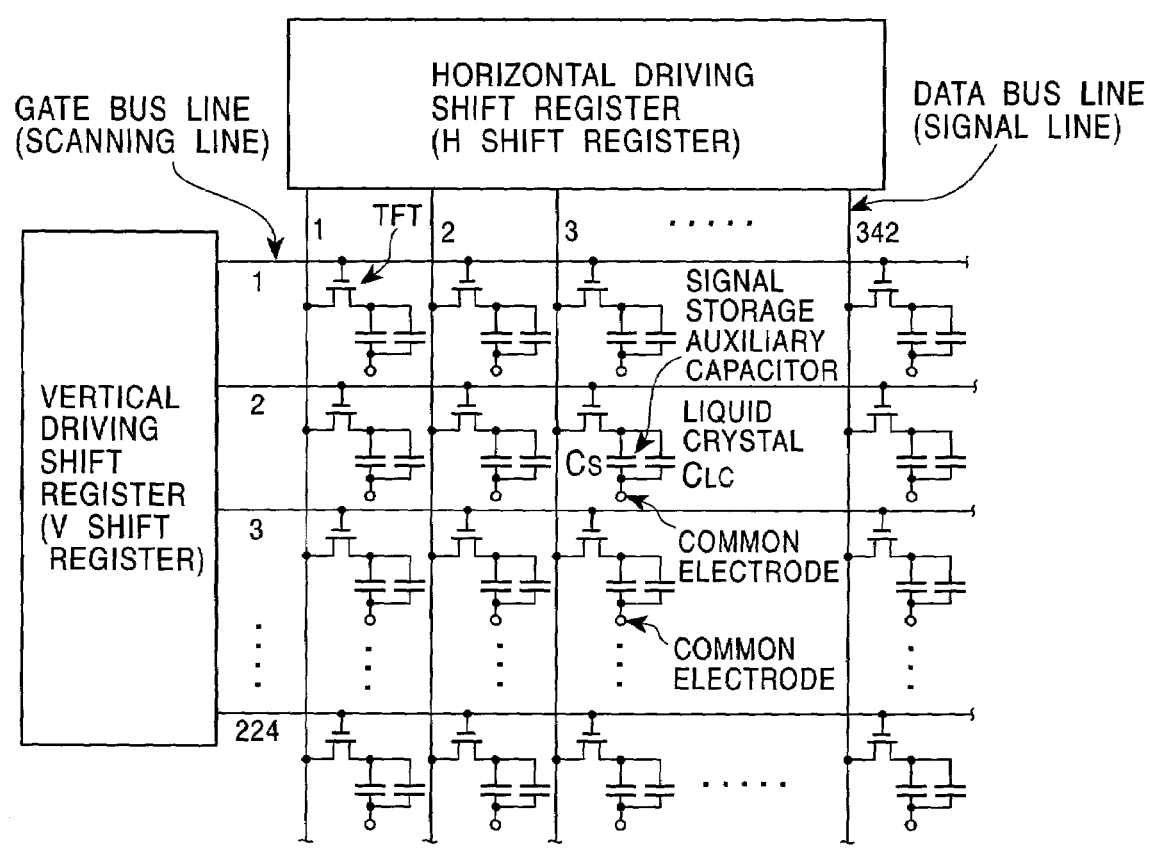
FIG. 12 is an equivalent circuit of the LCD.

As shown in FIG. 12, the MOSTFTs are disposed at intersections between the gate bus lines and the data bus lines, wherein each gate bus line extends in a direction perpendicular to a direction in which each data bus line extends. Image information is written into liquid crystal capacitors ($C_{LC}$) via corresponding MOSTFTs and charges are retained therein until next information is supplied. However, the channel resistance of MOSTFTs is not high enough to retain image information to a sufficient degree, and liquid crystal voltage corresponding to the image information decreases due to a leakage current. In order to reduce the reduction in the liquid crystal voltage due to such a leakage current, an additional storage capacitor (auxiliary capacitor) $C_s$ may be disposed in parallel with the liquid crystal capacitor. In the LCD, the required characteristic of the MOSTFTs vary depending on whether they are used in the pixels (display units) or the peripheral driver circuit. When the MOSTFTs are used in pixels, it is required that the MOSTFTs can control their off-current to a sufficiently low level and can provide a large enough on-current. To meet the above requirement, the MOSTFTs used in the display units are constructed to have an LDD structure that allows a reduction in electric field between the gate and the drain and thus a reduction in an effective electric field applied to the channel region, which results in a reduction in the off-current. This also results in a reduction in a characteristic variation. However, the LDD structure needs a complicated process in production. Another problem is an increase in device size. Besides, the available on-current becomes low. Thus, it is required to make optimization depending on the purpose.

Examples of liquid crystals usable herein include a TN liquid crystal (nematic liquid crystal used in a TN mode in the active matrix addressing scheme), STN (super twisted nematic) liquid crystal, GH (guest-host) liquid crystal, PC (phase change) liquid crystal, FLC (ferroelectric liquid crystal), AFLC (antiferroelectric liquid crystal), and PDLC (polymer-dispersed liquid crystal), wherein liquid crystals of these types for use in various modes are available.

Second Example of a Process of Producing an LCD

A second example of a sequence of processing steps of producing an LCD (Liquid Crystal Display) using a polycrystalline silicon MOSTFT formed via a low-temperature process is described below (this sequence of processing steps may also be used to produce an organic EL or FED that will be described later).

In this example, instead of the substrate 61 used in the first example, a substrate made of aluminoborosilicate glass or borosilicate glass is used, and the processing steps shown in FIGS. 10A and 10B are performed. That is, a polycrystalline silicon film 67 is formed on the substrate 61 by means of catalytic CVD and focused-light annealing, and the polycrystalline silicon film 67 is patterned into the form of islands. Thereafter, an nMOSTFT is formed in a display area and an nMOSTFT and a pMOSTFT are formed in a peripheral circuit area. In the above process, regions for other elements such as a diode, a capacitor, an inductor, and a resistor are also formed. As in the first example, the following process described below is concerned with MOSTFTs, the process described below may also be applied to production of other elements.

Figure 13A:
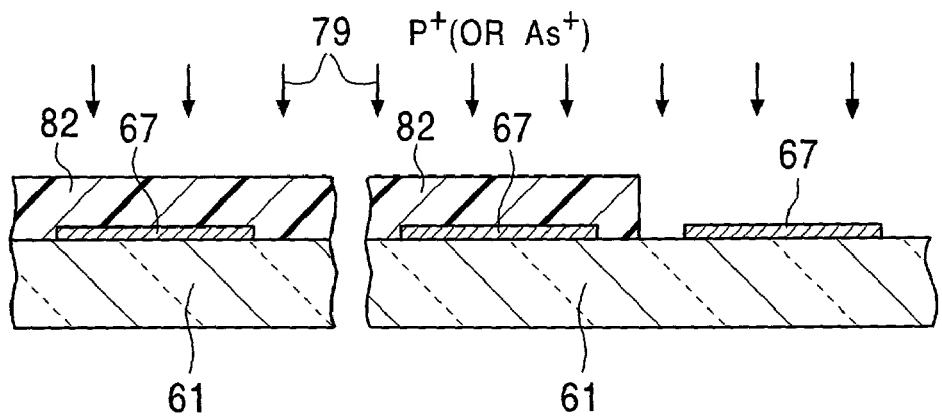
FIGS. 13A to 13G are cross-sectional views illustrating processing steps of producing an LCD according to an embodiment of the present invention.
Figure 13B:
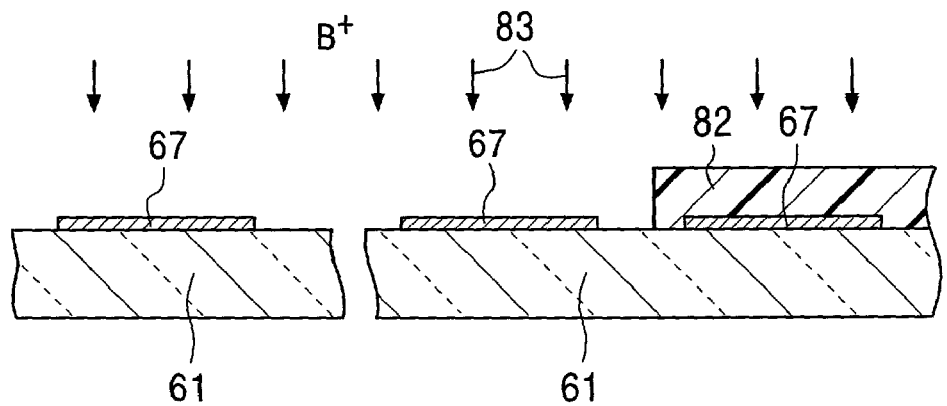

Thereafter, as shown in FIG. 13A, in order to control $V_{th}$ to a proper value by controlling the carrier impurity concentration of the gate channel region of each MOSTFT, an nMOSTFT in the display area and an nMOSTFT in the peripheral circuit area are covered with a photoresist 82, and a dose of $1\times10^{12}$ atoms/cm$^2$ of n-type impurity such as phosphorus or arsenic 79 is doped into a pMOSTFT area in the peripheral circuit area by means of ion implantation or ion doping so that the doped portion has a donor concentration of $2\times10^{17}$ atoms/cc. Thereafter, as shown in FIG. 13B, the pMOSTFT area in the peripheral circuit area is covered with a photoresist 82, and the nMOSTFT area in the display area and the nMOSTFT area in the peripheral circuit area are doped with a p-type impurity 83 such as boron at a dose of $5\times10^{11}$ atoms/cm$^2$ by means of ion implantation or ion doping such that the these regions have an acceptor concentration of $1\times10^{17}$ atoms/cc.

Figure 13C:
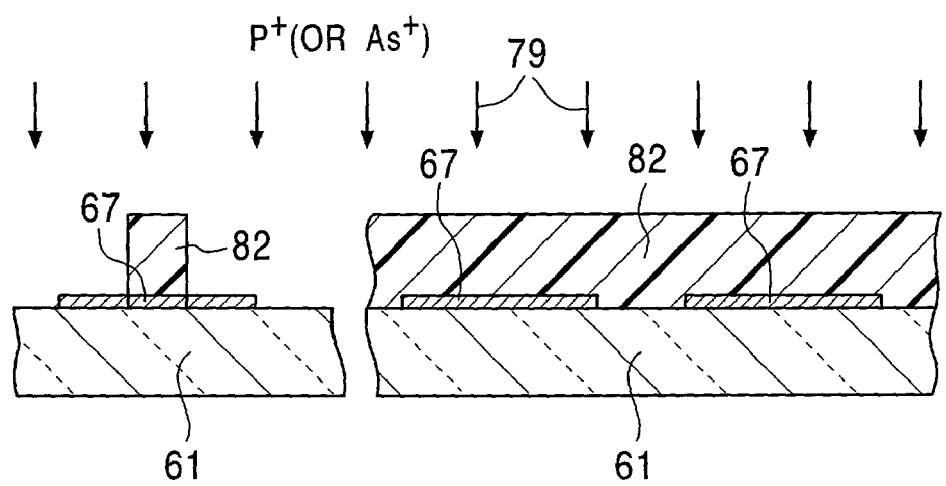

Thereafter, as shown in FIG. 13C, in order to improve the switching performance, an n$^-$-type LDD (Lightly Doped Drain) portion is formed in the nMOSTFT as described below. Using a photolithographic process well known in the art, the gate region of the nMOSTFT in the display area and the whole pMOSTFT area and the whose nMOSTFT area in the peripheral circuit area are covered with a photoresist 82, and the exposed source/drain regions in the display area are doped with an n-type impurity 79 such as phosphorus by means of ion implantation or ion doping at a dose of $1\times10^{13}$ atoms/cm$^2$ such that the doped regions have a donor concentration of $2\times10^{18}$ atoms/cc thereby forming the n$^-$-type LDD portion.

Figure 13D:
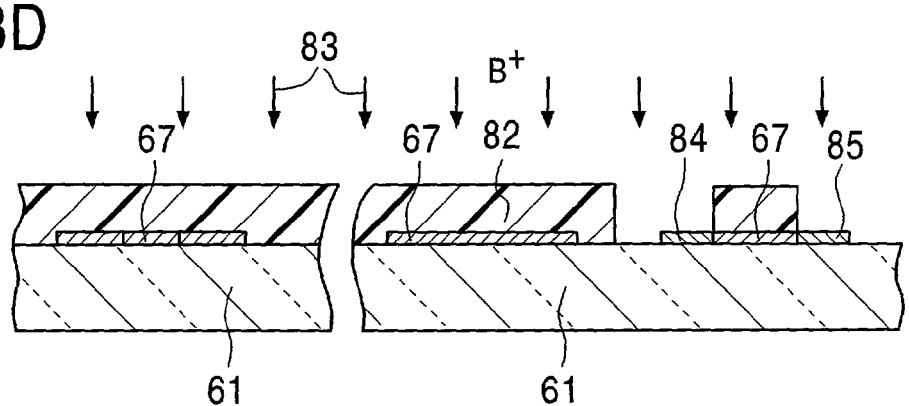

Thereafter, as shown in FIG. 13D, the entire nMOSTFT area in the display area and the entire nMOSTFT area in the peripheral circuit area are covered with a photoresist 82 and the gate region of the pMOSTFT in the peripheral circuit area is also covered with the photoresist 82. The source/drain regions exposed without being covered with the photoresist 82 are doped with a p-type impurity 83 such as boron at a dose of $1\times10^{15}$ atoms/cm$^2$ by means of ion implantation or ion doping, thereby forming a p$^+$-type source region 84 and drain region 85 with an acceptor concentration of $2\times10^{20}$ atoms/cc.

Figure 13E:
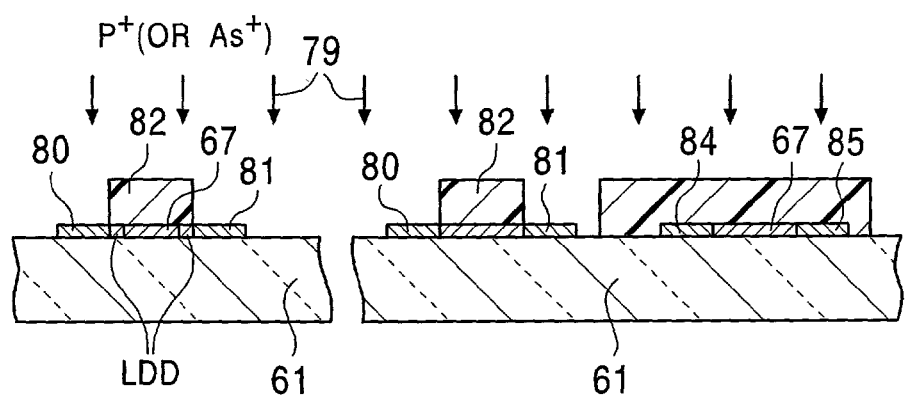

Thereafter, as shown in FIG. 13E, the pMOSTFT area in the peripheral circuit area is covered with a photoresist 82 and the gate region and the LDD portion of the nMOSTFT in the display area and the gate region of the nMOSTFT in the peripheral circuit area are also covered with the photoresist 82. The exposed source/drain regions of the nMOSTFTs in the display area and peripheral circuit area are doped with an n-type impurity 79 such as phosphorus or arsenic by means of ion implantation or ion doping at a dose of $1\times10^{15}$ atoms/cm$^2$, thereby forming an n$^+$-type source region 80 and drain region 81 with a donor concentration of $2\times10^{20}$ atoms/cc.

Figure 13F:
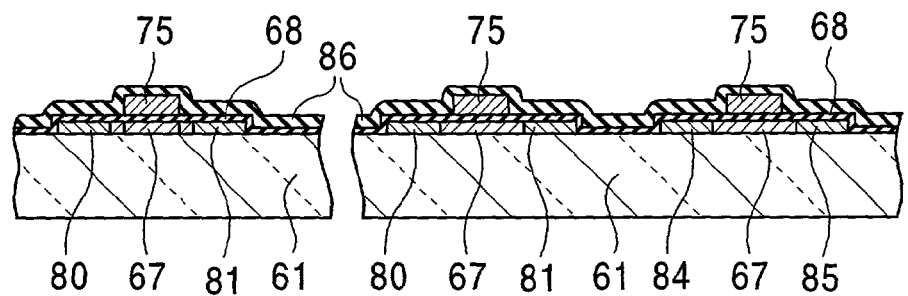

Thereafter, as shown in FIG. 13F, a multilayer film serving as a gate insulating film 68 consisting of a silicon oxide layer with a thickness of 40 to 50 nm, a silicon nitride layer with a thickness of 10 to 20 nm, and a silicon oxide layer with a thickness of 40 to 50 nm is formed by means of plasma-enhanced CVD, reduced-pressure CVD, or catalytic CVD. RTA processing is then performed using a halogen lamp or the like at about 1000° C. for 10 to 20 sec thereby activating the doped n-type and p-type impurities such that the doped regions have desired carrier concentrations.

Thereafter, a film of aluminum containing 1% silicon is formed to a thickness of 400 to 500 nm over the entire surface by means of sputtering. The film is then patterned by means a photolithographic process and an etching process well known in the art so as to form a gate electrode 75 of each MOSTFT and to form gate lines. Thereafter, a multilayer insulating film 86 consisting of a silicon oxide layer with a thickness of 100 to 200 nm and a phosphosilicate glass (PSG) layer with a thickness of 200 to 300 nm is formed by means of plasma-enhanced CVD, catalytic CVD, or the like.

Thereafter, by means of a photolithographic process and an etching process well known in the art, windows are formed at locations corresponding to the source/drain regions of all MOSTFTs in the peripheral circuit area and the source region of the nMOSTFT in the display area. In this process, the silicon nitride film may be plasma-etched using $CF_4$, and the silicon oxide film and the phosphosilicate glass film may be etched using a hydrofluoric acid-based etchant.

Figure 13G:
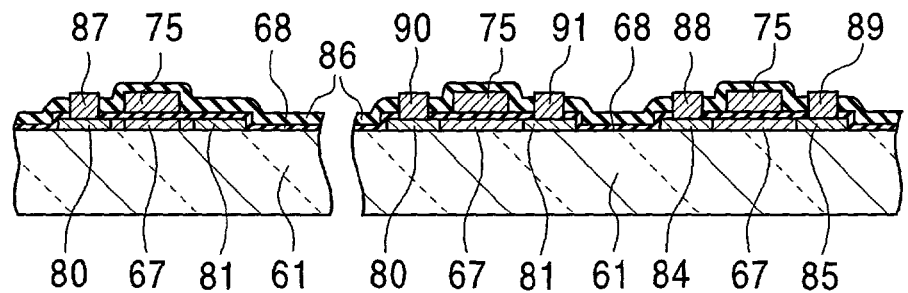

Thereafter, as shown in FIG. 13G, a film of aluminum containing 1% silicon is formed to a thickness of 400 to 500 nm over the entire surface by means of sputtering. Then, by means of a photolithographic process and an etching process, source/drain regions 88, 89, 90, and 91 of all MOSTFTs in the peripheral circuit area, the source electrode 87 of the nMOSTFT in the display area, and data lines are formed.

Thereafter, although not shown in the figure, a silicon oxide film with a thickness of 100 to 200 nm, a phosphosilicate glass (PSG) film with a thickness of 200 to 300 nm, a silicon nitride film with a thickness of 100 to 300 nm are formed over the entire surface by means of plasma-enhanced CVD, reduced-pressure CVD, or analytic CVD. Hydrogenation and sintering are then performed in an ambient of a forming gas at about 400° C. for 1 hour. A contact hole for the drain region of the nMOSTFT in the display area is then formed.

In the above process, in the case where the passivation silicon nitride film containing a large amount of hydrogen is formed to a thickness of 500 to 600 nm by means of plasma-enhanced CVD, if hydrogenation is performed in an ambient of nitrogen or a forming gas at 420° C. for 30 min, then hydrogen is diffused in the passivation silicon nitride film and thus interface characteristics are improved, and the crystal quality of the polycrystalline silicon film is improved because the dangling bonds are bound with hydrogen. As a result, an increase in carrier mobility is achieved. The silicon nitride film can act as a block against hydrogen. Therefore, the effects of hydrogenation can be enhanced by sandwiching the polycrystalline silicon film between silicon nitride films thereby confining hydrogen between the silicon nitride films as is the case in the present embodiment. More specifically, it is preferable that films be formed into a multilayer structure consisting of a glass substrate/a silicon nitride film for blocking Na ions and for protection+a silicon oxide film/a polycrystalline silicon film/a gate insulating film (silicon oxide film)/gate electrode/a silicon oxide film and a silicon nitride film for passivation (this structure is also desirable in other embodiments). In this structure, when hydrogenation is performed, the aluminum alloy film containing 1% silicon and silicon in the source/drain regions are sintered at the same time, and ohmic contacts are formed.

In the case where the LCD is of the transmissive type, the silicon oxide film, the phosphosilicate glass film, and the silicon nitride film in the pixel window area are removed. In the case where the LCD is of the reflective type, the silicon oxide film, the phosphosilicate glass film, and the silicon nitride film in the pixel window area are not needed to be removed (this is also true in the LCDs described elsewhere).

In the case of a transmissive LCD, as shown in FIG. 10J, a transparent acrylic resin film for planarization is formed to a thickness of 2 to 3 µm by means of a spin coating technique, and a window is formed in the transparent resin film at a location corresponding to the drain of the MOSTFT in the display area by means of a photolithographic process and an etching process well known in the art. An ITO film with a thickness of 130 to 150 nm is then formed on the entire surface by means of sputtering. Thereafter, by means of a photolithographic process and an etching process well known in the art, the ITO film is patterned so as to form a transparent ITO electrode connected to the drain of the nMOSTFT in the display area. Thereafter, a heat treatment is performed (in an ambient of a forming gas at a temperature 200 to 250° C. for 1 hour) thereby reducing the contact resistance and increasing the transparency of the ITO film.

In the case of the LCD is of the reflective type, a photosensitive resin film with a thickness of 2 to 3 µm is formed on the entire surface by means of a spin coating technique. Thereafter, by means of a photolithographic process and an etching process well known in the art, a pattern including alternately raised and recessed steps is formed at least in the pixel area. Reflowing is then performed thereby forming a lower alternately-raised-and-recessed step reflector. At the same time, a window is formed in the photosensitive resin film at a location corresponding to the drain of the nMOSTFT in the display area. Thereafter, a film of aluminum containing 1% silicon is formed to a thickness of 300 to 400 nm over the entire surface by means of sputtering. Using a photolithographic process and an etching process well known in the art, the aluminum film is removed except for the pixel area, thereby forming a alternately-raised-and-recessed aluminum reflector connected to the drain electrode of the nMOSTFT in the display area. Thereafter, sintering is performed in an ambient of a forming gas at 300° C. for 1 hour.

In the above process, if focused-light annealing is performed after forming the source/drain regions of nMOSTFTs, the film temperature of the low-crystal-quality silicon film is locally increased, and thus crystallization is enhanced. As a result, a high-quality polycrystalline silicon film exhibiting a high carrier mobility can be obtained. In this case, impurities such as phosphorus, arsenic, or boron doped in the gate channel regions, the source regions, and the drain regions are activated, and thus the productivity is improved.

Bottom-Gate MOSTFT and Dual-Gate MOSTFT

In the LCD or other devices including the top-gate MOSTFT, the top-gate MOSTFT may be replaced with a bottom-gate MOSTFT or a dual-gate MOSTFT. A specific example of a transmissive LCD including such a type MOSTFT is described below (a reflective LCD including such a type MOSTFT may also be produced).

Figure 14B:
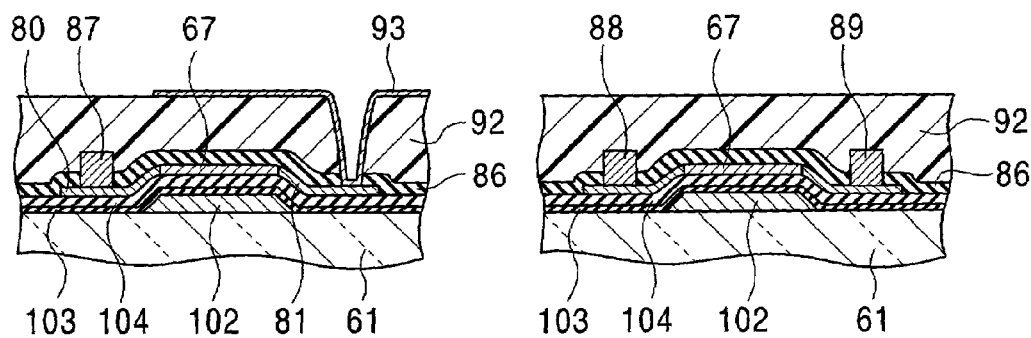
Figure 14C:
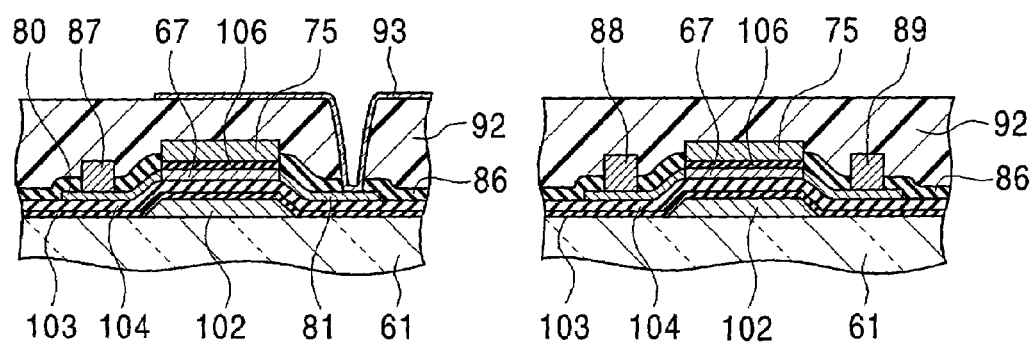

In the example shown in FIG. 14B, bottom-gate nMOSTFTs are formed in the display area and the peripheral circuit area. In the example shown in FIG. 14C, dual-gate nMOSTFTs are formed in the display area and the peripheral circuit area. If MOSTFTs are formed into the dual-gate type, the presence of upper and lower gates results in an increase in the driving ability, which allows an increase in switching speed. If desired, one of the upper and lower gates of a dual-gate MOSTFT may be selectively used such that the MOSTFT acts as a top-gate or bottom-gate MOSTFT.

In the bottom-gate MOSTFT shown in FIG. 14B, reference numeral 102 denotes a gate electrode made of a heat-resistant material such as a Mo—Ta alloy. Reference numeral 103 denotes a silicon nitride film, and reference numeral 104 denotes a silicon oxide film, which form a bottom-gate insulating film. On the gate insulating film, a channel region is formed using a polycrystalline silicon film 67 similar to that used in the top-gate MOSTFT. In the dual-gate MOSTFT shown in FIG. 14C, the bottom-gate portion is formed in a similar fashion to the bottom-gate MOSTFT. The top-gate portion is constructed by forming a gate insulating film 106 consisting of a silicon oxide film and a silicon nitride film and forming a top-gate electrode 75 thereon.

Production of a Bottom-Gate MOSTFT

First, a film of a heat-resistant material such as a Mo—Ta alloy is formed to thickness of 300 to 400 nm on the entire surface of a glass substrate 61 by means of sputtering. The film is then taper-etched at an angle of 20 to 45°, by means of a photolithographic process and an etching process well known in the art, so as to form a bottom-gate electrode 102 at least in an area where a TFT is to be formed and form a gate line. The glass material of the substrate 61 is selected in a similar manner to the top-gate MOSTFT described above.

Thereafter, a silicon nitride film 103 and a silicon oxide film 104 serving as a gate insulating film and a protective film and an amorphous/microcrystalline silicon film 67A that may or may not tin are formed by means of vapor deposition such as plasma-enhanced CVD, catalytic CVD, or reduced-pressure CVD. Then, focused-light annealing is performed to convert the amorphous/microcrystalline film 67A into a polycrystalline silicon film 67. In the above process, the vapor deposition conditions may be similar to those employed for the top-gate MOSTFT descried above. The silicon nitride film serving as the bottom-gate insulating film and as the protective film prevents intrusion of Na ions into the gate region from the glass substrate. When a substrate made of quartz glass is used, the silicon nitride film is not necessarily needed.

Thereafter, in a similar manner in the previous examples described above, islands for pMOSTFT and nMOSTFT regions are formed by means of a photolithographic process and an etching process well known in the art (only one island is shown in the figure). Thereafter, an n-type or p-type impurity is doped by means of ion implantation or ion doping at a proper dose such that each channel region has an impurity concentration corresponding to an optimum value of $V_{th}$. Furthermore, n-type or p-type impurity is doped into source/drain regions of respective MOSTFTs by means of ion implantation or ion doping at a proper dose. Annealing for activating the impurities is then performed by means of RTA or the like.

The following processing steps are performed in a similar manner as in the previous examples described above.

Production of a Dual-Gate MOSTFT

In a similar manner as in the bottom-gate MOSTFT, a bottom-gate electrode 102, bottom-gate insulating films 103 and 104, and a film 67 of polycrystalline silicon that may or may not include tin are formed. However, the silicon nitride film 103 serving as the bottom-gate insulating film and as the protective film for preventing intrusion of Na ions from the glass substrate is not necessarily needed if the substrate is made of synthesis quartz glass.

Thereafter, as in the previous examples described above, islands for pMOSTFT and nMOSTFT regions are formed by means of a photolithographic process and an etching process well known in the art. Thereafter, an n-type or p-type impurity is doped by means of ion implantation or ion doping at a proper dose such that each channel region has an impurity concentration corresponding to an optimum value of $V_{th}$. Furthermore, n-type or p-type impurity is doped into source/drain regions of respective MOSTFTs by means of ion implantation or ion doping at a proper dose. Annealing for activating the impurities is then performed by means of RTA or the like.

Thereafter, a silicon oxide film and a silicon nitride film is deposited thereby forming a top-gate insulating film 106. In the above process, vapor deposition conditions may be similar to those employed in production of the top-gate MOSTFT.

Thereafter, a film of aluminum containing 1% silicon is formed to a thickness of 400 to 500 nm over the entire surface by means of sputtering. The film is then patterned by means a photolithographic process and an etching process well known in the art so as to form a gate electrode 75 of each MOSTFT and to form gate lines. Thereafter, a multilayer insulating film 86 consisting of a silicon oxide layer with a thickness of 100 to 200 nm, a phosphosilicate glass (PSG) layer with a thickness of 200 to 300 nm, and a silicon nitride layer with a thickness of 100 to 200 nm is formed by means of plasma-enhanced CVD, catalytic CVD, or the like. Thereafter, by means of a photolithographic process and an etching process well known in the art, windows are formed in the multilayer insulating film 86 at locations corresponding to the source/drain electrodes of each MOSTFT in the peripheral circuit area and the source electrode of the nMOSTFT in the display area.

Thereafter, a film of aluminum containing 1% silicon is formed to a thickness of 400 to 500 nm over the entire surface by means of sputtering. Furthermore, by means of a photolithographic process and an etching process well known in the art, aluminum source/drain electrodes 87 and 88 of each MOSTFT in the peripheral circuit area, an aluminum electrode 89 of the nMOSTFT in the display area, a source line, and an interconnection are formed. Thereafter, hydrogenation and sintering are performed in an ambient of a forming gas at about 400° C. for 1 hour.

In the present embodiment as in the first embodiment, by using a vapor deposition process such as catalytic CVD or plasma-enhanced CVD and the focused-light annealing process, it is possible to easily produce a low-resistance polycrystalline silicon film for forming a gate channel region, a source region, and a drain region of a MOSTFT used in a display unit or a peripheral driver circuit, wherein the low resistance of the polycrystalline silicon film allows a high-speed operation. A liquid crystal display can be produced using MOSTFTs of the top-gate, bottom-gate, or dual-gate type, formed using the above polycrystalline silicon film, wherein a display unit including an LDD-MOSTFT having a high switching performance and having low leakage and other peripheral circuits including a high-performance driver circuit, a video signal processing circuit, and a memory can be integrated on a single substrate. Thus, it is possible to produce a high-performance low-cost liquid crystal panel having a narrow frame and being capable of displaying a high-precision and high-quality image.

Because polycrystalline silicon films and MOSTFTs using such a polycrystalline silicon film according to the present embodiment can be performed at a low temperature (300 to 400° C.), low strain point glass can be used as a material of a substrate. This makes it possible to use an inexpensive substrate having a large size, and thus a reduction in cost can be achieved. Furthermore, by forming a color filter and a black mask in the pixel array area, it is possible to improve the aperture ratio and the brightness of the liquid crystal panel. In this case, an additional color filter becomes unnecessary, and thus an improvement in productivity and a further reduction in cost can be achieved.

Third Example of a Process of Producing an LCD

Another example of a sequence of processing steps of producing an active matrix LCD is described below with reference to FIGS. 15 to 17.

Figure 15A:
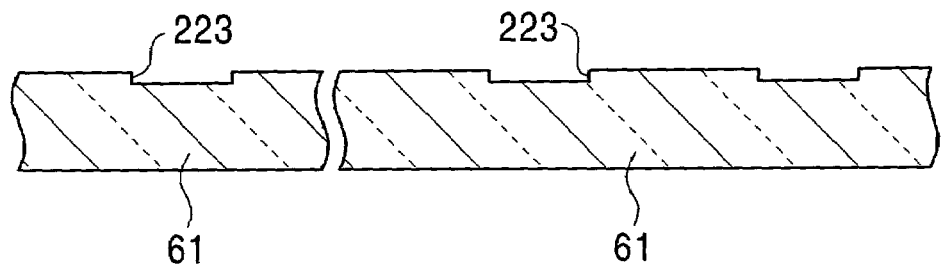
FIGS. 15A to 15C are cross-sectional views illustrating anther example of a sequence of processing steps of producing an LCD.

First, as shown in FIG. 15A, a photoresist having a predetermined pattern is formed, at least in areas where TFTs are to be formed, on one principal surface of an insulating substrate 61 made of borosilicate glass, aluminosilicate glass, quartz glass, or transparent crystallized glass. Using this photoresist as a mask, the substrate 61 is bombarded with $F^+$ ions in a $CF_4$ plasma thereby reactive-ion-etching the substrate 61 so as to form a plurality of recessed portions with a proper size and shape having steps 223.

The steps 223 will serve as seeds in graphoepitaxial growth of monocrystalline silicon as will be described later. The steps 223 may be formed such that the depth d is 0.01 to 0.03 μm, the width w is 1 to 5 μm, and the length (in a direction normal to the drawing sheet) is 5 to 10 μm and such that angles (basic angles) between the side walls and the bottom face is equal to 90°. To prevent intrusion of Na ions or the like from the glass substrate, a multilayer film consisting of a silicon nitride layer with a thickness of 50 to 200 nm and a silicon oxide film with a thickness of 300 to 400 nm may be formed on the surface of the substrate 1 before the above etching process, and the plurality of steps may be formed in the silicon oxide layer.

Figure 15B:
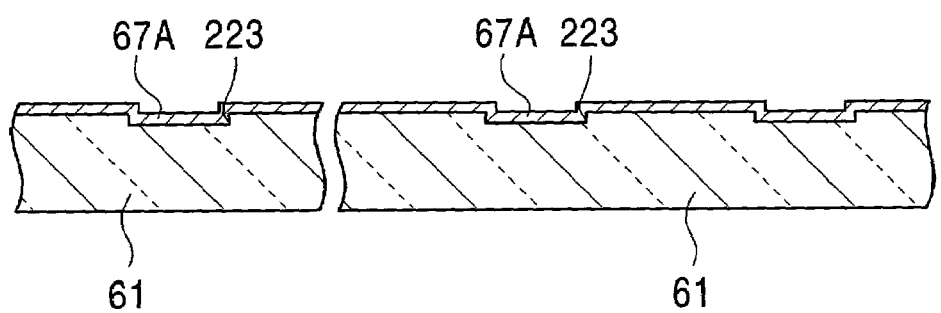

Then, after removing the photoresist, a low-crystal-quality silicon film 67A that may or may not contain tin or nickel is formed to a thickness of, for example, 100 nm over the entire one principal surface, including the steps 223, of the insulating substrate 61 by means of catalytic CVD, plasma CVD, or the like, as shown in FIG. 15B.

Figure 15C:
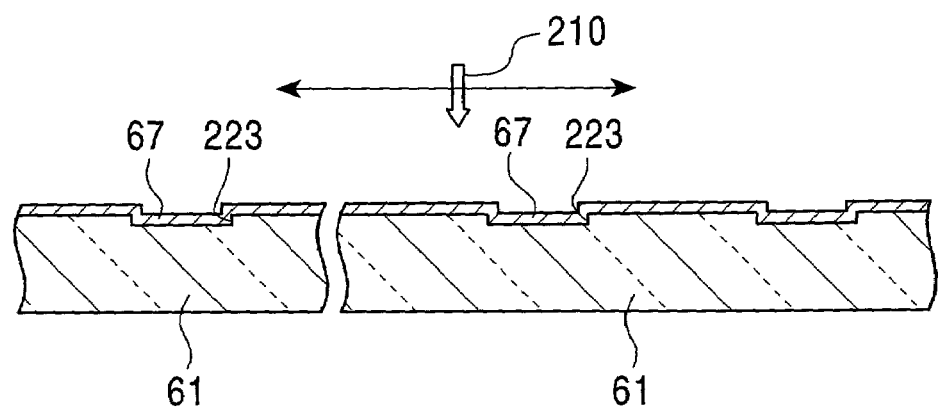

Thereafter, as shown in FIG. 15C, the low-crystal-quality thin silicon film 67A is illuminated with a focused light ray 210 so as to melt the low-crystal-quality thin silicon film 67A from region to region. When a melted region self-cools down, monocrystalline silicon graphoepitaxially grows from the lower edges of the recessed portions 223 acting as seeds for growth, thereby forming a monocrystalline thin film 67 not only in the recessed portions but also in areas outside the recessed portions. If desired, the step of forming a low-crystal-quality thin semiconductor film and the step of performing a focused-light annealing may be performed repeatedly to form monocrystalline semiconductor layers in a layer-on-layer fashion thereby forming a monocrystalline semiconductor film having a total thickness of the order of a few microns (film having such a large total thickness may also be formed in a similar manner in the examples described below).

Figure 16A:
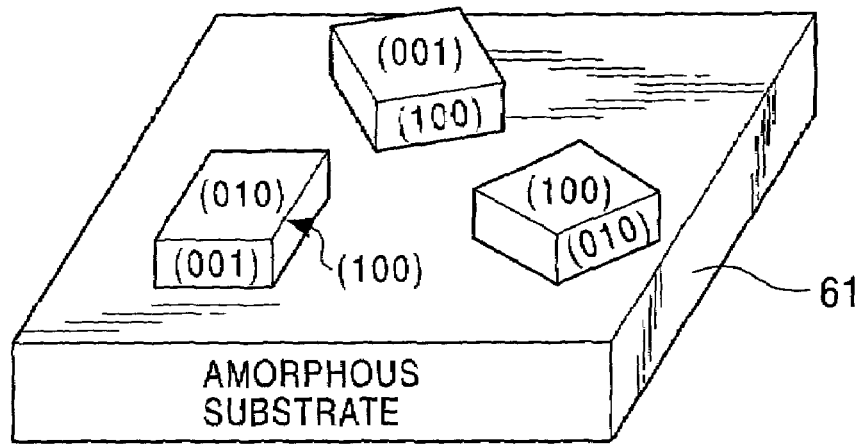
FIGS. 16A and 16B are diagrams illustrating a process of graphoepitaxial growth.
Figure 16B:
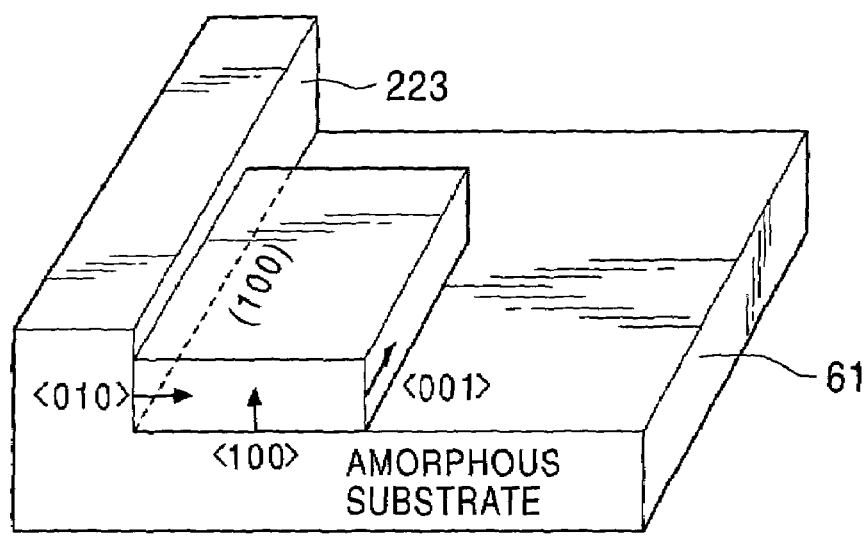
Figure 17A:
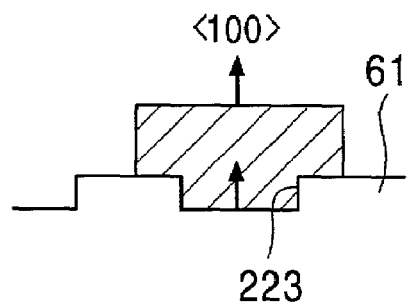
FIGS. 17A to 17F are cross-sectional views illustrating stepped recesses having various forms.
Figure 17B:
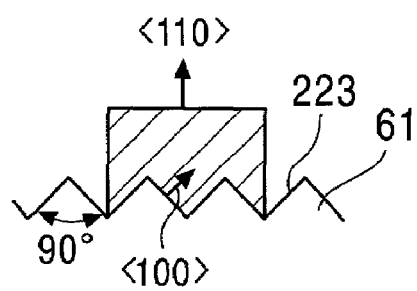
Figure 17C:
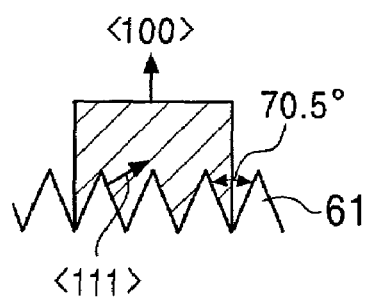
Figure 17D:
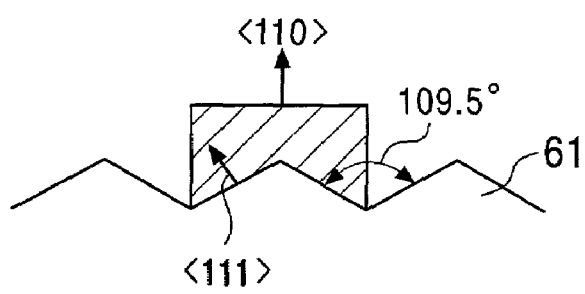
Figure 17E:
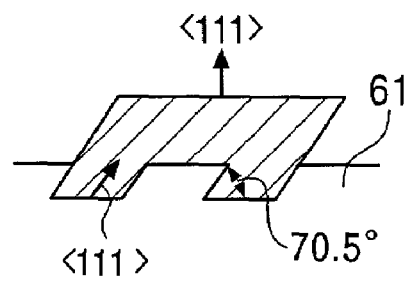
Figure 17F:
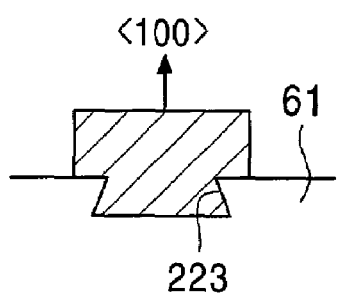

In the graphoepitaxial growth, a monocrystalline thin silicon film 67 grows, for example, in a <100> direction. In the graphoepitaxial growth process, a step 223 acts as a seed that enhances growth of monocrystalline silicon when high energy is applied via focused-light illumination, and thus the resultant monocrystalline thin silicon film 67 has high crystallinity (with a thickness of about 50 nm). More specifically, if there is a vertical wall such as a step 223 on an amorphous substrate (glass) 61 as shown in FIG. 16B, the vertical wall forces crystal growth to occur such that the grown crystal has a (100)-surface along the step 223. In contrast, when there is no steps on an amorphous substrate (glass) 61, crystal growth occurs in random directions as shown in FIG. 16A. By changing the shape of the step in various ways as shown in FIGS. 17A to 17F, it is possible to control the growth direction of the grown layer. When a MOS transistor is produced, the (100)-surface is generally employed. The step 223 may be formed such that the angle (basic angle) at the lower edge may be 90° or such that the wall of the step may be slanted inward or outward so that the orientation of the wall allows crystal growth to occur in a desired particular direction. In general, it is desirable that the basic angle of the step 223 be 90° or smaller than 90°. Furthermore, it is desirable that the bottom edge of the step 223 is slightly rounded.

After forming the monocrystalline thin silicon film 67 on the substrate 61 by means of graphoepitaxial growth during the focused-light annealing process, a top-gate MOSTFT is produced using the monocrystalline thin silicon film 67 with a thickness of 50 nm as an active layer, in a similar manner as described earlier.

The substrate 61 may be formed of a heat-resistant resin such as polyimide. In this case, steps 223 with a desired shape and size are formed in areas where TFTs are to be formed, and the production process is performed in a similar manner as descried above. More specifically, for example, a polyimide substrate with a thickness of 100 µm is stamped with a stamping die having a protrusion with a height of 0.03 to 0.05 µm, a width of 5 µm, and a length of 10 µm thereby forming a recess having a shape and size corresponding to the protrusion of the die. Alternatively, a film of a heat-resistant material such as polyimide with a thickness of 5 to 10 µm is formed on a metal plate such as a stainless steel plate serving as a reinforcing member, by means of coating, screen printing, or the like. The film is then stamped with a die having a desired protrusion having a size of, for example, 0.03 to 0.05 µm in height, 5 µm in width, and 10 µm in length, thereby forming a recess having a size and shape corresponding to the protrusion of the die, at least in an area where a TFT is to be formed. After that, a monocrystalline thin silicon film and then a MOSTFT are produced in a similar as described earlier.

In the present embodiment, as described above, after forming a recess with a step 223 having a desired shape and size on a substrate 61, a monocrystalline thin silicon film 67 is formed by means of graphoepitaxial growth that occurs using the step 223 as a crystal growth seed during a focused-light annealing process. The resultant monocrystalline thin silicon film 67 has a high carrier mobility, and thus it is possible to produce a high-performance circuit such as a driver circuit, a video processing circuit, or a memory, using the monocrystalline thin silicon film 67, in an integrated fashion on an LCD.

Fourth Example of a Process of Producing an LCD

Another example of a sequence of processing steps of producing an active matrix LCD is described below with reference to FIGS. 18A to 18C.

Figure 18A:
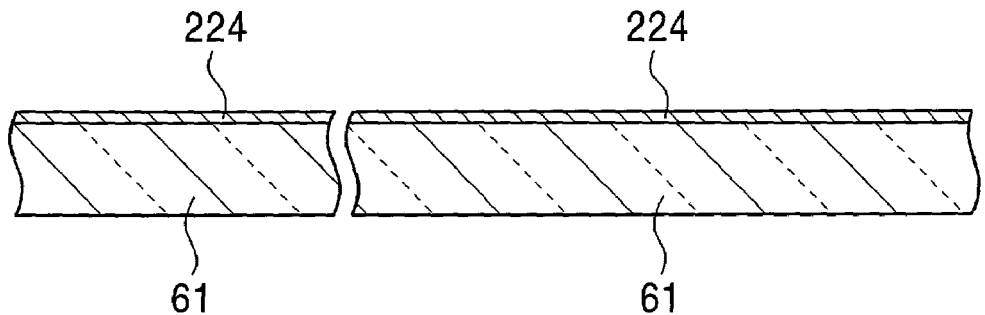
FIGS. 18A to 18C are diagrams illustrating another example of a sequence of processing steps of producing an LCD.

First, as shown in FIG. 18A, a crystalline thin sapphire film 224 well lattice-matched with monocrystalline silicon is formed to a thickness of 10 to 200 nm on one principal surface of an insulating substrate 61, at least in an area where a TFT is to be formed. The crystalline thin sapphire film 224 may be formed, for example, by oxidizing trymethyl aluminum gas or the like by an oxidizing gas (oxygen or water) by means of high-density plasma CVD, catalytic CVD, or the like. The insulating substrate 61 may be of quartz glass, crystallized glass, borosilicate glass, aluminosilicate glass, or the like.

Figure 18B:
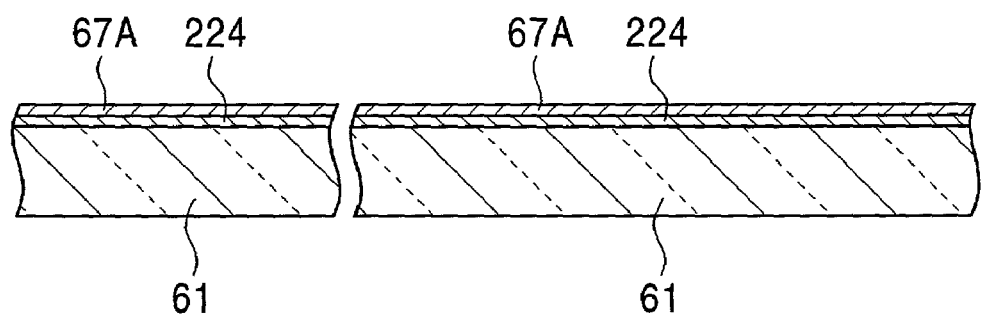

Thereafter, as shown in FIG. 18B, a low-crystal-quality silicon film 67A is formed to a thickness of, for example, 100 nm on the crystalline thin sapphire film 224, by means of catalytic CVD, plasma-enhanced CVD, or the like.

Figure 18C:
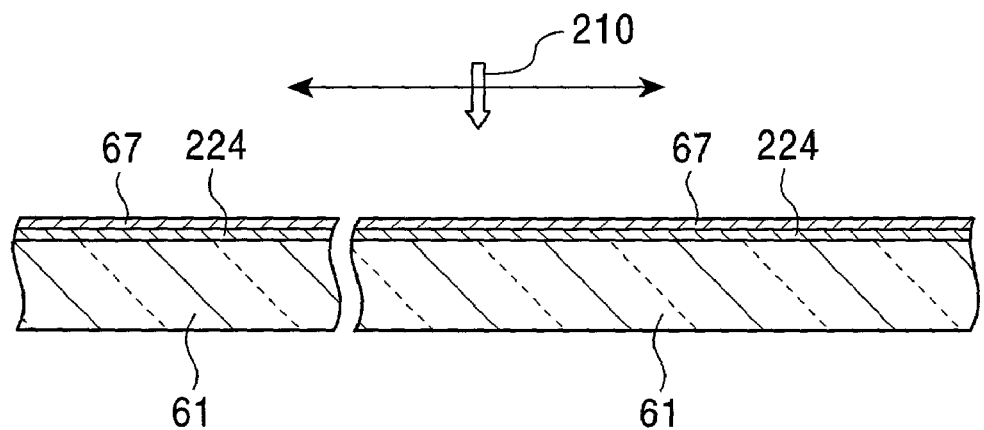

Thereafter, as shown in FIG. 18C, focused-light annealing is performed by illuminating the low-crystal-quality thin silicon film 67A with a focused-light ray 210, so to melt and then slowly cool the low-crystal-quality thin silicon film 67A so that heteroepitaxial growth occurs using the crystalline thin sapphire film 224 as a growth seed thereby obtaining a monocrystalline thin silicon film 67. Because the crystalline sapphire film 224 is well lattice-matched with monocrystalline silicon, the crystalline sapphire film 224 can act as a growth seed, and thus monocrystalline silicon with a (100)-surface can heteroepitaxially grow during the focused-light annealing process. In the above process, if, after forming a step similar to the above-described step 223, the crystalline thin sapphire film 224 is formed, then the graphoepitaxial effect provided by the step 223 is added to the heteroepitaxial process, and a monocrystalline thin silicon film 67 having still higher crystallinity can be obtained. If desired, the step of forming a low-crystal-quality thin semiconductor film and the step of performing a focused-light annealing may be performed repeatedly.

After forming the monocrystalline thin silicon film 67 on the substrate 61 by means of heteroepitaxy during the focused-light annealing process, a MOSTFT of, for example, top-gate type is produced using the monocrystalline thin silicon film 67 (with a thickness of about 50 nm) in a similar manner as descried above.

According to the present embodiment, as described above, it is possible to obtain a monocrystalline thin silicon film 67 having a high carrier mobility by heteroepitaxially growing monocrystalline silicon on a monocrystalline thin sapphire film 224, serving as a growth seed, formed on a substrate 61 via a melting and slow cooling process during focused-light annealing. Furthermore, it is possible to produce a high-performance circuit such as a driver circuit, a video signal processing circuit, or a memory, in an integrated fashion on an LCD.

The crystalline thin sapphire film 224 can act as a diffusion barrier layer against various kinds of atoms. This prevents diffusion of impurities from the glass substrate 61. Because the crystalline thin sapphire film is capable of blocking Na ions, at least the silicon nitride film of the protective films is not necessarily needed if the crystalline sapphire film has a sufficiently large thickness.

Instead of the crystalline sapphire film, another similar film may be used. Specific examples of materials for such a film include a material having a spinel structure, calcium fluoride, strontium fluoride, barium fluoride, boron phosphide, yttrium oxide, and zirconium oxide. The film may be formed of one or more materials selected from the above-described materials.

Third Embodiment

In this third embodiment, the present invention is applied to an organic or inorganic electroluminescence (EL) display. An example of a structure of such a display and an example of a sequence of production steps are described below. Although the MOSTFT is assumed to be of the top-gate type in the examples described below, the other types of MOSTFTs such as the bottom-gate type or the dual-gate type are also possible.

First Example of Structure of an Organic EL Device

FIGS. 19A and 19B illustrate a first example of the structure of an organic EL device. In this structure, a high-crystallinity large-grain polycrystalline silicon film (although a monocrystalline film is employed herein by way of example and also in the following examples, a monocrystalline silicon film may also be employed) is formed on a substrate 111 such as a glass substrate, and gate channel regions 117, source regions 120, and drain regions 121 of a switching MOSTFT-1 and a current driving MOSTFT-2 are formed in the polycrystalline silicon film. Furthermore, gate electrodes 115 are formed on the gate insulating films 118, and source electrodes 127 and drain electrodes 128 and 131 are formed on the source and drain regions. The drain of the MOSTFT-1 and the gate of the MOSTFT-2 are connected to each other via the drain electrode 128, and a capacitor C is formed between the drain of the MOSTFT-1 and the source electrode 127 of the MOSTFT-2 via an insulating film 136. The drain electrode 131 of the MOSTFT-2 extends so as to be connected with the cathode 138 of the organic EL device. In order to improve the switching characteristic, an LDD portion may be formed in the switching MOSTFT-1.

Each MOSTFT is covered with an insulating film 130. A green light emitting organic layer 132 (or a blue light emitting organic layer 133 or a red light emitting organic layer not shown in the figure) of the organic EL device is formed on the insulating film 130 such that the cathode is covered with the green light emitting organic layer 132. An anode (first layer) 134 is formed such that the light emitting organic layer is covered with the anode. Furthermore, a common anode (second layer) 135 is formed over the entire surface. A peripheral driver circuit, a video signal processing circuit, and a memory are formed using CMOSTs in a similar manner as in the liquid crystal display described above (such circuits may also be formed in the examples described below).

In this structure, the organic EL layer in the organic EL display portion is connected to the drain of the current driving MOSTFT-2, and the cathode (Li—Al, Mg—Ag, or the like) 138 is deposited on the surface of the substrate 111, and the anodes (ITO films) 134 and 135 are formed thereon. Thus, in this structure, light 136 is emitted from the upper side. In the case where MOSTFTs are covered with the cathode, a large light emitting area can be achieved. In this case, the cathode serves as a light shield film that prevents emitted light from being incident on the MOSTFTs thereby ensuring that the leakage current is suppressed to a very low level and no degradation in characteristics of TFTs occurs.

By forming a black mask (chromium, chromium dioxide, or the like) 140 in a peripheral area of each pixel as shown in FIG. 19C, it is possible to prevent undesirable leakage of light (crosstalk), and high contrast can be obtained.

A full-color organic EL display can be realized by forming three-color light emitting layers, that is, green light emitting layers, blue light emitting layers, and red light emitting layers, in the pixel areas, or using a color conversion layer, or combining a color filter with a white color light emitting layer. The light emitting materials of respective colors may also be formed by spin-coating a macromolecular compound or vacuum-evaporating a metal complex. Also in this case, a full-color organic EL part having high reliability, high quality, high precision, and a long life time can be produced in a highly productive fashion, and thus a reduction in cost can be achieved (this is also true in the examples described below).

Figure 20A:
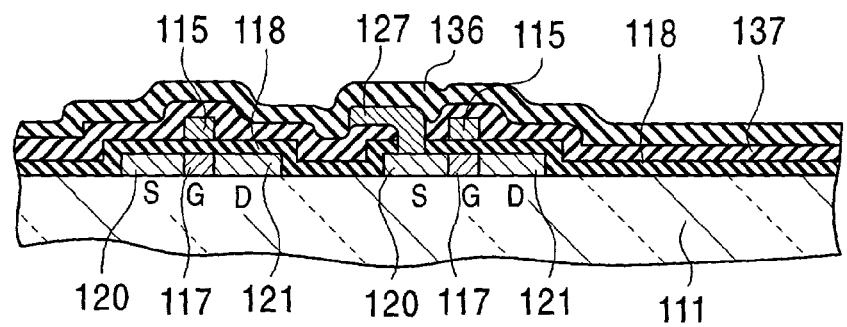
FIGS. 20A to 20D are diagrams illustrating an example of a sequence of processing steps of producing the organic EL display.

An example of a sequence of processing steps of producing the organic EL device is described below. First, as shown in FIG. 20A, after forming source regions 120, channel regions 117, and drain regions 121 using a polycrystalline silicon film formed via the above-descried processing steps, a gate insulating film 118 is formed, and gate electrodes 115 of a MOSTFT-1 and a MOSTFT-2 are formed thereon by sputtering a Mo—Ta alloy or the like in conjunction with a photolithographic process and an etching process well known in the art. A gate line connected to the gate electrode of the MOSTFT-1 is formed by means of sputtering in conjunction with a photolithographic process and an etching process well known in the art (this processing step may also be employed in the examples described below). Thereafter, an overcoat film (such as a silicon oxide film) 137 is formed by means of a vapor deposition technique such as catalytic CVD (this processing step may also be employed in the examples described below). A source electrode 127 of the MOSTFT-2 and a ground line are then formed. Furthermore, an overcoat film (multilayer film of silicon oxide/silicon nitride) 136 is formed, and the n-type or p-type impurity doped by means of ion doping is activated by performing an RTA (Rapid Thermal Anneal) process using a halogen lamp or the like (for example, at 1000° C. for 30 sec).

Figure 20B:
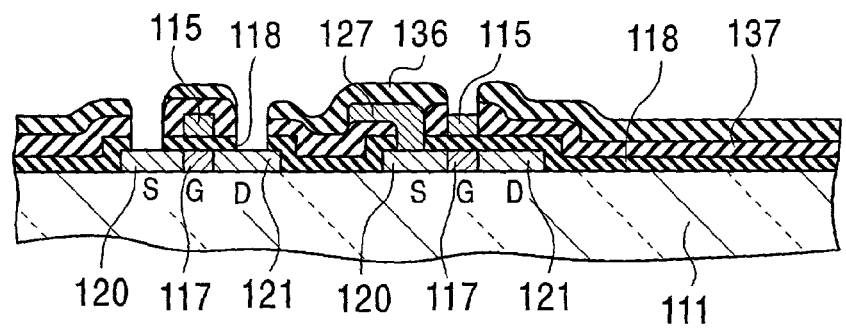
Figure 20C:
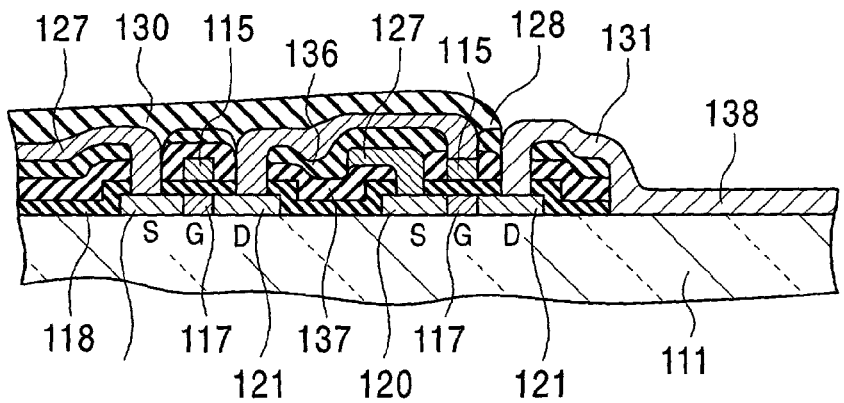

Thereafter, as shown in FIG. 20B, windows are formed at locations corresponding to the source/drain regions of the MOSTFT-1 and the gate region of the MOSTFT-2. Thereafter, as shown in FIG. 20C, a film of aluminum containing 1% silicon is formed by means of sputtering and patterned using a photolithographic process and an etching process well known in the art such that the drain electrode of the MOSTFT-1 and the gate electrode of the MOSTFT-2 are connected to each other via the interconnection 128 formed of aluminum containing 1% silicon and such that, at the same time, a source electrode of the MOSTFT-1 and a source line connected to this source electrode are formed of aluminum containing 1% silicon. Thereafter, an overcoat film (silicon oxide/phosphosilicate glass/silicon nitride) 122, and a window is formed at a location corresponding to the drain of the MOSTFT-2. A cathode 138 connected to the drain of the MOSTFT-2 is then formed in a light emitting area.

Figure 20D:
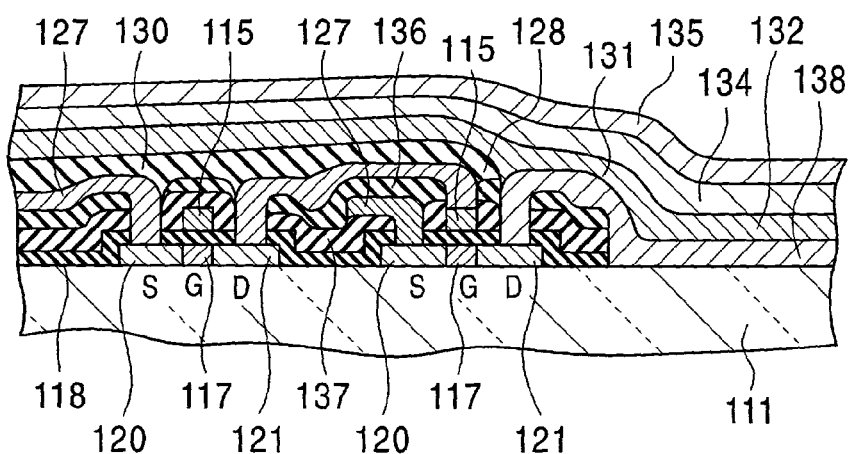

Thereafter, as shown in FIG. 20D, an organic light emitting layer 132 and anodes 134 and 135 are formed.

In a conventional active matrix organic EL display integrated with a peripheral driver circuit, a pixel is specified by an X signal line and a Y signal line, and a switching MOSTFT at the specified pixel is turned on. As a result, image data is stored in a signal storage capacitor at that pixel. Thus, a current control MOSTFT is turned on and a bias current corresponding to the image data is supplied to the organic EL device via a power line, thereby emitting light. However, when MOSTFTs are formed of amorphous silicon, their $V_{th}$ can vary, and thus the current can vary in response to the changes in $V_{th}$. This results in a change in image quality. Besides, the low carrier mobility limits the maximum current that can be driven at a high speed. A still another problem is that difficulty in formation of a p-channel makes it difficult to form a CMOS circuit even if the circuit complexity of the CMOS circuit is low.

In contrast, as described above, the technique according to the present invention makes it possible to produce a large-sized polycrystalline silicon TFT having high reliability and high carrier mobility, which can be used to produce a CMOS circuit.

In this technique, the green (G) light emitting organic EL layer, the blue (B) light emitting organic EL layer, and the red (R) light emitting organic EL layer are formed to a thickness of 100 to 200 nm by means of a vacuum evaporation technique in the case where the organic EL layers are formed of a low-molecular compound or by means of, in the case where a macromolecular compound is used, a coating technique such as a dipping/coating technique or a spin-coating technique, or an ink-jet technique such that R, G, and B light emitting polymers are arranged at specified locations.

When a metal complex is used, a layer is deposited by vacuum-evaporating a material that can sublime.

Each organic EL layer may be formed so as to be of a single-layer type, a two-layer type, or a three-layer type, as described below. Herein, by way of example, each organic EL layer is assumed to be formed into a three-layer structure using low-molecular compounds.

Single-layer structure: anode/bipolar light emitting layer/cathode

Two-layer structure: anode/hole transport layer/electron transport-light emitting layer/cathode or anode/hole transport-light emitting layer/electron transport layer/cathode Three-layer structure: anode/hole transport layer/light emitting layer/electron transport layer/cathode or anode/hole transport-light emitting layer/carrier block layer/electron transport-light emitting layer/cathode In the structure shown in FIG. 19B, if the organic light emitting layer is replaced with a light emitting polymer known in the art, a passive-matrix type or active-matrix type light emitting polymer display is obtained (this is also possible in the examples described later).

Second Example of the Structure of an Organic EL Device

FIGS. 21A and 21B show a second example of the structure of an organic EL device. In this second structure, as in the first structure, gate channel regions 117, source regions 120, and drain regions 121 of a switching MOSTFT-1 and a current driving MOSTFT-2 are formed on a substrate 111 such as a glass substrate, using a high-crystallinity large-grain polycrystalline silicon film formed according to the above-descried technique of the present invention. Furthermore, gate electrodes 115 are formed on the gate insulating films 118, and source electrodes 127 and drain electrodes 128 and 131 are formed on the source and drain regions. The drain of the MOSTFT-1 and the gate of the MOSTFT-2 are connected to each other via the drain electrode 128, and a capacitor C is formed between the drain of the MOSTFT-1 and the drain electrode 131 of the MOSTFT-2 via an insulating film 136. The source electrode 127 of the MOSTFT-2 extends so as to be connected with the anode 144 of the organic EL device. In order to improve the switching characteristic, an LDD portion may be formed in the switching MOSTFT-1.

Each MOSTFT is covered with an insulating film 130. A green light emitting organic layer 132 (or a blue light emitting organic layer 133 or a red light emitting organic layer not shown in the figure) of the organic EL device is formed on the insulating film 130 such that the anode is covered with the green light emitting organic layer 132. A cathode (first layer) 141 is formed such that the light emitting organic layer is covered with the anode. Furthermore, a common cathode (second layer) 142 is formed over the entire surface.

In this structure, the organic EL layer in the organic EL display portion is connected to the source of the current driving MOSTFT-2, and the organic EL layer is formed such that the anode 144 formed on the surface of the substrate 111 such as the glass substrate is covered with the organic EL layer. The cathode 141 is formed such that the organic EL layer is covered with the cathode 141, and an additional cathode 142 is formed over the entire surface. Thus, in this structure, light 136 is emitted from the lower side. In this structure, areas between organic EL layers and MOSTFTs are covered with the cathode. That is, for example, after forming a green light emitting organic EL layer by means of vacuum evaporation or the like, a green light emitting organic EL part is formed by means of a dry etching process in conjunction with a photolithographic process, and, successively, a green and red light emitting organic EL parts are formed in a similar manner. Finally, the cathode (electron injection layer) 141 is formed over the entire surface, using a magnesium-silver alloy or an aluminum-lithium alloy. Furthermore, an additional cathode layer (electron injection layer) 142 is formed such that the underlying structure is sealed by this cathode layer 142. This structure, in particular the cathode 142, prevents intrusion of moisture into regions between organic EL layers thereby preventing the organic EL layers from being degraded and preventing the electrodes from being oxidized, and thus ensuring a long life time, high quality, and high reliability (this is also true in the first structure shown in FIG. 19, in which the entire surface is covered with the anode). Furthermore, the cathode layers 141 and 142 enhance heat radiation. This suppresses a structural change (melting or recrystallization) of the organic EL films due to heat, and the life time, the quality, and the reliability are improved. Using this technique, high-precision high-quality full-color organic EL layers can be produced in a highly productive fashion at low cost.

By forming a black mask (chromium, chromium dioxide, or the like) 140 in a peripheral area of each pixel as shown in FIG. 21C, it is possible to prevent undesirable leakage of light (crosstalk), and high contrast can be obtained. The black mask 140 is covered with a silicon oxide film 143 (that may be formed using the same material at the same time as the gate insulating film 118).

Figure 22A:
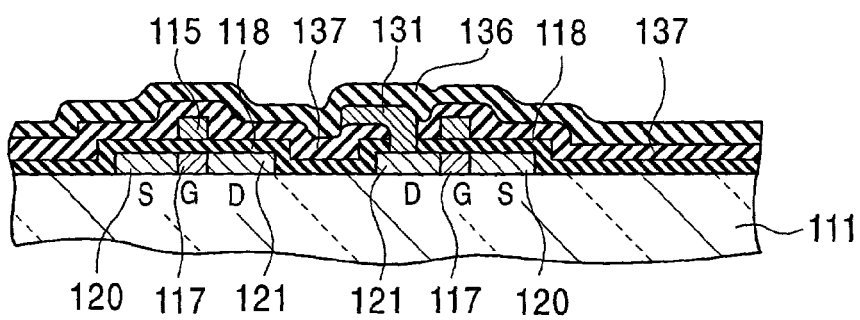
FIGS. 22A to 22D are diagrams illustrating an example of a sequence of processing steps of producing the organic EL display.

A sequence of processing steps of producing the organic EL device is described below. First, as shown in FIG. 22A, after forming source regions 120, channel regions 117, and drain regions 121 using a polycrystalline silicon film formed via the above-descried processing steps, a gate insulating film 118 is formed by means of vapor deposition such as catalytic CVD, and gate electrodes 115 of a MOSTFT-1 and a MOSTFT-2 are formed thereon by means of sputtering a Mo—Ta alloy or the like in conjunction with a photolithographic process and an etching process well known in the art. In this process, a gate line connected to the gate electrode of the MOSTFT-1 is also formed at the same time. Thereafter, an overcoat film (such as a silicon oxide film) 137 is formed by means of a vapor deposition technique such as catalytic CVD, and the drain 131 of the MOSTFT-2 and a $V_{dd}$ line are formed by sputtering a Mo—Ta alloy or the like in conjunction with a photolithographic process and an etching process well known in the art. Furthermore, an overcoat film (silicon oxide/silicon nitride) 136 is formed by means of vapor deposition such as catalytic CVD. The impurity doped by means of ion implantation is activated by performing an RTA (Rapid Thermal Anneal) process using a halogen lamp or the like (for example, at about 1000° C. for 10 to 30 sec).

Figure 22B:
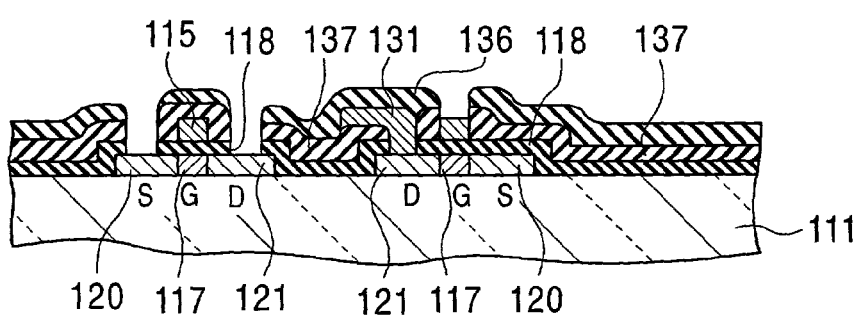
Figure 22C:
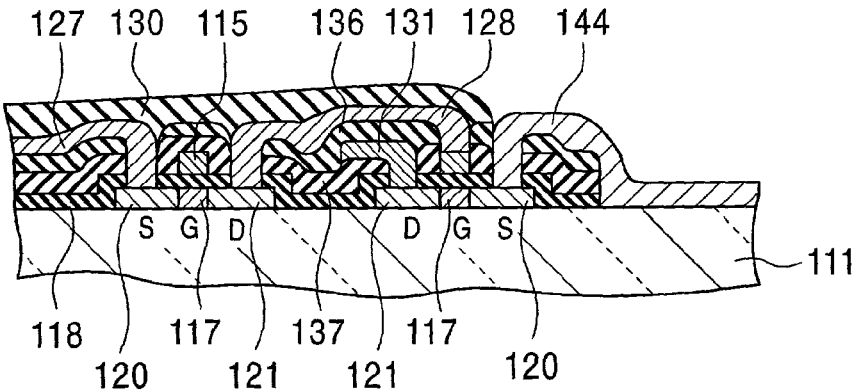

Thereafter, as shown in FIG. 22B, windows are formed at locations corresponding to the source/drain regions of the MOSTFT-1 and the gate region of the MOSTFT-2 by means of a dry etching process in conjunction with a photolithographic process well known in the art. Thereafter, as shown in FIG. 22C, a film of aluminum containing 1% silicon is deposited by means of sputtering and patterning using a photolithographic process and an etching process well known in the art such that the drain electrode of the MOSTFT-1 and the gate electrode of the MOSTFT-2 are connected to each other via the interconnection 128 formed of aluminum containing 1% silicon and such that, at the same time, a source line connected to the source electrode of the MOSTFT-1 is formed of aluminum containing 1% silicon. An overcoat film (silicon oxide/phosphosilicate glass/silicon nitride) 130 is then formed, and a window is formed at a location corresponding to the source of the MOSTFT-2 by means of an etching process in conjunction with a photolithographic process well known in the art. Thereafter, the anode 144 of the light emitting part is formed by means of sputtering of ITO or the like in conjunction with a photolithographic process and an etching process well known in the art such that the anode 144 is connected to the source of the MOSTFT-2.

Figure 22D:
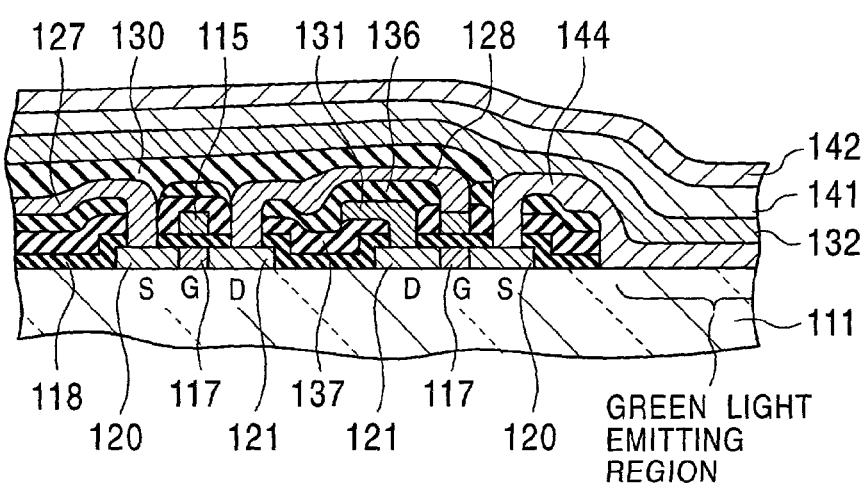

Thereafter, as shown in FIG. 22D, the light emitting organic layer 132 and cathodes 141 and 142 are formed.

Materials for the respective organic EL layers and methods of forming them are described below. These materials and methods can be applied not only to the structure shown in FIG. 21 but also to the structure shown in FIG. 19.

The green light emitting organic EL layer is formed by successively vacuum-evaporating low-molecular compounds, listed below, on the transparent ITO electrode that is connected to the source of the current driving MOSTFT and that serves as the anode (hole injection layer) disposed on the glass substrate.

1) The hole transport layer is formed of an amine compound (such as a triallylamine derivative, arylamino oligomer, or aromatic tertiary amine).
2) The light emitting layer is formed of a green light emitting material such as tris(8-hydroxyquinoline)aluminum complex (Alq).
3) The electron transport layer is formed of 1,3,4-oxadiazole derivative (OXD), 1,2,4-triazole delivertive (TAZ), or a similar material.
4) Preferably, the electron injection layer serving as the cathode is formed of a material having a work function smaller than 4 eV. For example, the electron injection layer may be formed of a 10 to 30 nm thick film of an alloy of magnesium and silver with an atomic ratio of 10:1, or a 10 to 30 nm thick film of an alloy of aluminum and lithium (0.5 to 1%).

In this electron injection layer, 1 to 10 atom % of silver is incorporated into magnesium to increase adhesion with an organic interface, and 0.5 to 1% of lithium is incorporated into aluminum to enhance stability.

The green pixel may be formed as follows. First, the green pixel area is covered with a photoresist, and the cathode formed of the aluminum-lithium alloy, which serves as the electron injection layer, is removed by means of plasma etching using $CCl_4$ gas. Furthermore, the photoresist and the low-molecular compounds forming the electron transport layer, the light emitting layer, and the hole transport layer are removed by means of oxygen plasma etching. Thus, the green pixel is obtained. In this process, etching of the photoresist causes no problem, because there is aluminum-lithium alloy under the photoresist. In the above process, the electron transport layer, the light emitting layer, and the hole transport layer are formed using low-molecular compounds such that their size becomes greater than the transparent ITO electrode serving as the hole injection layer, and such that no short circuit is formed between them and the electron injection layer (magnesium-silver alloy) that will be formed later over the entire surface.

Thereafter, the blue light emitting organic EL layer is formed by successively vacuum-evaporating low-molecular compounds, listed below, on the transparent ITO electrode that is connected to the source of the current driving MOSTFT and that serves as the anode (hole injection layer) disposed on the glass substrate.

1) The hole transport layer is formed of an amine compound (such as a triallylamine derivative, arylamino oligomer, or aromatic tertiary amine).
2) The light emitting layer is formed of a blue light emitting material such as a distyryl derivative (for example, DTVBi).
3) The electron transport layer is formed of 1,3,4-oxadiazole derivative (TAZ), 1,2,4-triazole delivertive (TAZ), or a similar material.
4) Preferably, the electron injection layer serving as the cathode is formed of a material having a work function smaller than 4 eV. For example, the electron injection layer may be formed of a 10 to 30 nm thick film of an alloy of magnesium and silver with an atomic ratio of 10:1, or a 10 to 30 nm thick film of an alloy of aluminum and lithium (0.5 to 1%).

In this electron injection layer, 1 to 10 atom % of silver is incorporated into magnesium to increase adhesion with an organic interface, and 0.5 to 1% of lithium is incorporated into aluminum to enhance stability.

The blue pixel may be formed as follows. First, the blue pixel area is covered with a photoresist, and the cathode formed of the aluminum-lithium alloy, which serves as the electron injection layer, is removed by means of plasma etching using $CCl_4$ gas. Furthermore, the photoresist and the low-molecular compounds forming the electron transport layer, the light emitting layer, and the hole transport layer are removed by means of oxygen plasma etching. Thus, the blue pixel is obtained. In this process, etching of the photoresist causes no problem, because there is aluminum-lithium alloy under the photoresist. In the above process, the electron transport layer, the light emitting layer, and the hole transport layer are formed using low-molecular compounds such that their size becomes greater than the transparent ITO electrode serving as the hole injection layer, and such that no short circuit is formed between them and the electron injection layer (magnesium-silver alloy) that will be formed later over the entire surface.

The red light emitting organic EL layer is formed by successively vacuum-evaporating low-molecular compounds, listed below, on the transparent ITO electrode that is connected to the source of the current driving MOSTFT and that serves as the anode (hole injection layer) disposed on the glass substrate.

1) The hole transport layer is formed of an amine compound (such as a triallylamine derivative, arylamino oligomer, or aromatic tertiary amine).

2) The light emitting layer is formed of a red light emitting material such as $Eu(Eu(DBM)_3(Phen))$.

3) The electron transport layer is formed of 1,3,4-oxadiazole derivative (OXD), 1,2,4-triazole delivertive (TAZ), or a similar material.

4) Preferably, the electron injection layer serving as the cathode is formed of a material having a work function smaller than 4 eV. For example, the electron injection layer may be formed of a 10 to 30 nm thick film of an alloy of magnesium and silver with an atomic ratio of 10:1, or a 10 to 30 nm thick film of an alloy of aluminum and lithium (0.5 to 1%).

In this electron injection layer, 1 to 10 atom % of silver is incorporated into magnesium to increase adhesion with an organic interface, and 0.5 to 1% of lithium is incorporated into aluminum to enhance stability.

The red pixel may be formed as follows. First, the red pixel area is covered with a photoresist, and the cathode formed of the aluminum-lithium alloy, which serves as the electron injection layer, is removed by means of plasma etching using $CCl_4$ gas. Furthermore, the photoresist and the low-molecular compounds forming the electron transport layer, the light emitting layer, and the hole transport layer are removed by means of oxygen plasma etching. Thus, the red pixel is obtained. In this process, etching of the photoresist causes no problem, because there is aluminum-lithium alloy under the photoresist. In the above process, the electron transport layer, the light emitting layer, and the hole transport layer are formed using low-molecular compounds such that their size becomes greater than the transparent ITO electrode serving as the hole injection layer, and such that no short circuit is formed between them and the electron injection layer (magnesium-silver alloy) that will be formed later over the entire surface.

It is desirable that the electron injection layer serving as the cathode be formed of a material having a work function smaller than 4 eV. For example, the electron injection layer may be formed of a 10 to 30 nm thick film of an alloy of magnesium and silver with an atomic ratio of 10:1, or a 10 to 30 nm thick film of an alloy of aluminum and lithium (0.5 to 1%). In this electron injection layer, 1 to 10 atom % of silver is incorporated into magnesium to increase adhesion with an organic interface, and 0.5 to 1% of lithium is incorporated into aluminum to enhance stability. The films may also be formed by means of sputtering.

Fourth Embodiment

In this fourth embodiment, the present invention is applied to a field emission display. Examples of structures thereof and production sequences are described below. Although the MOSTFT is assumed to be of the top-gate type in the examples described below, the other types of MOSTFTs such as the bottom-gate type or the dual-gate type are also possible.

First FED Structure

FIGS. 23A to 23C illustrate a first example of an FED structure. In this structure, gate channel regions 117, source regions 120, and drain regions 121 of a switching MOSTFT-1 and a current driving MOSTFT-2 are formed on a substrate 111 such as a glass substrate, using a high-crystallinity large-grain polycrystalline silicon film formed according to the above-descried technique of the present invention. Furthermore, gate electrodes 115 are formed on the gate insulating films 118, and source electrodes 127 and drain electrodes 128 are formed on the source and drain regions. The drain of the MOSTFT-1 and the gate of the MOSTFT-2 are connected to each other via the drain electrode 128, and a capacitor C is formed between the drain of the MOSTFT-1 and the source electrode 127 of the MOSTFT-2 via an insulating film 136. The drain region 121 of the MOSTFT-2 is extended so as to be connected with the FEC (Field Emission Cathode) of the FED device such that the extended part acts as the emitter region 152. In order to improve the switching characteristic, an LDD portion may be formed in the switching MOSTFT.

Each MOSTFT is covered with an insulating film 130. On this insulating film 130, a shield metal film 151 is formed using the same material in the same processing step as a gate lead electrode 150 of the FEC such that the each MOSTFT is covered with the shield metal film 151. In the FEC, an n-type polycrystalline silicon film 153 serving as a field emission emitter is formed on the emitter region 152 formed of the polycrystalline silicon film. The insulating films 118, 137, 136, and 130 are patterned so as to form openings therein whereby the emitter region 152 is partitioned into m×n emitters. A gate lead electrode 150 is formed on the surface of the patterned insulating film 130.

A phosphor 156 covered with a back metal layer 155 serving as an anode is formed on a substrate 157 such as a glass substrate, and the substrate 157 is disposed such that the substrate 157 and the FEC face with each other. The gap between the substrate 157 and the FEC is maintained in a high vacuum state.

In this FEC structure, the n-type polycrystalline silicon film 153 formed on the polycrystalline silicon film 152 formed by the technique according to the present invention is exposed via the openings of the gate lead electrode 150 so that each exposed area acts as a surface-emitting type emitter for emitting electrons 154. Because the polycrystalline silicon film 152 underlying the emitter is composed of large-size grains (greater than a few hundred nm), when the n-type polycrystalline silicon film 153 is formed on this polycrystalline silicon film 152 by means of catalytic CVD or the like, the underlying polycrystalline silicon film 152 acts as a crystal growth seed, and thus the grains of the polycrystalline silicon film 153 grow to greater sizes. As a result, micro irregularities 158 that enhance emission of electrons are formed on the surface of the emitter.

The FEC having the thin-film surface-emitting emitter can be easily produced and has a stable emission characteristic and a long life time.

Because all active elements (including MOSTFTs and diodes in the peripheral driver circuit and the pixel array area) are covered with the shield metal film 151 (that may be preferably formed using the same material (Nb, Ti/Mo, etc.) in the same processing step as the gate lead electrode 150) maintained at the ground voltage, the advantages (1) and (2) described below are obtained, and thus it is possible to realize a field emission display (FED) device having high quality and high reliability.

(1) If a gas present in a hermetic case is positively ionized by electrons emitted from the emitter (field emission cathode) 153, and if the insulating film is charged by the ionized gas, the positive charge can cause an undesirable inversion layer to be formed in a MOSTFT located under the insulating film, and an excess current can flow through the current path created by the inversion layer, which can result in run-away of the emitter current. However, in the FED structure according to the present invention, because the insulating layer above the MOSTFTs is covered with the grounded shield metal film 151, no charging-up occurs and thus run-away of the emitter current does not occur.

(2) When electrons emitted from the emitter (field emission cathode) 153 collide with the phosphor 156, light is emitted from the phosphor 156. This light emitted from the phosphor 156 can create electrons and holes in the gate channel of a MOSTFT, which can result in a leakage current. However, in this FED structure according to the present invention, the shield metal film 151 formed on the MOSTFTs prevents the light from being incident on the MOSTFTs, and thus prevents the MOSTFTs from operating erroneously.

Figure 24A:
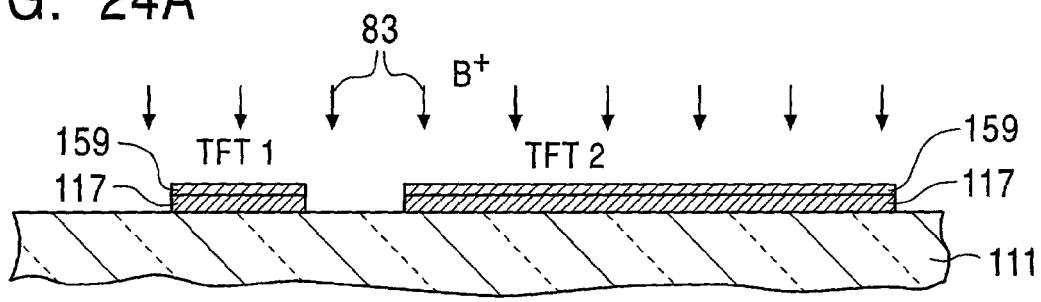
FIGS. 24A to 24H are diagrams illustrating an example of a sequence of processing steps of producing the FED.

A sequence of processing steps of producing the FED is described below. First, as shown in FIG. 24A, after forming a polycrystalline silicon film 117 over the entire surface via the processing steps described earlier, the polycrystalline silicon film 117 is patterned into islands where the MOSTFT-1, the MOSTFT-2, and the emitter are to be formed, by means of an etching process in conjunction with a photolithographic process well known in the art. A protective silicon oxide film 159 is then formed over the entire surface by means of plasma-enhance CVD, catalytic CVD, or the like.

Thereafter, in order to control the $V_{th}$ to an optimum value by adjusting the impurity concentrations of the gate channel of the MOSTFT-1 and the MOSTFT-2, boron ions 83 are doped over the entire surface to a dose of $5 \times 10^{11}$ atoms/cm$^2$ by means of ion implantation or ion doping such that the doped islands have an acceptor concentration of $1 \times 10^{17}$ atoms/cc.

Figure 24B:
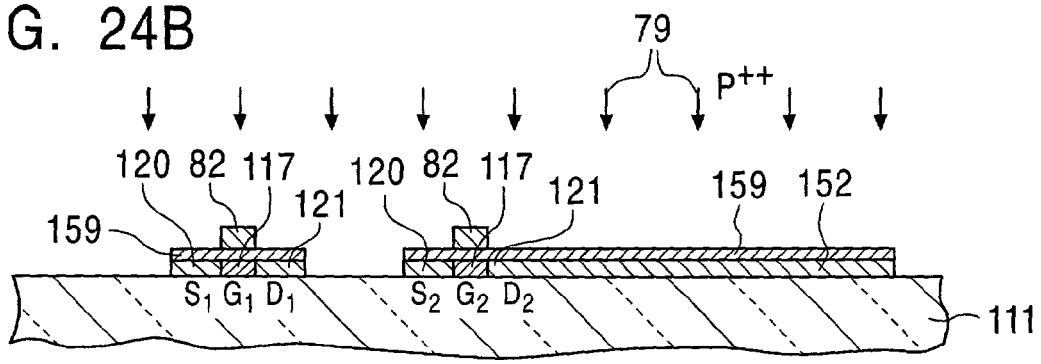

Thereafter, as shown in FIG. 24B, using a photoresist 82 as a doping mask, the source/drain regions of the MOSTFT-1 and the MOSTFT-2 and the emitter region are doped with phosphorus ions 79 to a dose of $1 \times 10^{15}$ atoms/cm$^2$ thereby forming the source regions 120, and the drain regions 121, and the emitter region 152, having a donor concentration of $2 \times 10^{20}$ atoms/cc. Thereafter, the protective silicon oxide film is removed from the emitter area by means of a photolithographic process and an etching process that are well known in the art. Herein, in order to improve the switching characteristic, an LDD region with a donor concentration of 1 to $5 \times 10^{18}$ atoms/cc may be formed in the MOSTFT-1.

Figure 24C:
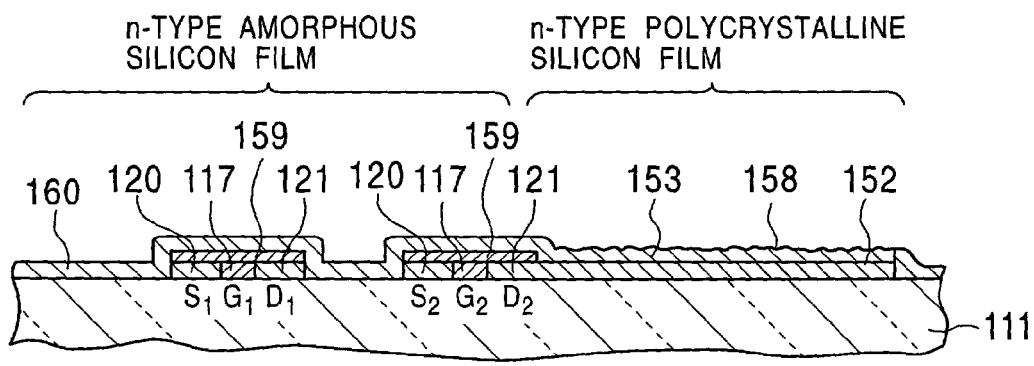

Thereafter, as shown in FIG. 24C, an n-type polycrystalline silicon film 153 having a thickness of 1 to 5 µm and having micro irregularities 158 on its surface is formed on the polycrystalline silicon film 152 in the emitter region, by means of catalytic CVD or biased catalytic CVD using monosilane and a dopant gas such as PH$_3$ mixed in a proper ratio (for example, the concentration of the dopant gas is set to $10^{20}$ atoms/cc), wherein the polycrystalline silicon film 152 serves as a growth seed during the deposition. During the above deposition process, an n-type amorphous silicon film 160 is formed to a thickness of 1 to 5 µm on the silicon oxide film 159 and the glass substrate 111 in the other areas.

Figure 24D:
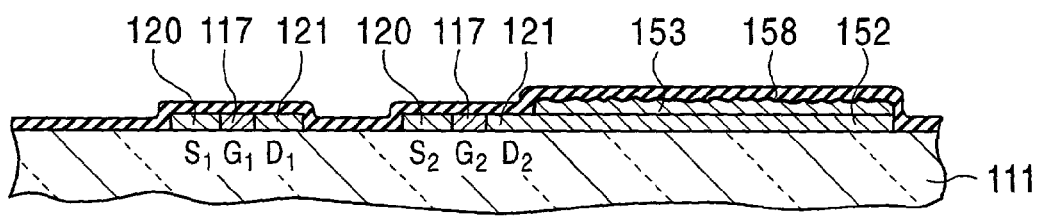

Thereafter, as shown in FIG. 24D, a catalytic AHA treatment is performed to remove the amorphous silicon film 160 by etching it with hydrogen-based active species (such as activated hydrogen ions). The silicon oxide film 159 is then removed by means of etching. Thereafter, a gate insulating film (silicon oxide film) 118 is formed by means of catalytic CVD or the like.

Figure 24E:
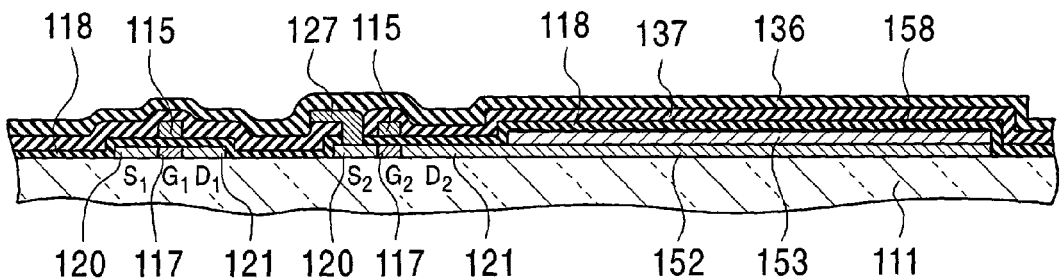

Thereafter, as shown in FIG. 24E, the gate electrodes 115 of the MOSTFT-1 and the MOSTFT-2 and the gate line connected to the gate electrode of the MOSTFT-1 are formed using a refractory metal such as a Mo—Ta alloy deposited by means of sputtering. Then, after forming an overcoat film (such as a silicon oxide film) 137, an RTA (Rapid Thermal Anneal) is performed using a halogen lamp or the like to activate the doped n-type and p-type impurities. A window is then formed at a location corresponding to the source of the MOSTFT-2, and the source electrode 127 of the MOSTFT-2 and a ground line are formed using a refractory metal such as a Mo—Ta alloy deposited by means of sputtering. Furthermore, an overcoat film (such as a multilayer film of silicon oxide/silicon nitride) 136 is formed by means of plasma-enhance CVD, catalytic CVD, or the like.

Figure 24F:
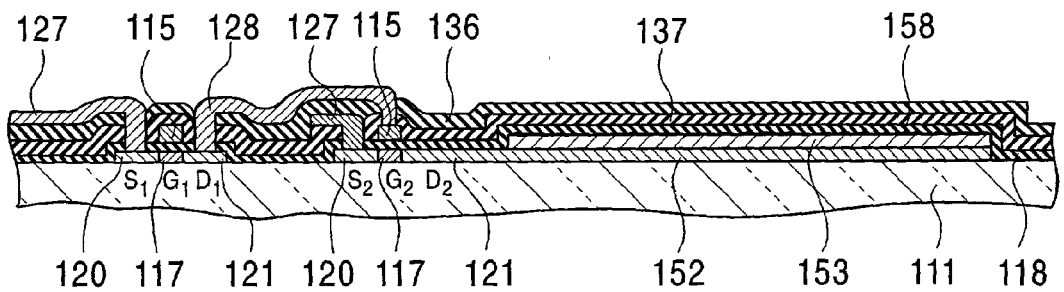

Thereafter, as shown in FIG. 24F, windows are formed at locations corresponding to the source/drain regions of the MOSTFT-1 and the gate region of the MOSTFT-2, and an interconnection 128 is formed of aluminum containing 1% silicon such that the drain of the MOSTFT-1 and the gate of the MOSTFT-2 are connected to each other via the interconnection 128. During this process, a source electrode of the MOSTFT-1 and a source line 127 connected thereto are also formed.

Thereafter, hydrogenation and sintering are performed at 400° C. in an ambient of a forming gas for 30 min.

Figure 24G:
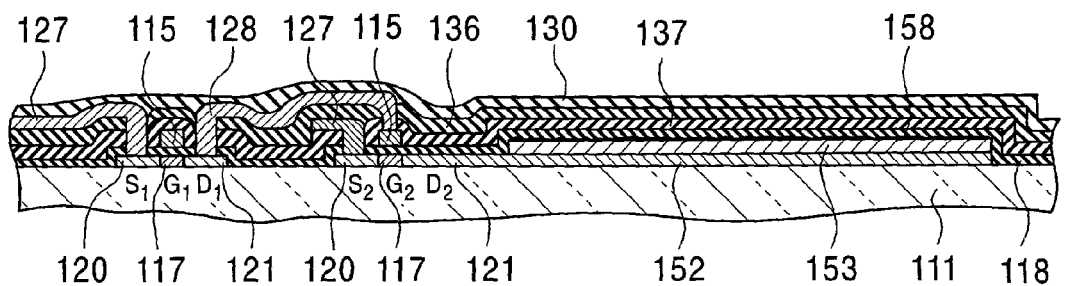
Figure 24H:
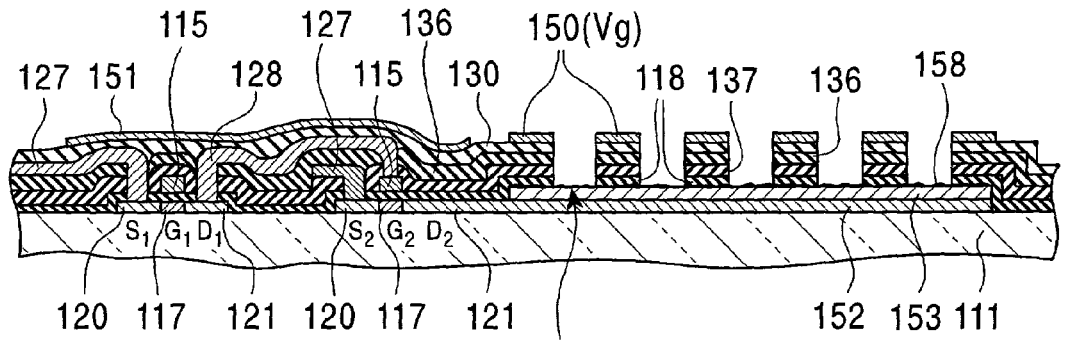

Thereafter, as shown in FIG. 24G, an overcoat film (silicon oxide/phosphosilicate glass/silicon nitride) 130 is formed, and windows of the GND line are formed. Thereafter, as shown in FIG. 24H, the gate lead electrode 150 and the shield metal film 151 are formed by evaporating a Nb film and then patterning it. Furthermore, windows are formed in the field emission cathode area such that the emitter 153 is exposed via the windows, and cleaning is performed using hydrogen-based active species (such as activated hydrogen ions) created during a plasma treatment or AHA treatment.

The conventional field emission display can be categorized into two types: simple-matrix FED, and active-matrix FED. As for the field emission electron source (field emitter), various types are available. They are a Spindt type molybdenum emitter, a cone type silicon emitter, an MIM tunnel emitter, a porous silicon emitter, a diamond emitter, and a surface conduction emitter. In any type, an emitter can be integrated on a flat substrate. In the simple matrix addressing technique, field emitters are arranged in the form of an XY matrix, and one pixel is formed by one field emitter. The emission intensity is controlled pixel by pixel so as to display an image. In the active matrix addressing technique, a current emitted from an emitter is controlled by controlling gate voltage of a MOSTFT whose drain is connected to an emitter. This structure can be produced using a process widely used in production of silicon LSIs, and thus it is possible to form a complicated circuit in a peripheral area of a field emission display. However, it is required to use a monocrystalline silicon substrate. The monocrystalline silicon substrate is expensive, and the wafer size is limited. It has been proposed to produce an emitter by first depositing a conductive polycrystalline silicon film on the surface of a cathode by means of reduced-pressure CVD or the like and then depositing thereon a crystalline diamond film by means of plasma-enhanced CVD or the like. However, the deposition temperature in the reduced-pressure CVD process is as high as 630° C. This makes it impossible to use a glass substrate, and thus the cost is high. Besides, the grain size of the polycrystalline silicon film produced by this reduced-pressure CVD technique is not large enough, and thus the crystalline diamond film formed thereon has a small grain size, which results in a poor emitter characteristic. Furthermore, the plasma-enhance CVD cannot provide reaction energy high enough to produce a high-quality crystalline diamond film. Another problem is that a good electric contact is not obtained between the transparent electrode or the cathode made of a metal such as Al, Ti, or Cr and the conductive polycrystalline silicon film. The result of this is a poor electron emission characteristic.

In contrast, the large-grain polycrystalline silicon film produced according to the present invention is excellent as described earlier. That is, the large-grain polycrystalline silicon film can be formed on a glass substrate. If a large-grain polycrystalline silicon film is formed in an emitter region connected to the drain of the current driving TFT, and if an additional n-type (or $n^+$-type) large-grain polycrystalline (or monocrystalline) silicon (or diamond) film is formed thereon by means of catalytic CVD or the like, then the underlying polycrystalline silicon film serves as a growth seed, and thus the grain size becomes further greater. Thereafter, if a catalytic AHA treatment is performed, the amorphous silicon film or the amorphous diamond (also called diamond like carbon) film is reduced and etched, and an emitter formed of a high-crystallinity large-grain silicon/diamond film having a large number of micro irregularities the surface is obtained. This emitter has a large electron emission efficiency, and a good contact characteristic can be obtained between the drain and the emitter. Thus, a high-efficiency emitter can be realized. The emitter according to the present invention can solve the problems in the conventional technique.

The emitter region of one pixel may be divided into two or more parts, and one switching MOSTFT may be connected to each part. In this structure, even if one MOSTFT fails, another MOSTFT can operate to emit electrons in the pixel. This makes it possible to produce a high-reliability high-quality emitter with a large production yield at a reduced cost (similar structure may also be employed in the examples described below for the same purpose). When some MOSTFT fails into an electrically open state, no significant problem occurs as discussed above. If some MOSTFT fails into a short-circuit state, it is required to isolate the failed MOSTFT by means of, for example, a laser repair technique. The structure according to the present invention allows such a repair. This also makes a great contribution to achievement of a high-reliability high-performance emitter at a reduced cost (this is true also in the examples described below).

Second FED Structure

FIGS. 25A to 25C illustrate a second example of the FED structure. In this structure, as in the first structure described above, gate channel regions 117, source regions 120, and drain regions 121 of a switching MOSTFT-1 and a current driving MOSTFT-2 are formed on a substrate 111 such as a glass substrate, using a high-crystallinity large-grain polycrystalline silicon film formed according to the above-descried technique of the present invention. Furthermore, gate electrodes 115 are formed on the gate insulating films 118, and source electrodes 127 and drain electrodes 128 are formed on the source and drain regions. The drain of the MOSTFT-1 and the gate of the MOSTFT-2 are connected to each other via the drain electrode 128, and a capacitor C is formed between the drain of the MOSTFT-1 and the source electrode 127 of the MOSTFT-2 via an insulating film 136. The drain region 121 of the MOSTFT-2 is extended so as to be connected with the FEC (Field Emission Cathode) of the FED device such that the extended part acts as the emitter region 152. In order to improve the switching characteristic, an LDD portion may be formed in the switching MOSTFT-1.

Each MOSTFT is covered with an insulating film 130. On this insulating film 130, a shield metal film 151 is formed using the same material in the same processing step as a gate lead electrode 150 of the FEC such that the each MOSTFT is covered with the shield metal film 151. In the FEC, an n-type polycrystalline diamond film 163 serving as a field emission emitter is formed on the emitter region 152 formed of the polycrystalline silicon film. The insulating films 118, 137, 136, and 130 are patterned so as to form openings therein whereby the emitter region 152 is partitioned into m×n emitters. A gate lead electrode 150 is formed on the surface of the patterned insulating film 130.

A phosphor 156 covered with a back metal layer 155 serving as an anode is formed on a substrate 157 such as a glass substrate, and the substrate 157 is disposed such that the substrate 157 and the FEC face with each other. The gap between the substrate 157 and the FEC is maintained in a high vacuum state.

In this FEC structure, the n-type polycrystalline diamond film 163 formed on the polycrystalline silicon film 152 formed by the technique according to the present invention is exposed via the openings of the gate lead electrode 150 so that each exposed area acts as a surface-emitting type emitter for emitting electrons 154. Because the polycrystalline silicon film 152 underlying the emitter is composed of large-size grains (greater than a few hundred nm), when the n-type polycrystalline diamond film 163 is formed on this polycrystalline silicon film 152 by means of catalytic CVD or the like, the underlying polycrystalline silicon film 152 acts as a crystal growth seed, and thus the grains of the polycrystalline diamond film 163 grow to great sizes. As a result, micro irregularities 168 that enhance emission of electrons are formed on the surface of the emitter.

The FEC having the thin-film surface-emitting emitter can be easily produced and has a stable emission characteristic and a long life time.

Because all active elements (including MOSTFTs and diodes in the peripheral driver circuit and the pixel array area) are covered with the shield metal film 151 (that may be preferably formed using the same material (Nb, Ti/Mo, etc.) in the same processing step as the gate lead electrode 150) maintained at the ground voltage, that is, the insulating layer above the MOSTFTs is covered with the grounded shield metal film 151, no charging up occurs and thus run-away of the emitter current does not occur. Furthermore, the shield metal film 151 formed on the MOSTFTs prevents light from being incident on the MOSTFTs, and thus prevents the MOSTFTs from operating erroneously. Thus, it is possible to realize a field emission display (FED) device having high quality and high reliability.

Figure 26A:
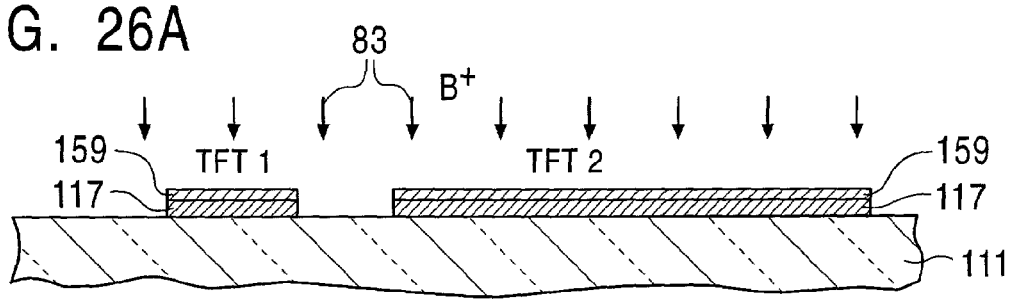
FIGS. 26A to 26H are diagrams illustrating an example of a sequence of processing steps of producing the FED.

A sequence of processing steps of producing the FED is described below. First, as shown in FIG. 26A, after forming a polycrystalline silicon film 117 over the entire surface via the processing steps described earlier, the polycrystalline silicon film 117 is patterned into islands where the MOSTFT-1, the MOSTFT-2, and the emitter are to be formed, by means of an etching process in conjunction with a photolithographic process well known in the art. A protective silicon oxide film 159 is then formed over the entire surface by means of plasma-enhance CVD, catalytic CVD, or the like.

Thereafter, in order to control the $V_{th}$ to an optimum value by adjusting the impurity concentrations of the gate channel of the MOSTFT-1 and the MOSTFT-2, boron ions 83 are doped over the entire surface to a dose of $5 \times 10^{11}$ atoms/cm² by means of ion implantation or ion doping such that the doped islands have an acceptor concentration of $1 \times 10^{17}$ atoms/cc.

Figure 26B:
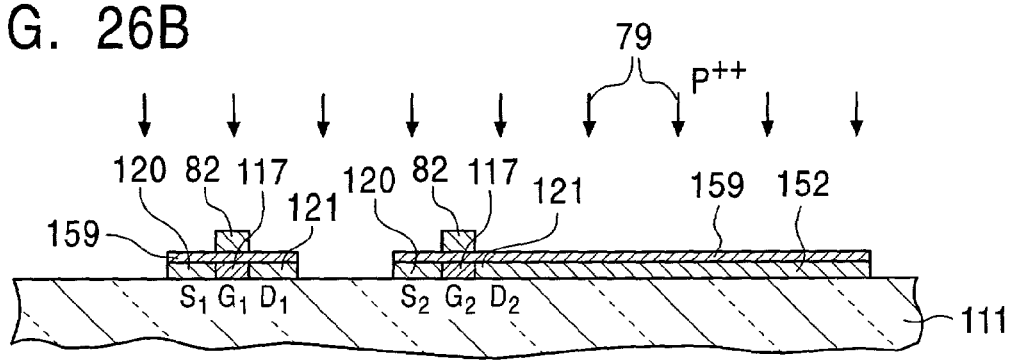

Thereafter, as shown in FIG. 26B, using a photoresist 82 as a doping mask, the source/drain regions of the MOSTFT-1 and the MOSTFT-2 and the emitter region are doped with phosphorus ions 79 to a dose of $1 \times 10^{15}$ atoms/cm² thereby forming the source regions 120, and the drain regions 121, and the emitter region 152, having a donor concentration of $2 \times 10^{20}$ atoms/cc. Thereafter, the protective silicon oxide film is removed from the emitter area by means of a photolithographic process and an etching process that are well known in the art.

Figure 26C:
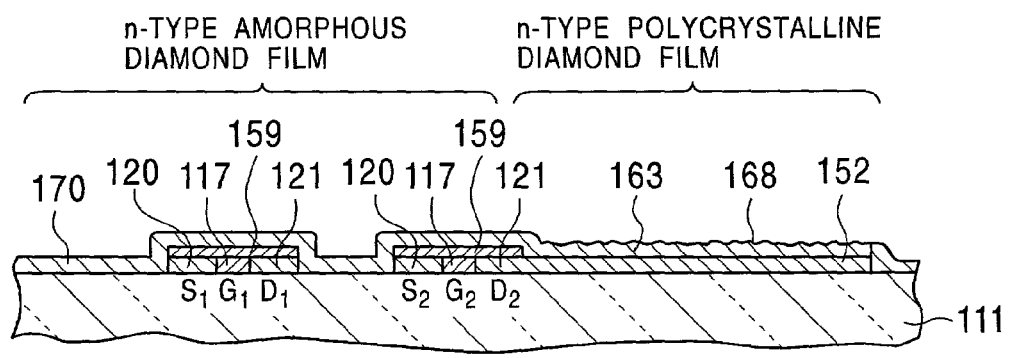

Thereafter, as shown in FIG. 26C, an n-type polycrystalline diamond film 163 having micro irregularities 168 on its surface is formed on the polycrystalline silicon film 152 in the emitter region, by means of catalytic CVD or biased catalytic CVD using monosilane, methane ($CH_4$) and an n-type dopant mixed in a proper ratio, wherein the polycrystalline silicon film 152 serves as a growth seed during the deposition. During the above deposition process, an n⁺-type amorphous diamond film 170 is formed to a thickness of 1 to 5 μm on the silicon oxide film 159 and the glass substrate 111 in the other areas. More specifically, when the n⁺-type crystalline diamond film is formed by means of catalytic CVD or the like on the large-grain polycrystalline silicon film 152 serving as a seed in the emitter region 163, an n-type impurity gas (for example, phosphine $PH_3$ for providing phosphors, arsine $ASH_3$ for providing arsenic, or stibine $SbH_3$ for providing antimony) is mixed in methane $CH_4$ so that an n⁺-type polycrystalline diamond film 163 having an impurity concentration $5 \times 10^{20}$ to $1 \times 10^{21}$ atoms/cc (with a thickness of 1000 to 5000 nm) is obtained. During the above process, an n⁺-type diamond film 170 in an amorphous form is formed on the protective silicon oxide film. This amorphous diamond film is also called a DLC (diamond like carbon) film.

Figure 26D:
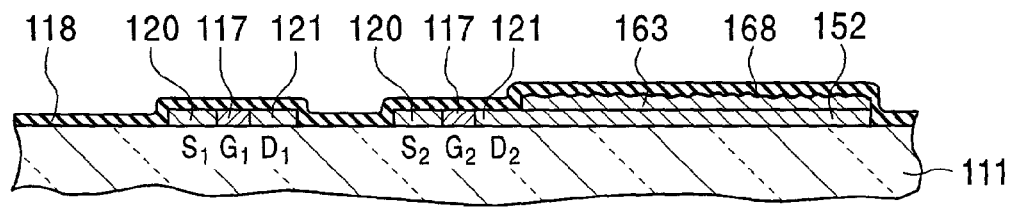

Thereafter, as shown in FIG. 26D, a catalytic AHA treatment is performed to remove the amorphous diamond film 170 by etching it with hydrogen-based active species (such as activated hydrogen ions). The silicon oxide film 159 is then removed by means of etching. Thereafter, a gate insulating film (silicon oxide film) 118 is formed by means of catalytic CVD or the like. In the above catalytic AHA treatment, the amorphous diamond film is reduced and etched by hydrogen molecules/hydrogen atoms/activated hydrogen ions at a high temperature, and, at the same time, the amorphous component of the n⁺-type polycrystalline diamond film 163 formed in the emitter region is reduced and etched, and a high-crystallinity n⁺-type polycrystalline diamond film 163 is formed. Via the reduction and etching process, a large number of micro irregularities are created on the surface of the n⁺-type polycrystalline diamond film 163 on the emitter region 163. During the above process, the n⁺-type amorphous diamond film present on the protective silicon oxide film is reduced and etched, and thus removed. It is desirable to continuously perform the catalytic CVD process and the AHA process to prevent contamination and achieve high productivity.

Figure 26E:
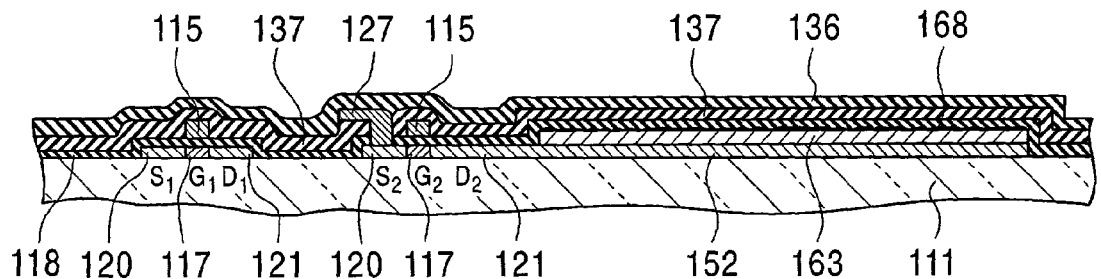

Thereafter, as shown in FIG. 26E, the gate electrodes 115 of the MOSTFT-1 and the MOSTFT-2 and the gate line connected to the gate electrode of the MOSTFT-1 are formed using a refractory metal such as a Mo—Ta alloy deposited by means of sputtering. Then, after forming an overcoat film (such as a silicon oxide film) 137, an RTA (Rapid Thermal Anneal) is performed using a halogen lamp or the like to activate the doped n-type and p-type impurities. A window is then formed at a location corresponding to the source of the MOSTFT-2, and the source electrode 127 of the MOSTFT-2 and a ground line are formed using a refractory metal such as a Mo—Ta alloy deposited by means of sputtering. Furthermore, an overcoat film (such as a multilayer film of silicon oxide/silicon nitride) 136 is formed by means of plasma-enhance CVD, catalytic CVD, or the like.

Figure 26F:
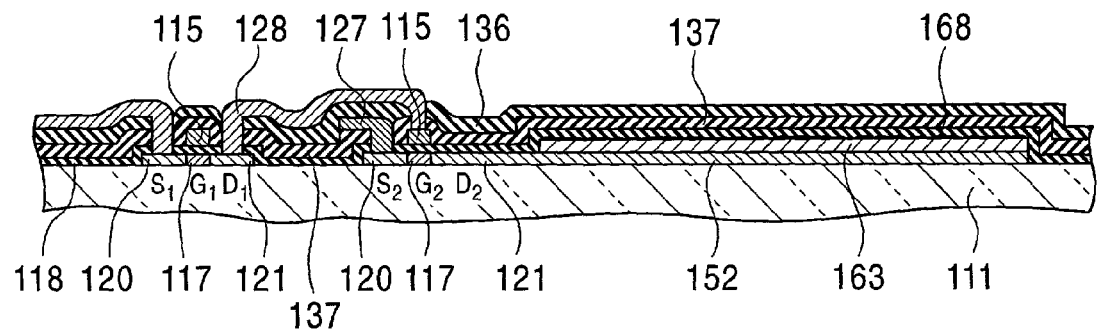

Thereafter, as shown in FIG. 26F, windows are formed at locations corresponding to the source/drain regions of the MOSTFT-1 and the gate region of the MOSTFT-2, and an interconnection 128 is formed of aluminum containing 1% silicon such that the drain of the MOSTFT-1 and the gate of the MOSTFT-2 are connected to each other via the interconnection 128. During this process, a source electrode of the MOSTFT-1 and a source line 127 connected thereto are also formed.

Figure 26G:
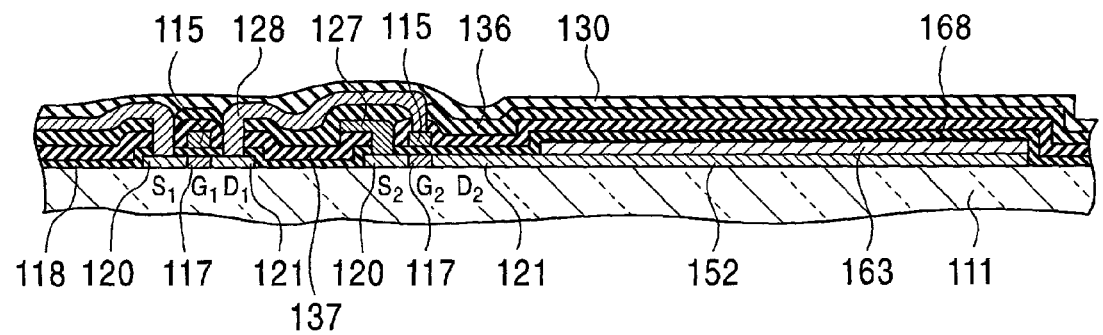
Figure 26H:
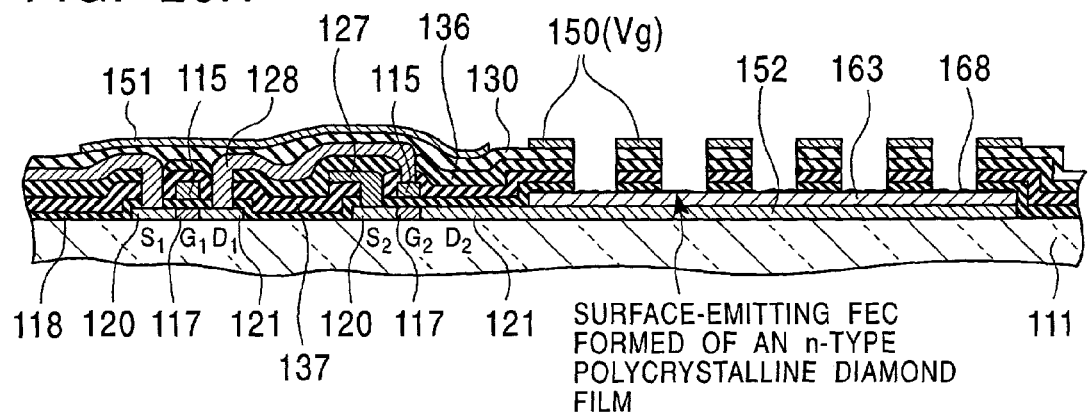

Thereafter, as shown in FIG. 26G, an overcoat film (silicon oxide/phosphosilicate glass/silicon nitride) 130 is formed, and a GND line window is formed. Thereafter, hydrogenation and sintering are performed at 400° C. in an ambient of a forming gas for 30 min. Thereafter, as shown in FIG. 26H, a gate lead electrode 150 and a shield metal film 151 are formed by evaporating a Nb film and then patterning it. Furthermore, windows are formed in the field emission cathode area such that the emitter 163 is exposed via the windows, and cleaning is performed using activated hydrogen ions created during a plasma treatment or AHA treatment. More specifically, the titanium/molybdenum film or the niobium film is wet-etched using an acid etchant in conjunction with a photolithographic process well know in the art. The silicon oxide film and PSG film are wet-etched using a hydrofluoric acid-based etchant. The silicon nitride film is removed by means of plasma etching using $CF_4$ or the like. The polycrystalline diamond film 163 of the field emission cathode (emitter) is subjected to a catalytic AHA treatment thereby cleaning it. In this process, organic contamination, water, oxygen/nitrogen/carbon dioxide adhering to micro irregularities on the surface of the film are removed by hydrogen molecules/hydrogen atoms/activated hydrogen ions at a high temperature, thereby improve the electron emission efficiency.

Examples of compounds containing carbon that can be used as a source gas to deposit the polycrystalline diamond film 163 are listed below.

1) paraffinic hydrocarbons such as methane, ethane, propane, and buthane 2) alkyne such as ethyne and allylene 3) olefin hydrocarbons such as ethylene, propylene, and butylene 4) dioefin hydrocarbons such as butadiene 5) alicyclic hydrocarbons such as cyclopropane, cyclobutane, cyclopentane, and cyclohexane 6) aromatic hydrocarbons such as cyclobutdiene, benzene, toluene, xylene, and naphtahlin 7) ketones such as acetone, diethyl ketone, and benzophenone 8) alcohols such as methanol and ethanol 9) amines such as trimethylamine and triethylamine 10) substances composed of only carbon atoms such as graphite, coal and coke Of the above, any one may be used singly, or a combination of two or more may be employed.

Examples of inert gases usable herein are argon, helium, neon, krypton, xenon, and radon. Examples of dopants are boron, lithium, nitrogen, phosphorus, sulfur, chlorine, arsine, selenium, beryllium, and compounds of any combination of these. The doping concentration may be, for example, $10^{20}$ atoms/cc.

Fifth Embodiment

In this fifth embodiment, the present invention is applied to a solar cell that is one of optical-to-electric conversion devices. An example of a sequence of processing steps of producing a solar cell is described below.

Figure 27A:
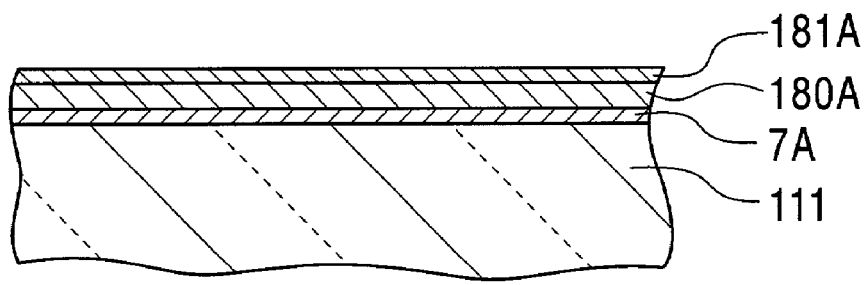
FIGS. 27A to 27C are diagrams illustrating an example of a sequence of processing steps of producing a solar cell according to a fifth embodiment of the present invention.

First, as shown in FIG. 27A, an n-type low-crystal-quality silicon film 7A with a thickness of 100 to 200 nm is formed on a metal substrate 111 such as stainless steel by means of plasma-enhanced CVD, catalytic CVD, or the like. In this process, an n-type is doped to a concentration of $1 \times 10^{19}$ to $1 \times 10^{20}$ atoms/cc by mixing a dopant gas such as $PH_3$ in monosilane in a proper ratio.

Thereafter, an i-type low-crystal-quality silicon film 180A with a thickness of 2 to 5 µm is formed on the n-type low-crystal-quality silicon film 7A by means of plasma-enhanced CVD, catalytic CVD, or the like. Furthermore, a p-type low-crystal-quality silicon film 181A with a thickness of 100 to 200 nm is formed thereon by means of plasma-enhanced CVD, catalytic CVD, or the like. In this process, a p-type impurity is doped to a concentration of $1 \times 10^{19}$ to $1 \times 10^{20}$ atoms/cc by mixing a p-type dopant gas such as $B_2H_6$ in monosilane in a proper ratio.

Figure 27B:
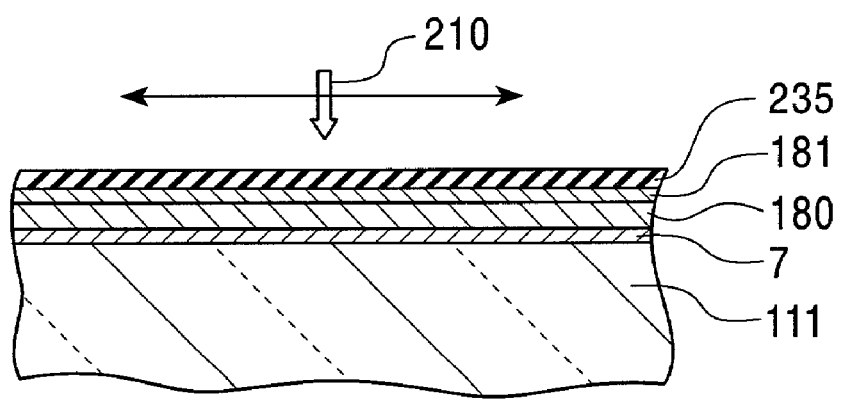

Thereafter, as shown in FIG. 27B, an overcoat insulating film 235 (such as a silicon oxide film, silicon nitride film, a silicon oxide nitride film, a multilayer film of silicon oxide/silicon nitride) with a thickness of 50 to 100 nm is formed by means of plasma-enhanced CVD, catalytic CVD, or the like.

Focused-light annealing is performed by illuminating the obtained low-crystal-quality silicon films 7A, 180A, and 181A with a focused light ray 210 emitted from a lamp thereby converting the films into polycrystalline films 7, 180, and 181, respectively. During this annealing process, the impurities doped in the respective films are activated.

Figure 27C:
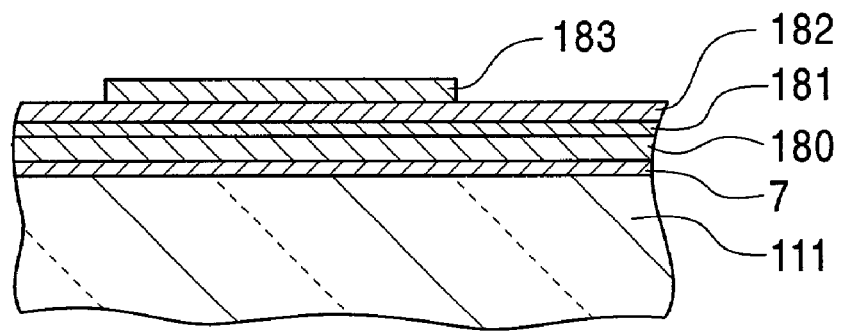

Then, as shown in FIG. 27C, the overcoat insulating film 235 is removed, and hydrogenation is performed in an ambient of a forming gas at 400° C. for 1 hour. Furthermore, a transparent electrode (ITO (Indium Tin Oxide) film, IZO (Indium Zinc Oxide) film, etc.) 182 is formed to a thickness of 100 to 150 nm over the entire surface. Thereafter, a comb-shaped electrode 183 with a thickness of 100 to 150 is formed in a predetermined area on the transparent electrode 182 by depositing silver or the like via a metal mask.

The solar cell according to the present embodiment has an optical-to-electric conversion thin-film formed of a large-grain polycrystalline silicon film having a large mobility and a high conversion efficiency according to the present invention. Furthermore, the solar cell structure has a good surface texture and a good back surface texture, and thus the optical-to-electric conversion thin-film has a high light confinement efficiency and a high conversion efficiency. This technique according to the present invention can be applied not only to the solar cell but other types of thin-film optical-to-electric conversion devices such as a photosensitive drum for used in electrophotography.

Although the present invention has been described with reference to specific embodiments, the invention is not limited to those embodiments. Various modifications are possible without departing from the spirit and scope of the present invention.

For example, the vapor deposition method is not limited to analytic CVD or plasma-enhanced CVD. Various parameters such as the number of times the focused-light annealing is performed, the illumination time, and the substrate temperature are not limited to specific values employed in the embodiments. Furthermore, the substrate materials and other materials are not limited to those used in the embodiments.

The present invention can be advantageously used in particular to form MOSTFTs in an internal circuit of a display, a peripheral driver circuit, a video signal processing circuit, or a memory. In addition to such a MOSTFT, it is also possible to form other active elements such as a diode and various kinds of passive elements such as a resistor, a capacitor, an interconnection, and an inductor using a polycrystalline or monocrystalline semiconductor film according to the present invention.

As can be understood from the above description, the present invention provides great advantages (1) to (10) described below, which result from the feature of the invention that a monocrystalline or polycrystalline thin semiconductor is produced from a low-crystal-quality thin semiconductor film formed on a substrate by performing a focused-light annealing process on the low-crystal-quality thin semiconductor film thereby melting or semi-melting the low-crystal-quality thin semiconductor film or heating the low-crystal-quality thin semiconductor film while maintaining it in a non-melted state and then cooling the low-crystal-quality thin semiconductor film thereby enhancing crystallization of the low-crystal-quality thin semiconductor film.

(1) In the focused-light annealing, light emitted from a lamp such as an ultra-high-pressure mercury lamp is focused into a desired form, and the low-crystal-quality thin semiconductor film such as an amorphous silicon film is illuminated with the focused light so as to heat the low-crystal-quality thin semiconductor film into a melted or semi-melted state or heat it while maintaining it in a non-melted state and then cool it thereby crystallizing it. That is, in this process, high illumination energy applied to the low-crystal-quality thin semiconductor film causes the low-crystal-quality thin semiconductor film to be heated into a melted or semi-melted state or heated while maintaining non-melted state, and then the low-crystal-quality thin semiconductor film is cooled thereby obtaining a monocrystalline semiconductor film or a large-grain polycrystalline semiconductor film such as a monocrystalline or polycrystalline silicon film, having a high carrier mobility and high quality. This technique allows a great improvement in productivity and a great reduction in cost.

(2) In the focused-light annealing according to the present invention, because the zone melting recrystallization is performed while continuously moving the melted zone, a catalytic element such as Ni preincorporated to enhance the crystallization and other impurities are segregated into the melted zone and thus such a catalytic element or impurities can be easily removed. Thus, no impurities remain in the resultant annealed film. This makes it possible to easily obtain a polycrystalline thin semiconductor film having large grains, a high carrier mobility, and high quality. In particular, if multiple zone melting recrystallization is performed by sequentially performing melting and cooling repeatedly using a plurality of focused light rays emitted from a plurality of lamps, it is possible to obtain a polycrystalline thin semiconductor film having further greater grains and higher quality. The high purity obtained by this technique makes it possible to produce a device with high stability and high reliability without degrading characteristics of the semiconductor. Furthermore, in the focused-light annealing technique, the zone melting recrystallization or multiple zone melting recrystallization is performed via a simple process thereby allowing efficient removal of a catalytic element that has finished its role in enhancing crystallization and also allowing efficient removal of other impurities. This simplicity of the process allows a reduction in cost.

(3) The crystal grains in the polycrystalline silicon film are aligned in a direction in which the focused light is scanned. Therefore, if TFTs are formed in this direction, mismatching and stress at crystal grain boundaries are minimized, and thus the resultant polycrystalline thin silicon film has a high mobility.

(4) If another low-crystal-quality silicon film is formed on a polycrystalline silicon film crystallized by means of zone melting recrystallization or multiple zone melting recrystallization using the focused-light annealing technique, and if crystallization is performed again using the focused-light annealing process, a polycrystalline silicon film having large grains, a high carrier mobility, and high crystal quality can be formed to a greater thickness. By performing this process repeatedly, a multilayer film with a large total thickness such as on the order of a few microns can be obtained. This makes it possible to produce not only a MOSLSI but also other types of devices such as a bipolar LSI, a CMOS sensor, a CCD area/linear sensors, and a solar cell, having high performance and high quality.

(5) Regardless of whether a UV lamp or an infrared lamp is used, light emitted from the lamp can be easily focused into the form of a line, a rectangle, or a square, and the focused light can be continuously applied. Furthermore, the beam size and the scanning pitch can be arbitrarily set. The high light intensity leads to increases in melting efficiency and throughput, and thus a reduction in cost can be achieved.

(6) The lamp used in the focused-light annealing apparatus can be easily controlled in terms of the wavelength, the light intensity, and the illumination time. Furthermore, the heating/melting rate and the cooling rate can be controlled by controlling the speed at which a substrate or the lamp is moved. By controlling those parameters, it is possible to form a polycrystalline silicon film having a desired grain size and desired purity.

(7) The lamp used in the focused-light annealing apparatus is much more inexpensive than an excimer laser generator used in an excimer laser annealing apparatus, and thus a great cost reduction can be achieved.

(8) In the focused-light annealing process, in particular in the annealing process using an ultra-high-pressure mercury lamp, light with the same wavelength as that of a XeCl excimer laser (with a wavelength of 308 nm) can be continuously applied with a small variation in illumination energy across the entire film surface, and thus a resultant crystallized semiconductor film has uniform characteristics and produced TFTs have small variations in characteristics from device to device. Thus, high throughput and high productivity are achieved, which result in a reduction in cost.

(9) The focused-light annealing process can be used at a low substrate temperature (200 to 400° C.). This makes it possible to employ glass having a low strain point or a heat-resistant resin as a substrate material, which allows production of a large-sized substrate at low cost. Thus, reductions in weight and cost can be achieved.

(10) Not only a top-gate type but also other types of TFTs such as a bottom-gate type and dual-gate type MOSTFTs can be produced using a monocrystalline or polycrystalline semiconductor film with a high carrier mobility formed by the focused-light annealing technique. Thus, it becomes possible to produce a high-speed high-current semiconductor device, an electro-optical device, and a high-efficiency solar cell, using the high-performance semiconductor film. Specific examples of devices that can be produced by this technique include a silicon semiconductor device, a silicon semiconductor integrated circuit, a silicon-germanium semiconductor device, a silicon-germanium semiconductor integrated circuit, a silicon carbide semiconductor device, a silicon carbide semiconductor integrated device, a compound semiconductor (such as GaAs) device, a compound semiconductor (such as GaAs) integrated circuit, a polycrystalline diamond semiconductor device, a polycrystalline diamond semiconductor integrated circuit, a liquid crystal display, an (inorganic/organic) electroluminescence display, a field emission display (FED), a light emitting polymer display, a light emitting diode display, a photosensor, a CCD area/liner sensor, a CMOS sensor, and a solar cell.

What is claimed is:

1. A thin semiconductor film formation method for forming a polycrystalline or monocrystalline thin semiconductor film on a substrate, the method comprising:
   a first step of forming a low-crystal-quality thin semiconductor film on the substrate;
   a second step of performing lamp annealing on the low-crystal-quality thin semiconductor film so as to melt the low-crystal-quality thin semiconductor film or heat the low-crystal-quality thin semiconductor film while maintaining the low-crystal-quality thin semiconductor film in a non-melted state and then cool the low-crystal-quality thin semiconductor film thereby enhancing crystallization of the low-crystal-quality thin semiconductor film; and
   a third step of forming a stepped recess with a predetermined shape and size in a particular area of the substrate where a device is to be formed,
   wherein the first step includes forming a low-crystal-quality thin semiconductor film, which may or may not include one or more kinds of catalytic elements, on the substrate having the stepped recess, and the second step includes performing a focused-light annealing process such that graphoepitaxy growth occurs from lower edges of the stepped recess acting as growth seeds thereby converting the low-crystal-quality thin semiconductor film into the monocrystalline thin semiconductor film.

2. A thin semiconductor film formation method for forming a polycrystalline or monocrystalline thin semiconductor film on a substrate, the method comprising:

a first step of forming a low-crystal-quality thin semiconductor film on the substrate;

a second step of performing lamp annealing on the low-crystal-quality thin semiconductor film so as to melt the low-crystal-quality thin semiconductor film or heat the low-crystal-quality thin semiconductor film while maintaining the low-crystal-quality thin semiconductor film in a non-melted state and then cool the low-crystal-quality thin semiconductor film thereby enhancing crystallization of the low-crystal-quality thin semiconductor film; and a third step of forming a layer of a material such as sapphire well lattice-matched with the monocrystalline semiconductor in an area of the substrate where a device is to be formed, wherein the first step includes forming a low-crystal-quality thin semiconductor film, which may or may not include one or more kinds of catalytic elements, on the crystal layer, and the second step includes performing a focused-light annealing process such that heteroepitaxy growth occurs on the layer acting as a growth seed thereby converting the low-crystal-quality thin semiconductor film into the monocrystalline thin semiconductor film.

3. A thin semiconductor film formation method for forming a polycrystalline or monocrystalline thin semiconductor film on a substrate, the method comprising:

a first step of forming a low-crystal-quality thin semiconductor film on the substrate; and a second step of performing lamp annealing on the low-crystal-quality thin semiconductor film so as to melt the low-crystal-quality thin semiconductor film or heat the low-crystal-quality thin semiconductor film while maintaining the low-crystal-quality thin semiconductor film in a non-melted state and then cool the low-crystal-quality thin semiconductor film thereby enhancing crystallization of the low-crystal-quality thin semiconductor film;

wherein the thin film for use in a silicon semiconductor device, a silicon semiconductor integrated circuit, a silicon-germanium semiconductor device, a silicon-germanium semiconductor integrated circuit, a compound semiconductor device, a compound semiconductor integrated circuit, a silicon carbide semiconductor device, a silicon carbide semiconductor integrated device, a polycrystalline diamond semiconductor device, a polycrystalline diamond semiconductor integrated circuit, a liquid crystal display, an organic or inorganic electroluminescence (EL) display, a field emission display (FED), a light emitting polymer display, a light emitting diode display, a CCD area/liner sensor, a CMOS sensor, or a solar cell is produced;

wherein when a device such as a semiconductor device, an electro-optical display, or a solid-state imaging device, which includes an internal circuit and a peripheral circuit, is produced, a channel region, a source region, and a drain region of a thin-film insulated-gate field effect transistor of at least one of the internal circuit and the peripheral circuit are formed using the polycrystalline or monocrystalline thin semiconductor film; and wherein a cathode or an anode is disposed in a layer under an organic or inorganic electroluminescence layer of each color, wherein the cathode or the anode is connected to the drain or the source of the thin-film insulated-gate field effect transistor.

4. A method according to claim 3, wherein active elements including the thin-film insulated-gate field effect transistor and a diode are covered with the cathode, or the surfaces of the organic or inorganic electroluminescence layers of respective colors and all areas between the organic or inorganic electroluminescence layers are covered with the cathode or the anode.

5. A method according to claim 3, wherein a black mask layer is formed in areas between the organic or inorganic electroluminescence layers of respective colors.

6. A thin semiconductor film formation method for forming a polycrystalline or monocrystalline thin semiconductor film on a substrate, the method comprising:

a first step of forming a low-crystal-quality thin semiconductor film on the substrate; and a second step of performing lamp annealing on the low-crystal-quality thin semiconductor film so as to melt the low-crystal-quality thin semiconductor film or heat the low-crystal-quality thin semiconductor film while maintaining the low-crystal-quality thin semiconductor film in a non-melted state and then cool the low-crystal-quality thin semiconductor film thereby enhancing crystallization of the low-crystal-quality thin semiconductor film;

wherein the thin film for use in a silicon semiconductor device, a silicon semiconductor integrated circuit, a silicon-germanium semiconductor device, a silicon-germanium semiconductor integrated circuit, a compound semiconductor device, a compound semiconductor integrated circuit, a silicon carbide semiconductor device, a silicon carbide semiconductor integrated device, a polycrystalline diamond semiconductor device, a polycrystalline diamond semiconductor integrated circuit, a liquid crystal display, an organic or inorganic electroluminescence (EL) display, a field emission display (FED), a light emitting polymer display, a light emitting diode display, a CCD area/liner sensor, a CMOS sensor, or a solar cell is produced;

wherein when a device such as a semiconductor device, an electro-optical display, or a solid-state imaging device, which includes an internal circuit and a peripheral circuit, is produced, a channel region, a source region, and a drain region of a thin-film insulated-gate field effect transistor of at least one of the internal circuit and the peripheral circuit are formed using the polycrystalline or monocrystalline thin semiconductor film; and wherein an emitter of a field emission display device is connected to a drain of the thin-film insulated-gate field effect transistor via the polycrystalline or monocrystalline thin semiconductor film, and wherein the emitter of the field emission display device is formed of an n-type polycrystalline semiconductor film or an n-type polycrystalline diamond film formed on the polycrystalline or monocrystalline thin semiconductor film.

7. A method according to claim 6, wherein a shield metal film for providing a ground potential is formed, via an insulating film, on active elements including the thin-film insulated-gate field effect transistor and diode.

8. A method of producing a semiconductor device including a polycrystalline or monocrystalline thin semiconductor film disposed on a substrate, the method comprising:

a first step of forming a low-crystal-quality thin semiconductor film on the substrate;

a second step of performing lamp annealing on the low-crystal-quality thin semiconductor film so as to melt the low-crystal-quality thin semiconductor film or heat the low-crystal-quality thin semiconductor film while maintaining the low-crystal-quality thin semiconductor film in a non-melted state and then cool the low-crystal-quality thin semiconductor film thereby enhancing crystallization of the low-crystal-quality thin semiconductor film; and a third step of forming a stepped recess with a predetermined shape and size in a particular area of the substrate where a device is to be formed, wherein the first step includes forming a low-crystal-quality thin semiconductor film, which may or may not include one or more kinds of catalytic elements, on the substrate having the stepped recess, and the second step includes performing a focused-light annealing process such that graphoepitaxy growth occurs from lower edges of the stepped recess acting as growth seeds thereby converting the low-crystal-quality thin semiconductor film into the monocrystalline thin semiconductor film.

9. A method of producing a semiconductor device including a polycrystalline or monocrystalline thin semiconductor film disposed on a substrate, the method comprising:

a first step of forming a low-crystal-quality thin semiconductor film on the substrate;

a second step of performing lamp annealing on the low-crystal-quality thin semiconductor film so as to melt the low-crystal-quality thin semiconductor film or heat the low-crystal-quality thin semiconductor film while maintaining the low-crystal-quality thin semiconductor film in a non-melted state and then cool the low-crystal-quality thin semiconductor film thereby enhancing crystallization of the low-crystal-quality thin semiconductor film; and a third step of forming a layer of a material such as sapphire well lattice-matched with the monocrystalline semiconductor in an area of the substrate where a device is to be formed, wherein the first step includes forming a low-crystal-quality thin semiconductor film, which may or may not include one or more kinds of catalytic elements, on the crystal layer, and the second step includes performing a focused-light annealing process such that heteroepitaxy growth occurs on the layer acting as a growth seed thereby converting the low-crystal-quality thin semiconductor film into the monocrystalline thin semiconductor film.

10. A method of producing a semiconductor device including a polycrystalline or monocrystalline thin semiconductor film disposed on a substrate, the method comprising:

a first step of forming a low-crystal-quality thin semiconductor film on the substrate; and a second step of performing lamp annealing on the low-crystal-quality thin semiconductor film so as to melt the low-crystal-quality thin semiconductor film or heat the low-crystal-quality thin semiconductor film while maintaining the low-crystal-quality thin semiconductor film in a non-melted state and then cool the low-crystal-quality thin semiconductor film thereby enhancing crystallization of the low-crystal-quality thin semiconductor film;

wherein the thin film for use in a silicon semiconductor device, a silicon semiconductor integrated circuit, a silicon-germanium semiconductor device, a silicon-germanium semiconductor integrated circuit, a compound semiconductor device, a compound semiconductor integrated circuit, a silicon carbide semiconductor device, a silicon carbide semiconductor integrated device, a polycrystalline diamond semiconductor device, a polycrystalline diamond semiconductor integrated circuit, a liquid crystal display, an organic or inorganic electroluminescence (EL) display, a field emission display (FED), a light emitting polymer display, a light emitting diode display, a CCD area/liner sensor, a CMOS sensor, or a solar cell is produced;

wherein when a device such as a semiconductor device, an electro-optical display, or a solid-state imaging device, which includes an internal circuit and a peripheral circuit, is produced, a channel region, a source region, and a drain region of a thin-film insulated-gate field effect transistor of at least one of the internal circuit and the peripheral circuit are formed using the polycrystalline or monocrystalline thin semiconductor film; and wherein a cathode or an anode is disposed in a layer under an organic or inorganic electroluminescence layer of each color, wherein the cathode or the anode is connected to the drain or the source of the thin-film insulated-gate field effect transistor.

11. A method according to claim 10, wherein active elements including the thin-film insulated-gate field effect transistor and a diode are covered with the cathode, or the surfaces of the organic or inorganic electroluminescence layers of respective colors and all areas between the organic or inorganic electroluminescence layers are covered with the cathode or the anode.

12. A method according to claim 10, wherein a black mask layer is formed in areas between the organic or inorganic electroluminescence layers of respective colors.

13. A method of producing a semiconductor device including a polycrystalline or monocrystalline thin semiconductor film disposed on a substrate, the method comprising:

a first step of forming a low-crystal-quality thin semiconductor film on the substrate; and a second step of performing lamp annealing on the low-crystal-quality thin semiconductor film so as to melt the low-crystal-quality thin semiconductor film or heat the low-crystal-quality thin semiconductor film while maintaining the low-crystal-quality thin semiconductor film in a non-melted state and then cool the low-crystal-quality thin semiconductor film thereby enhancing crystallization of the low-crystal-quality thin semiconductor film;

wherein the thin film for use in a silicon semiconductor device, a silicon semiconductor integrated circuit, a silicon-germanium semiconductor device, a silicon-germanium semiconductor integrated circuit, a compound semiconductor device, a compound semiconductor integrated circuit, a silicon carbide semiconductor device, a silicon carbide semiconductor integrated device, a polycrystalline diamond semiconductor device, a polycrystalline diamond semiconductor integrated circuit, a liquid crystal display, an organic or inorganic electroluminescence (EL) display, a field emission display (FED), a light emitting polymer display, a light emitting diode display, a CCD area/liner sensor, a CMOS sensor, or a solar cell is produced;

wherein when a device such as a semiconductor device, an electro-optical display, or a solid-state imaging device, which includes an internal circuit and a peripheral circuit, is produced, a channel region, a source region, and a drain region of a thin-film insulated-gate field effect transistor of at least one of the internal circuit and the peripheral circuit are formed using the polycrystalline or monocrystalline thin semiconductor film; and wherein an emitter of a field emission display device is connected to a drain of the thin-film insulated-gate field effect transistor via the polycrystalline or monocrystalline thin semiconductor film, and wherein the emitter of the field emission display device is formed of an n-type polycrystalline semiconductor film or an n-type polycrystalline diamond film formed on the polycrystalline or monocrystalline thin semiconductor film.

14. A method according to claim 13, wherein a shield metal film for providing a ground potential is formed, via an insulating film, on active elements including the thin-film insulated-gate field effect transistor and diode.

* * * * *